US011101288B2

(12) United States Patent
Zhang et al.

(10) Patent No.: US 11,101,288 B2
(45) Date of Patent: Aug. 24, 2021

(54) THREE-DIMENSIONAL MEMORY DEVICE CONTAINING PLURAL WORK FUNCTION WORD LINES AND METHODS OF FORMING THE SAME

(71) Applicant: SANDISK TECHNOLOGIES LLC, Addison, TX (US)

(72) Inventors: Yanli Zhang, San Jose, CA (US); Dong-il Moon, Milpitas, CA (US); Raghuveer S. Makala, Campbell, CA (US); Peng Zhang, Fremont, CA (US); Wei Zhao, San Jose, CA (US); Ashish Baraskar, Santa Clara, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/710,572

(22) Filed: Dec. 11, 2019

(65) Prior Publication Data

US 2021/0183883 A1 Jun. 17, 2021

(51) Int. Cl.
*H01L 27/11582* (2017.01)
*H01L 21/28* (2006.01)
(Continued)

(52) U.S. Cl.
CPC .. *H01L 27/11582* (2013.01); *H01L 21/76802* (2013.01); *H01L 21/76843* (2013.01);
(Continued)

(58) Field of Classification Search
CPC ............... H01L 27/11582; H01L 27/11556
See application file for complete search history.

(56) References Cited

U.S. PATENT DOCUMENTS 5,915,167 A 6/1999 Leedy
9,230,974 B1 1/2016 Pachamuthu et al.
(Continued)

FOREIGN PATENT DOCUMENTS

KR 10-2015-0129364 A 11/2015

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Farun Lu
(74) *Attorney, Agent, or Firm* — The Marbury Law Group PLLC

(57) ABSTRACT

A three-dimensional memory device includes an alternating stack of insulating layers and electrically conductive layers located over a substrate, memory openings vertically extending through the alternating stack, and memory stack structures extending through the alternating stack. Each of the memory stack structures contains a memory film and a vertical semiconductor channel. At least one of the electrically conductive layers contains a first conductive material portion having a respective inner sidewall that contacts a respective one of the memory films at a vertical interface, and a second conductive material portion that has a different composition from the first conductive material portion, and contacting the first electrically conductive material portion. The first conductive material portion has a lower work function than the second conductive material portion.

19 Claims, 51 Drawing Sheets

(51) Int. Cl.

| | | |
|---|---|---|
| *H01L 23/528* | (2006.01) | |
| *H01L 23/532* | (2006.01) | |
| *H01L 23/522* | (2006.01) | |
| *H01L 21/768* | (2006.01) | |
| *H01L 27/11526* | (2017.01) | |
| *H01L 27/11519* | (2017.01) | |
| *H01L 27/11565* | (2017.01) | |
| *H01L 27/11573* | (2017.01) | |
| *H01L 27/11556* | (2017.01) | |

(52) U.S. Cl.
CPC ...... *H01L 21/76877* (2013.01); *H01L 23/528* (2013.01); *H01L 23/5226* (2013.01); *H01L 23/53266* (2013.01); *H01L 23/53271* (2013.01); *H01L 27/11519* (2013.01); *H01L 27/11526* (2013.01); *H01L 27/11556* (2013.01); *H01L 27/11565* (2013.01); *H01L 27/11573* (2013.01); *H01L 29/40114* (2019.08); *H01L 29/40117* (2019.08)

(56) References Cited

U.S. PATENT DOCUMENTS

| | | | |
|---|---|---|---|
| 9,496,419 | B2 | 11/2016 | Sharangpani et al. |
| 9,570,455 | B2 | 2/2017 | Sharangpani et al. |
| 9,576,966 | B1 | 2/2017 | Peri et al. |
| 9,646,975 | B2 | 5/2017 | Peri et al. |
| 9,698,223 | B2 | 7/2017 | Sharangpani et al. |
| 9,768,270 | B2 | 9/2017 | Gunji-Yoneoka et al. |
| 9,842,907 | B2 | 12/2017 | Makala et al. |
| 9,972,641 | B1 | 5/2018 | Zhang et al. |
| 9,984,963 | B2 | 5/2018 | Peri et al. |
| 10,083,982 | B2 | 9/2018 | Shigemura et al. |
| 10,128,261 | B2 | 11/2018 | Makala et al. |
| 10,283,513 | B1 | 5/2019 | Zhou et al. |
| 2015/0079746 | A1 | 3/2015 | Kim |
| 2015/0380419 | A1 | 12/2015 | Gunji-Yoneoka et al. |
| 2016/0149002 | A1 | 5/2016 | Sharangpani et al. |
| 2016/0218059 | A1 | 7/2016 | Nakada et al. |
| 2016/0329343 | A1 | 11/2016 | Pachamuthu et al. |
| 2016/0351497 | A1 | 12/2016 | Peri et al. |
| 2017/0352669 | A1* | 12/2017 | Sharangpani ..... H01L 29/66833 |
| 2018/0019134 | A1* | 1/2018 | Choi ..................... H01L 27/115 |
| 2018/0138194 | A1 | 5/2018 | Shigemura et al. |
| 2018/0166460 | A1 | 6/2018 | Manabe |
| 2018/0374863 | A1 | 12/2018 | Purayath |
| 2019/0139973 | A1 | 5/2019 | Zhou et al. |

OTHER PUBLICATIONS

U.S. Appl. No. 16/362,857, filed Mar. 25, 2019, SanDisk Technologies LLC.
U.S. Appl. No. 16/362,895, filed Mar. 25, 2019, SanDisk Technologies LLC.
U.S. Appl. No. 16/568,668, filed Sep. 12, 2019, SanDisk Technologies LLC.
U.S. Appl. No. 16/710,481, filed Dec. 11, 2019, SanDisk Technologies LLC.
Notification of Transmittal of the International Search Report and Written Opinion of the International Search Authority for International Patent Application No. PCT/US2020/026160, dated Sep. 11, 2020, 10 pages.
USPTO Office Communication, Notice of Allowance and Fee(s) Due for U.S. Appl. No. 16/710,481, dated Mar. 12, 2021, 20 pages.

* cited by examiner

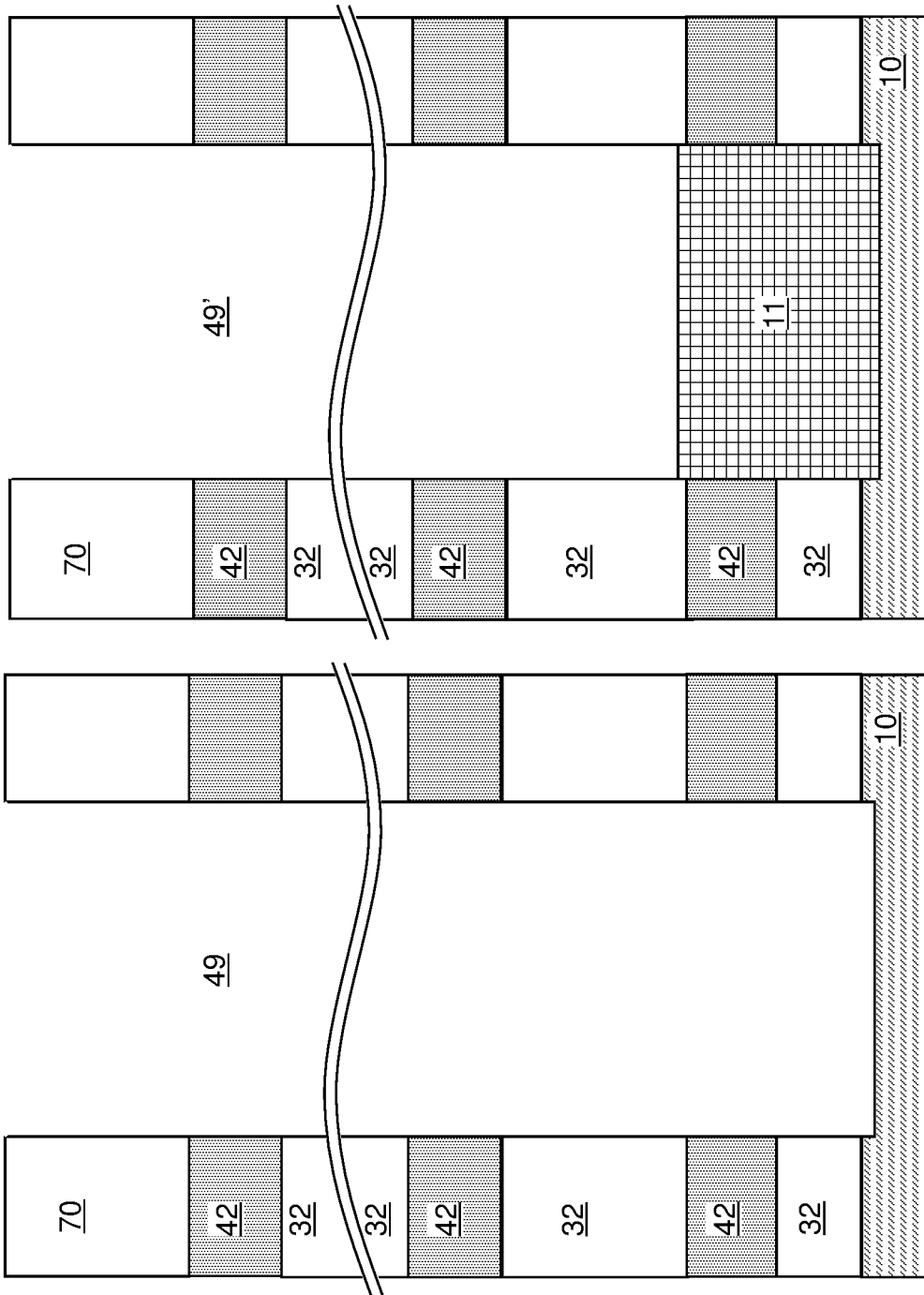

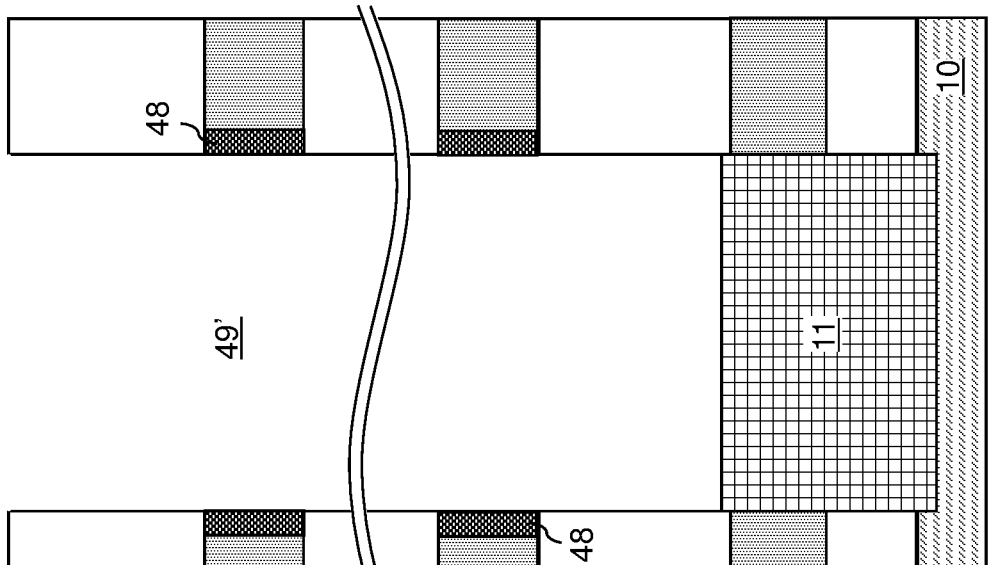
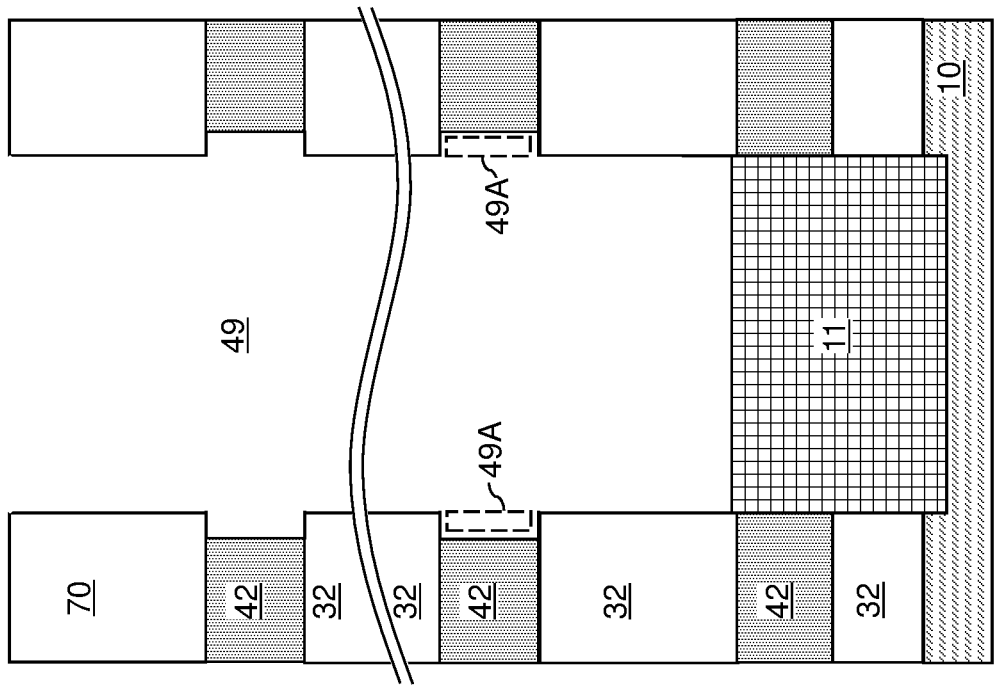
FIG. 5C
FIG. 5D

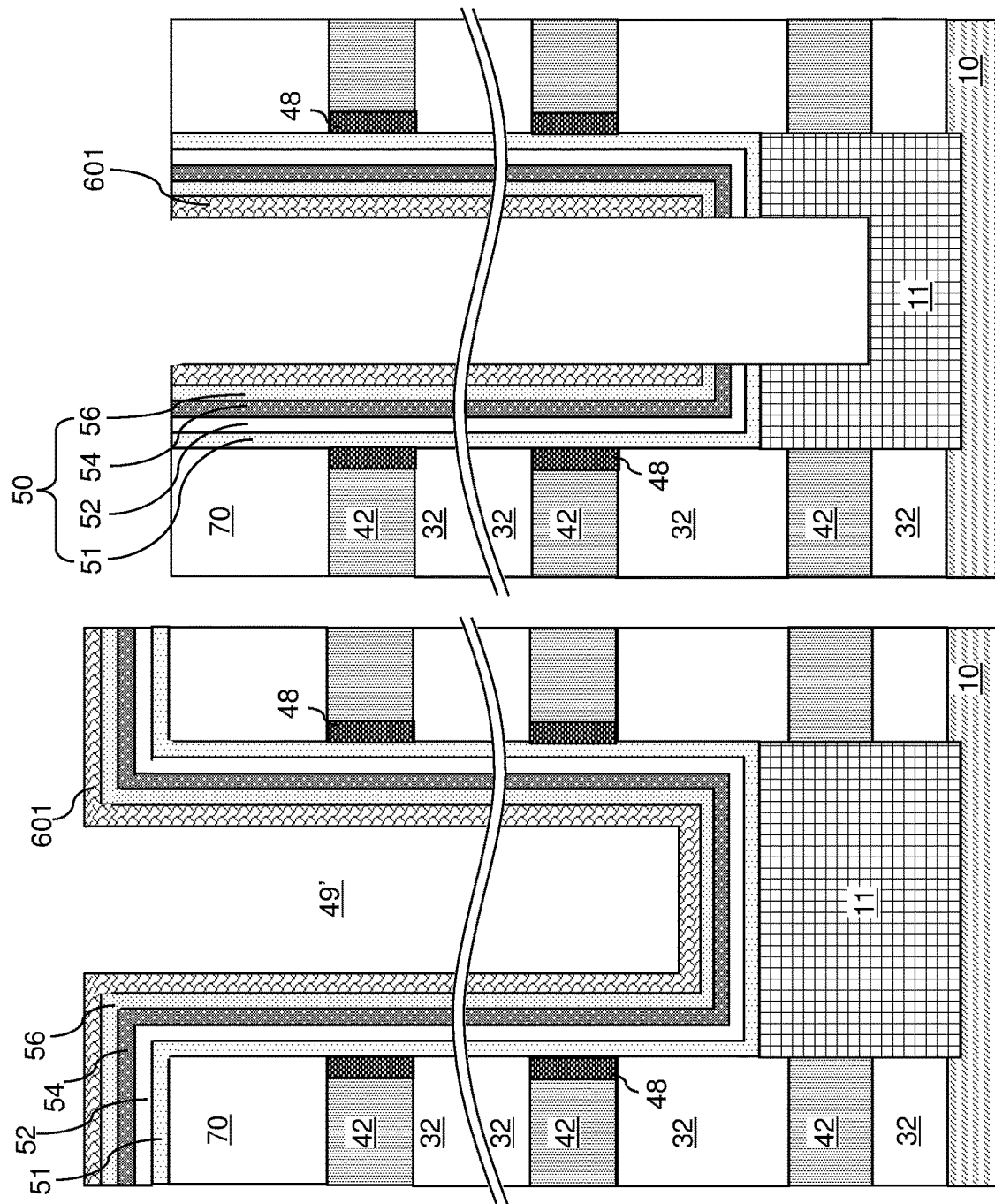

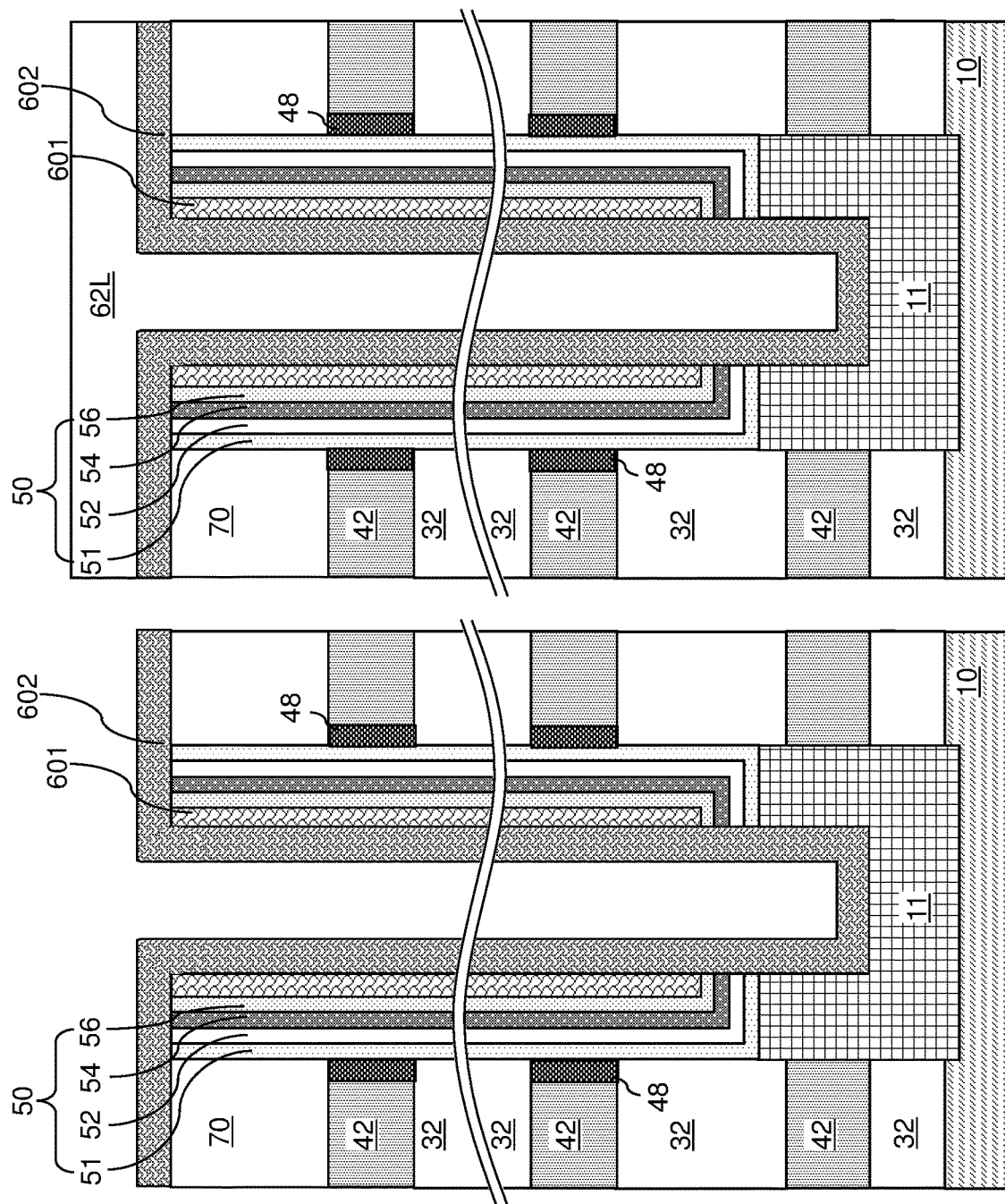

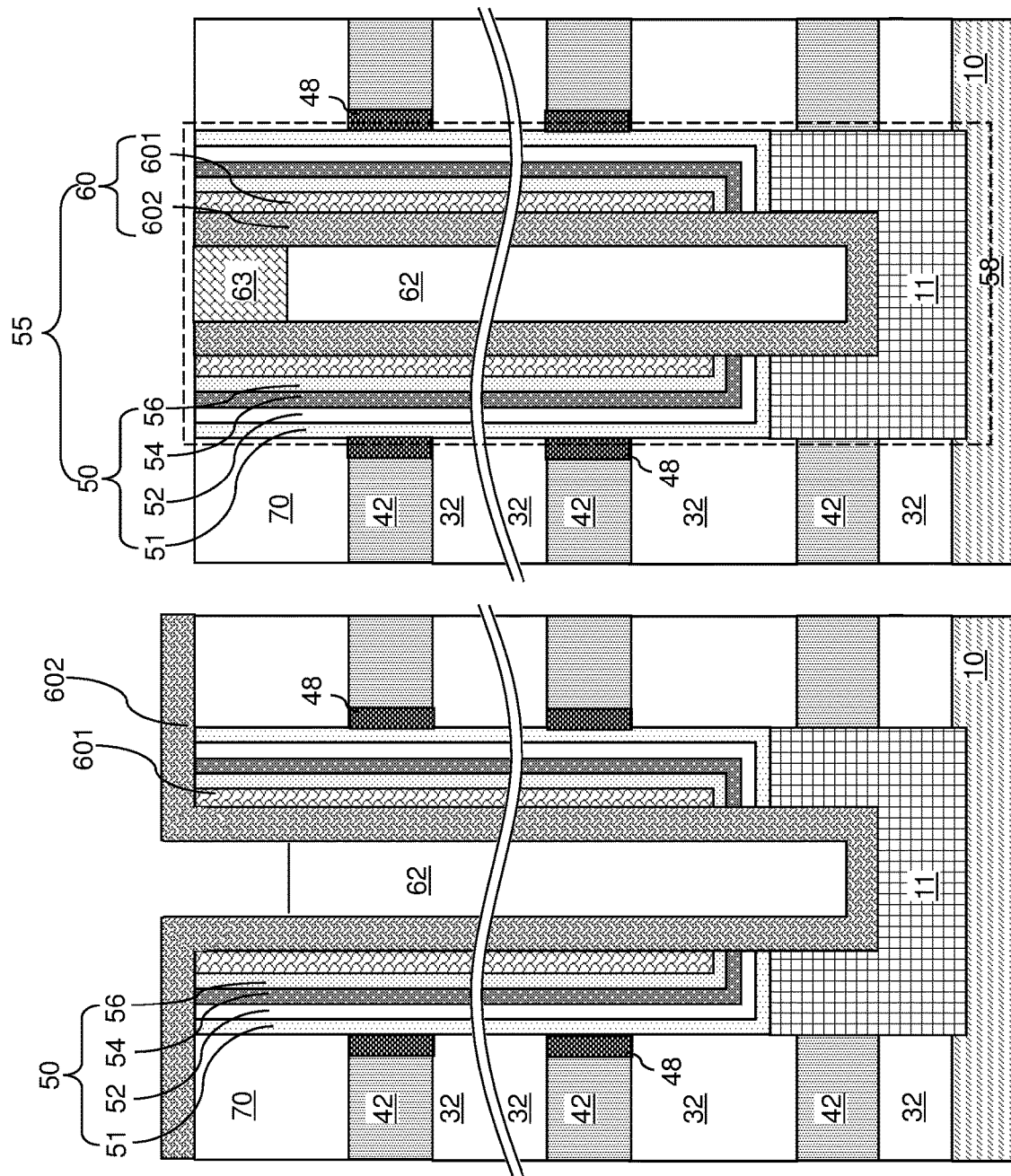

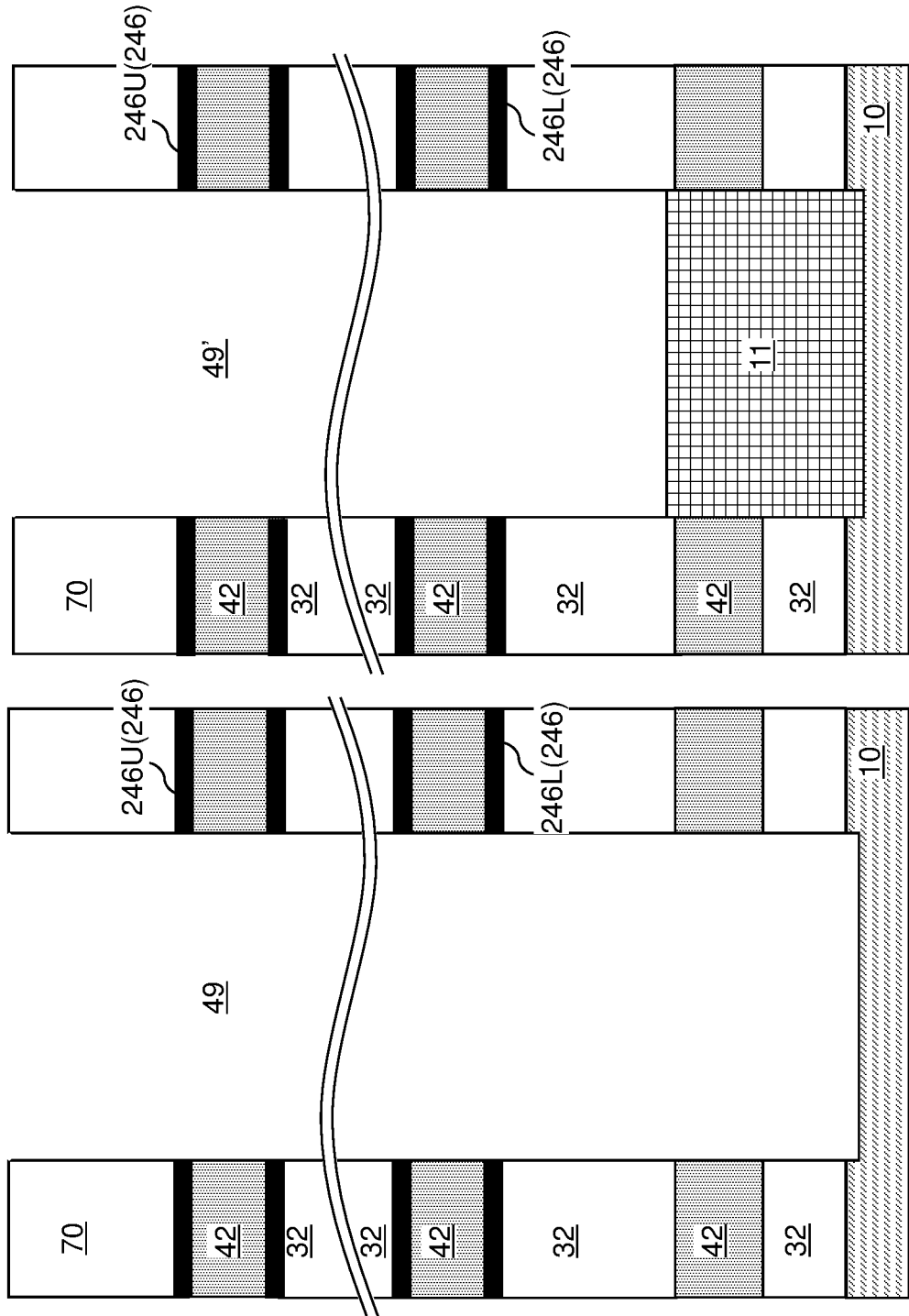

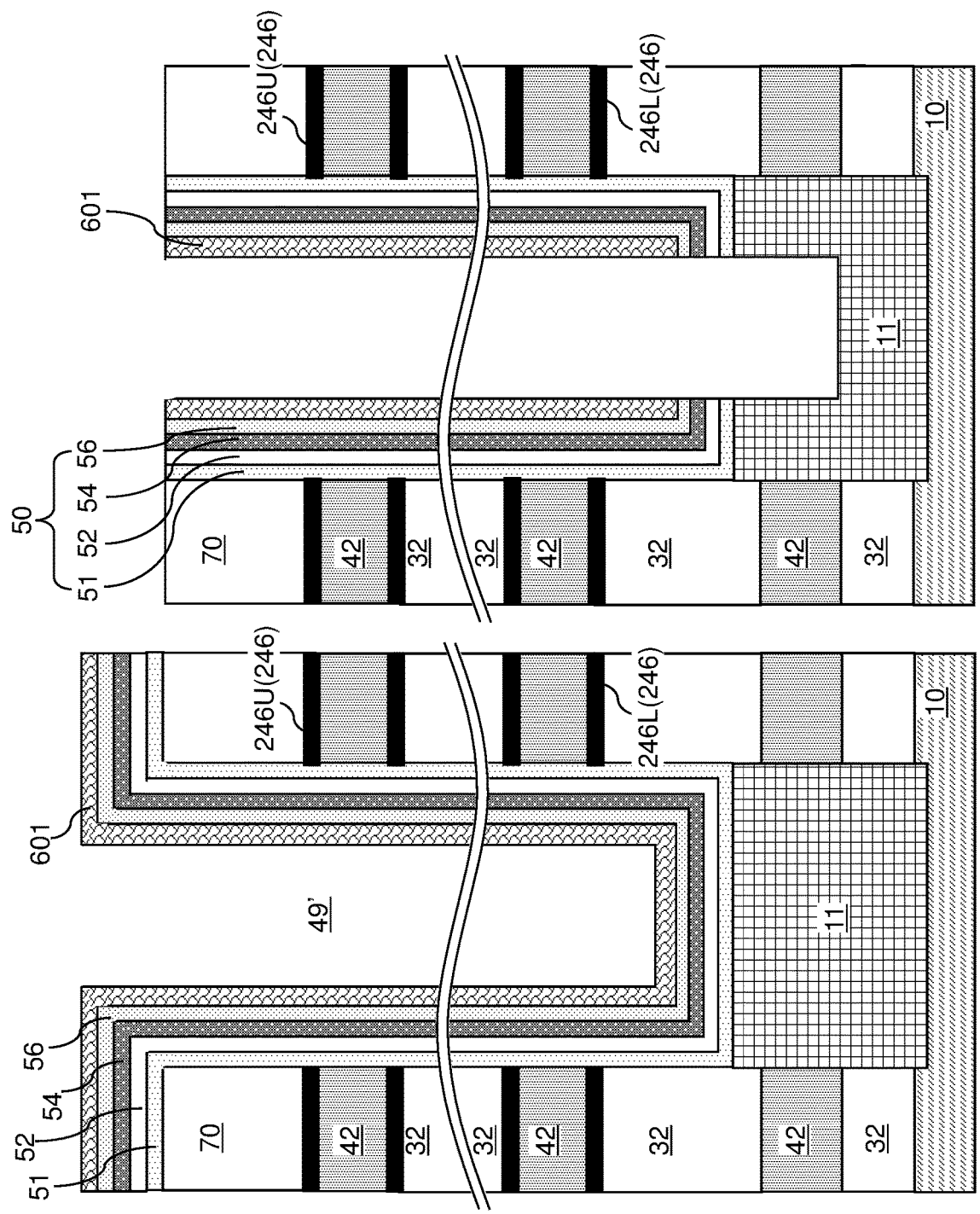

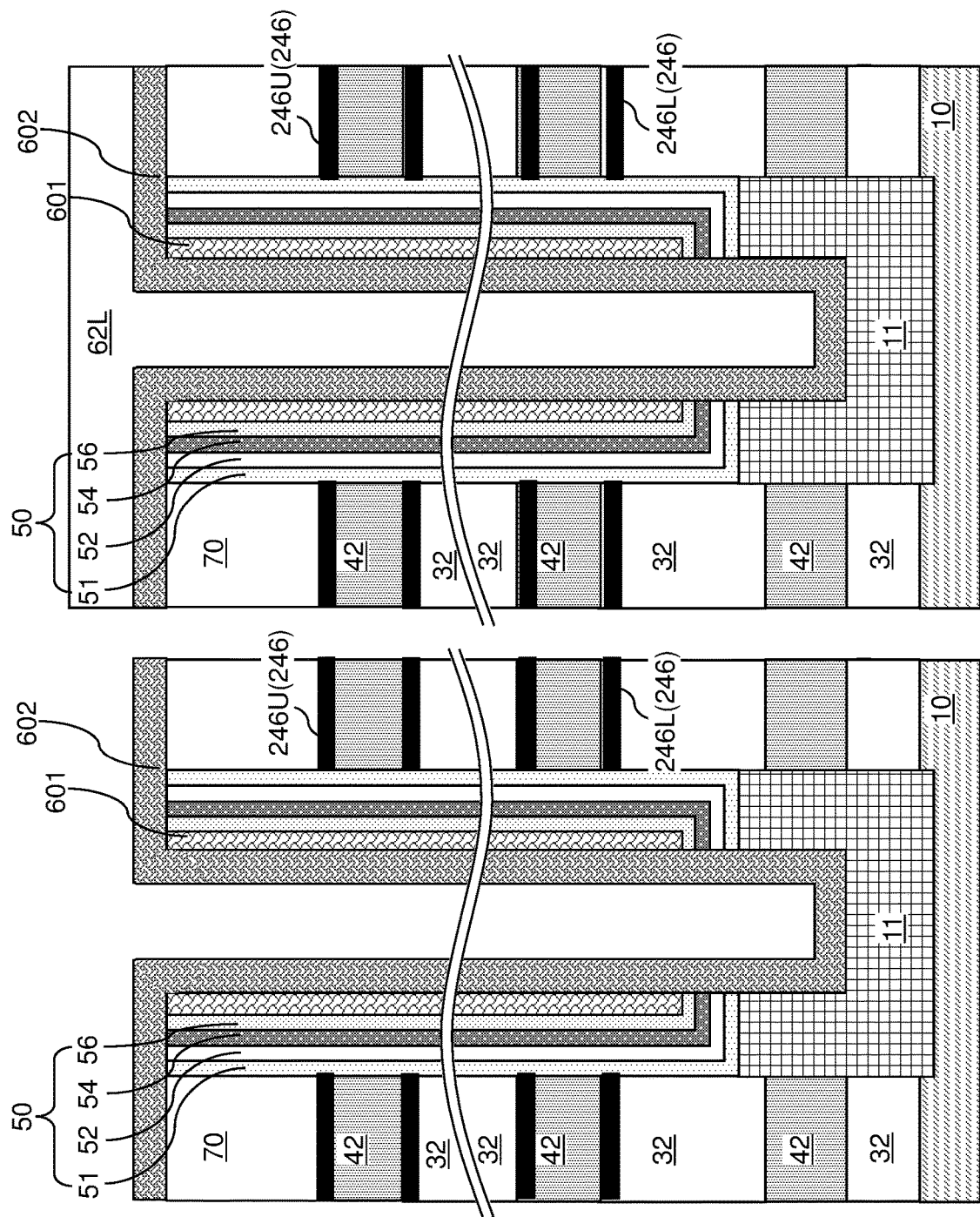

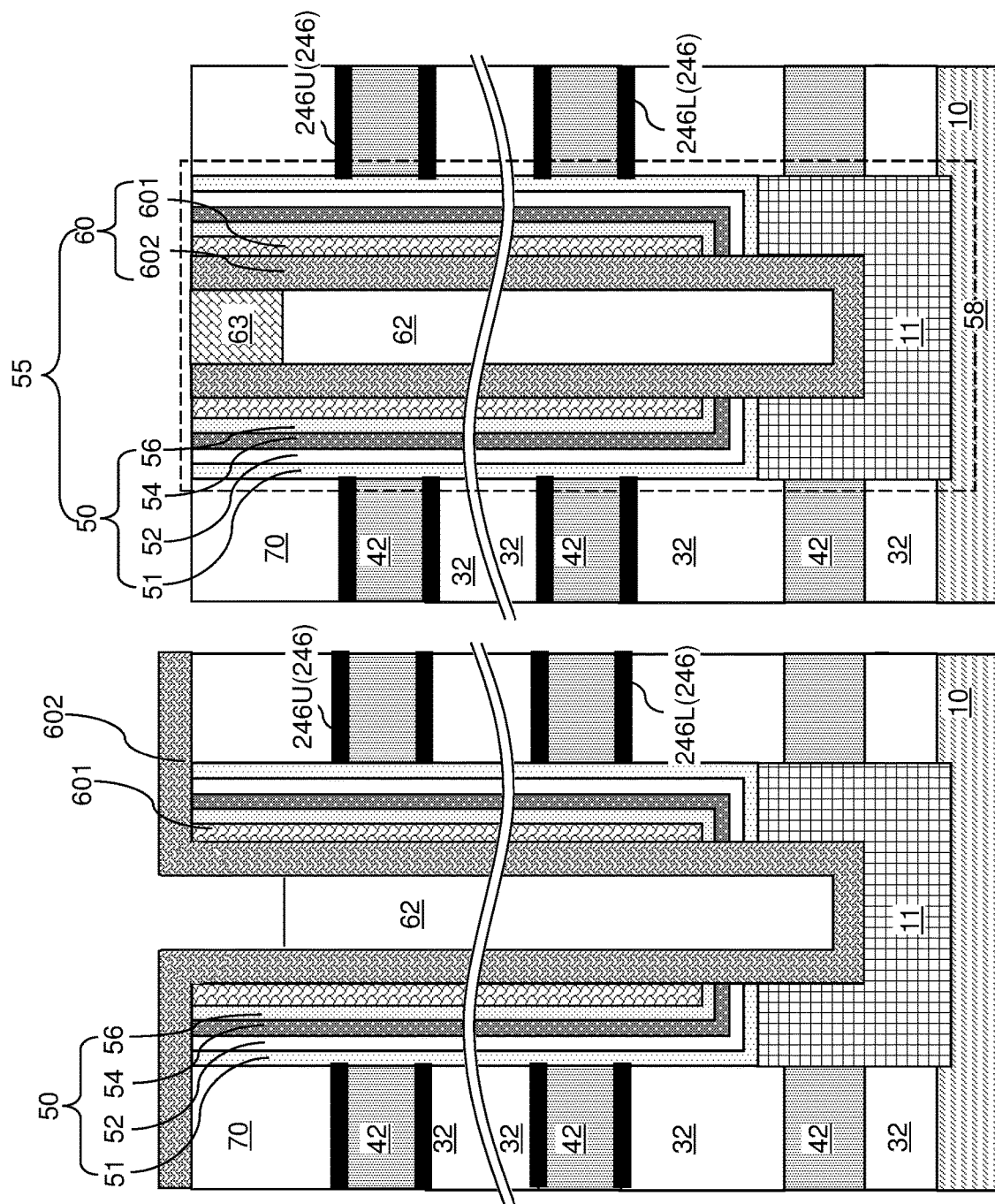

THREE-DIMENSIONAL MEMORY DEVICE CONTAINING PLURAL WORK FUNCTION WORD LINES AND METHODS OF FORMING THE SAME

FIELD

The present disclosure relates generally to the field of semiconductor devices, and particularly to a three-dimensional memory device employing plural work function word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers located over a substrate, memory openings vertically extending through the alternating stack, and memory stack structures extending through the alternating stack. Each of the memory stack structures contains a memory film and a vertical semiconductor channel. At least one of the electrically conductive layers contains a first conductive material portion having a respective inner sidewall that contacts a respective one of the memory films at a vertical interface, and a second conductive material portion that has a different composition from the first conductive material portion, and contacting the first electrically conductive material portion, a bottom surface of a first one of the insulating layers and a top surface of a second one of the insulating layers. The first conductive material portion has a lower work function than the second conductive material portion.

According to another aspect of the present disclosure, a method of forming a three-dimensional memory device is provided, which comprises: forming an alternating stack of insulating layers and sacrificial material layers over a substrate; forming memory openings through the alternating stack; forming lateral recesses at levels of the sacrificial material layers around each of the memory openings; forming first conductive material portions in the lateral recesses; forming memory opening fill structures in the memory openings, wherein each of the memory opening fill structures comprises a memory film and a vertical semiconductor channel; forming backside recesses by removing the sacrificial material layers selective to the insulating layers; and forming second conductive material portions within the backside recesses, wherein the first conductive material portions have a lower work function than the second conductive material portions.

According to yet another aspect of the present disclosure, a three-dimensional memory device comprises an alternating stack of insulating layers and electrically conductive layers located over a substrate, memory openings vertically extending through the alternating stack, and memory stack structures extending through the alternating stack. Each of the memory stack structures comprises a memory film and a vertical semiconductor channel. At least one of the electrically conductive layers comprises a layer stack including, from bottom to top, a lower conductive liner, a conductive material layer, and an upper conductive liner, wherein each of the lower conductive liner, the conductive material layer, and the upper conductive liner contacts the memory films, wherein the conductive material layer has a lower work function than the lower and upper conductive liners.

According to yet another aspect of the present disclosure, a method of forming a three-dimensional memory device is provided, which comprises: forming a vertical repetition of a unit layer stack including an insulating layer, a lower conductive liner, a sacrificial material layer, and an upper conductive liner over a substrate; forming memory openings through the alternating stack; forming memory opening fill structures in the memory openings, wherein each of the memory opening fill structures comprises a memory film and a vertical semiconductor channel; forming backside recesses by removing the sacrificial material layers selective to the insulating layers, the lower conductive liners, and the upper conductive liners; and forming electrically conductive layers within the backside recesses, wherein each of the electrically conductive layers comprises a respective one of the lower conductive liners, a respective one of the upper conductive liners, and a respective conductive material layer located between the respective one of the lower conductive liners and the respective one of the upper conductive liners, wherein the conductive material layer has a lower work function than the lower and upper conductive liners.

BRIEF DESCRIPTION OF THE DRAWINGS

FIGS. 5A-5J are sequential schematic vertical cross-sectional views of a memory opening within the first exemplary structure during formation of first conductive material portions and a memory opening fill structure therein according to the first embodiment of the present disclosure.

FIGS. 19A-19H are sequential schematic vertical cross-sectional views of a memory opening within the third exemplary structure during formation of a memory opening fill structure therein according to the third embodiment of the present disclosure.

DETAILED DESCRIPTION

Figure 1:
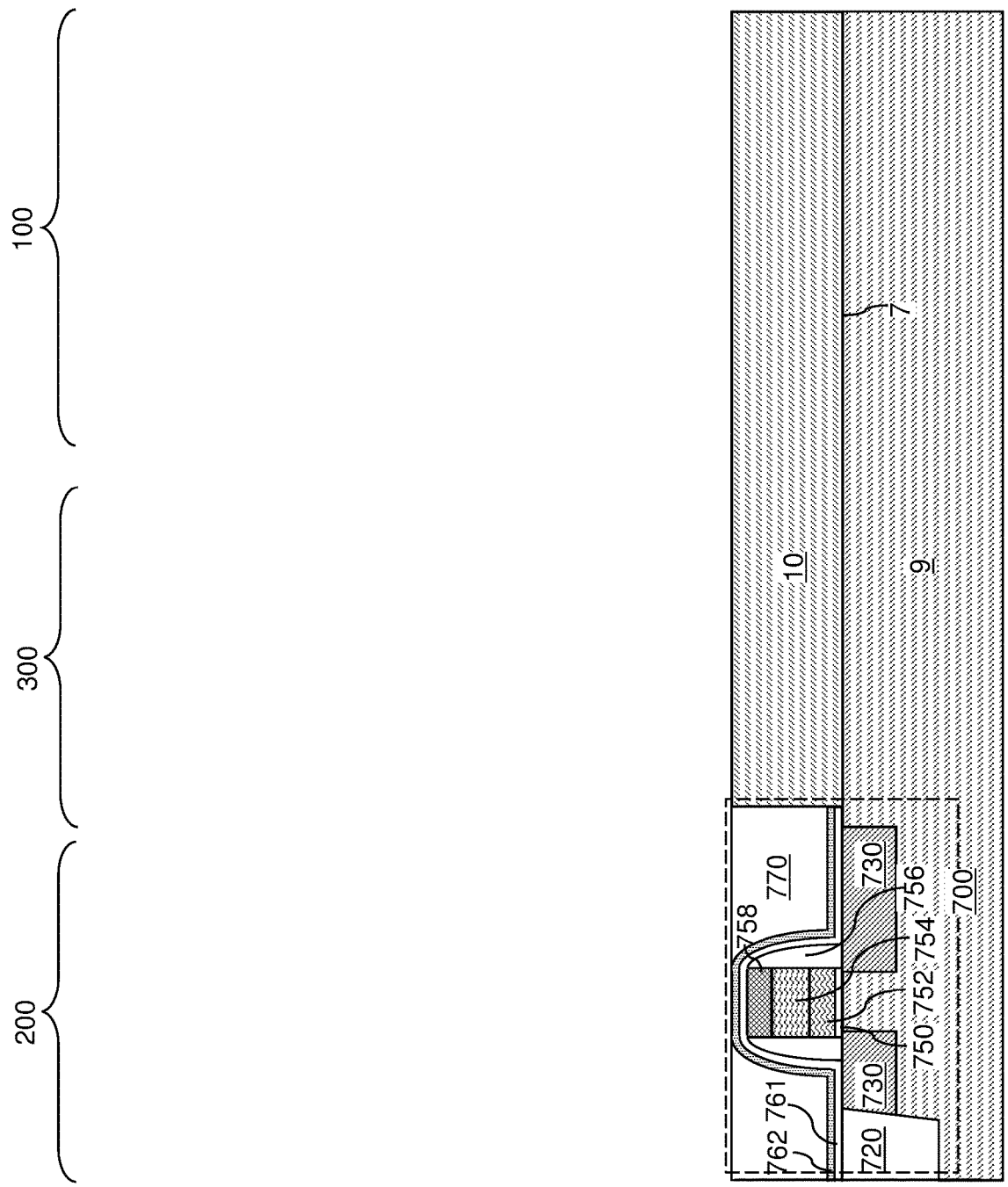
FIG. 1 is a schematic vertical cross-sectional view of a first exemplary structure after formation of at least one peripheral device and a semiconductor material layer according to a first embodiment of the present disclosure.

In three-dimensional NAND memory devices in which a charge trapping layer (i.e., charge storage layer) continuously extends through multiple levels of word lines, inter-level portions of the charge trapping layer can be collaterally programmed during programming of a memory cell containing a portion of the charge trapping layer adjacent to a selected word line. Such neighboring word line interference effect changes the threshold voltage for neighboring memory cells, and reduces operational window for programming and sensing. The embodiments of the present disclosure provide a three-dimensional memory device containing multilayer, plural work function word lines and methods of manufacturing the same, the various aspects of which are described below. The plural work function word lines reduce the neighboring word line interference to enhance performance and reliability of a three-dimensional NAND memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
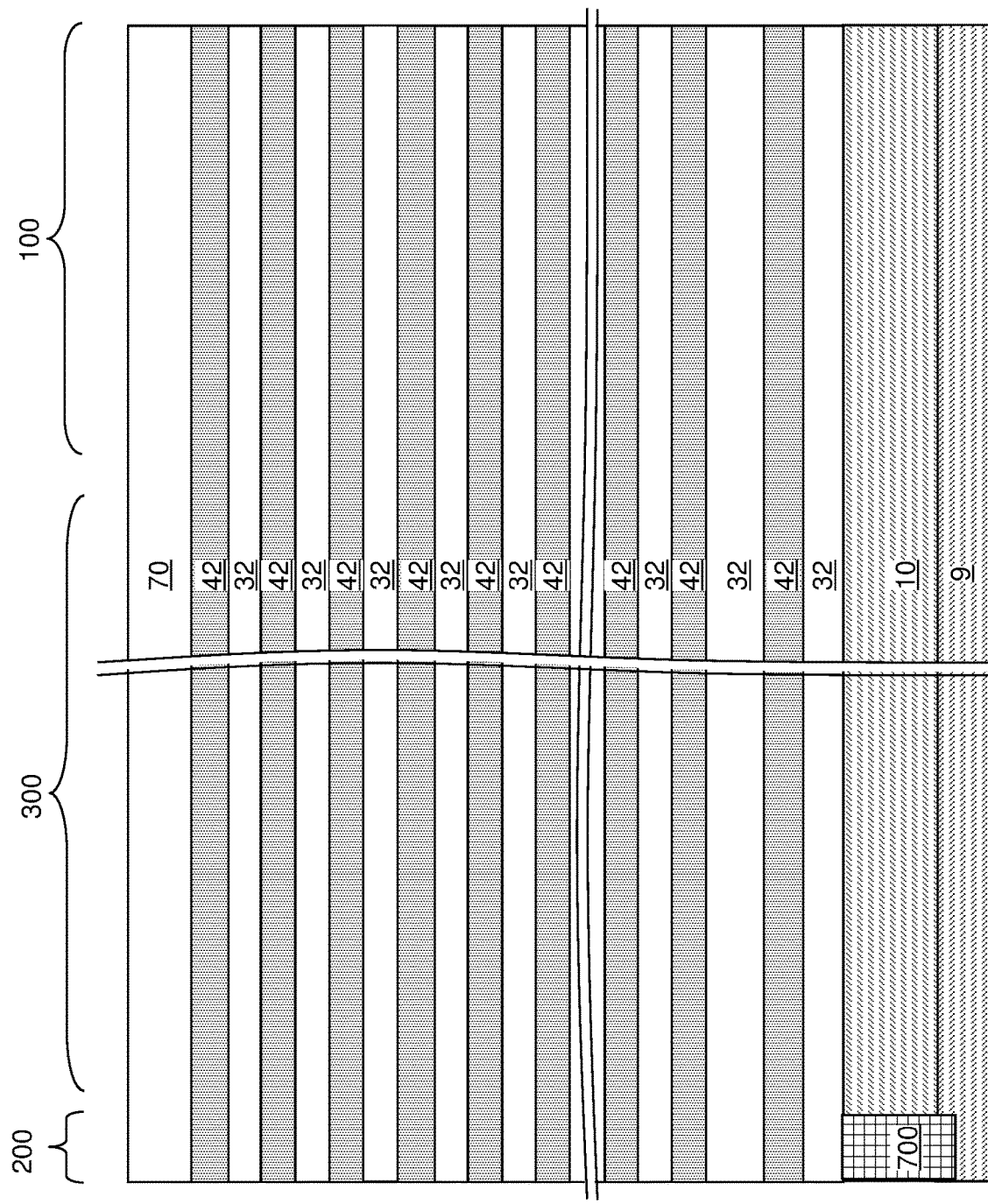
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 (e.g., a control gate electrode or a sacrificial material layer) can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
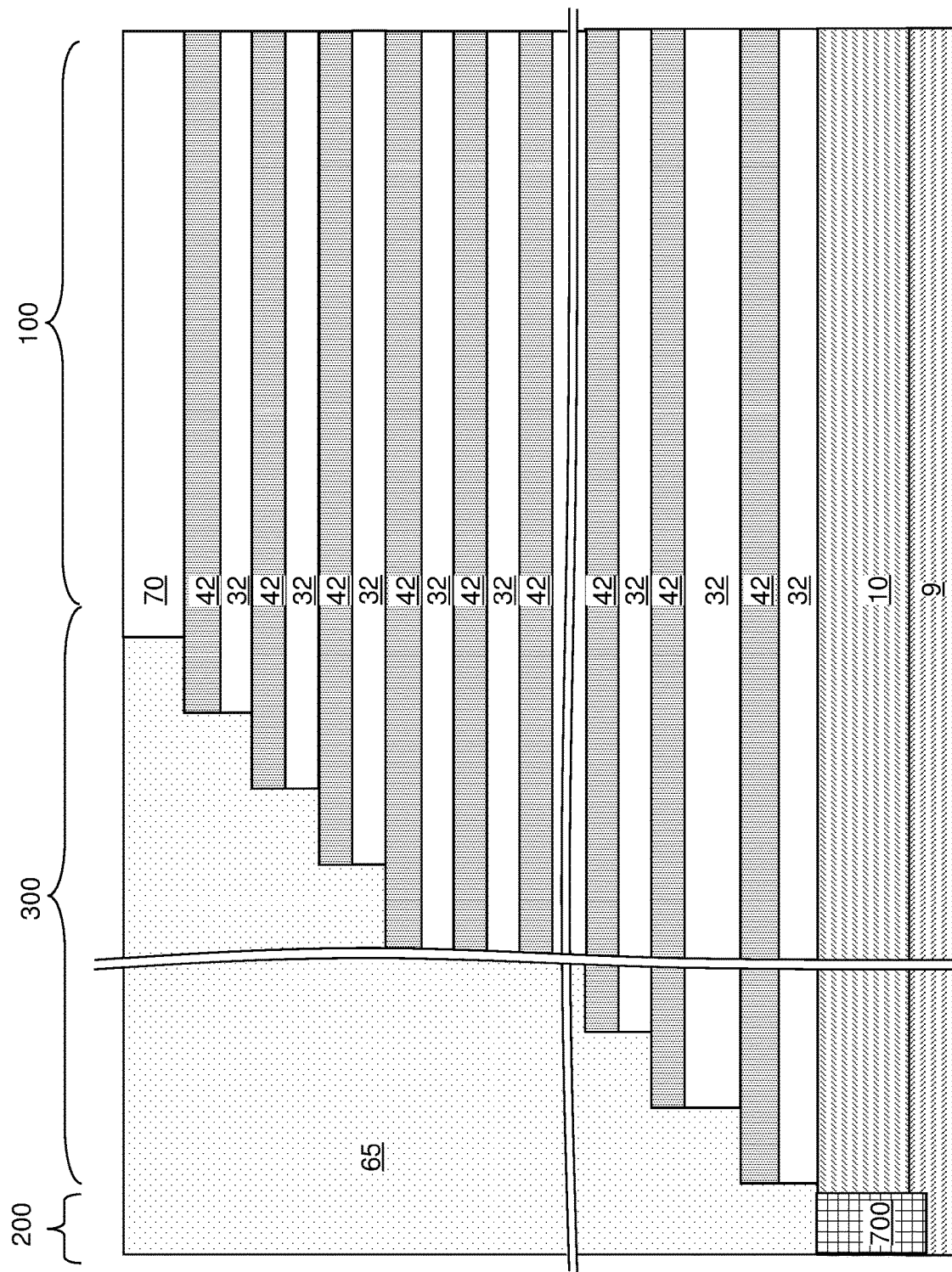
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can be formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped surfaces can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
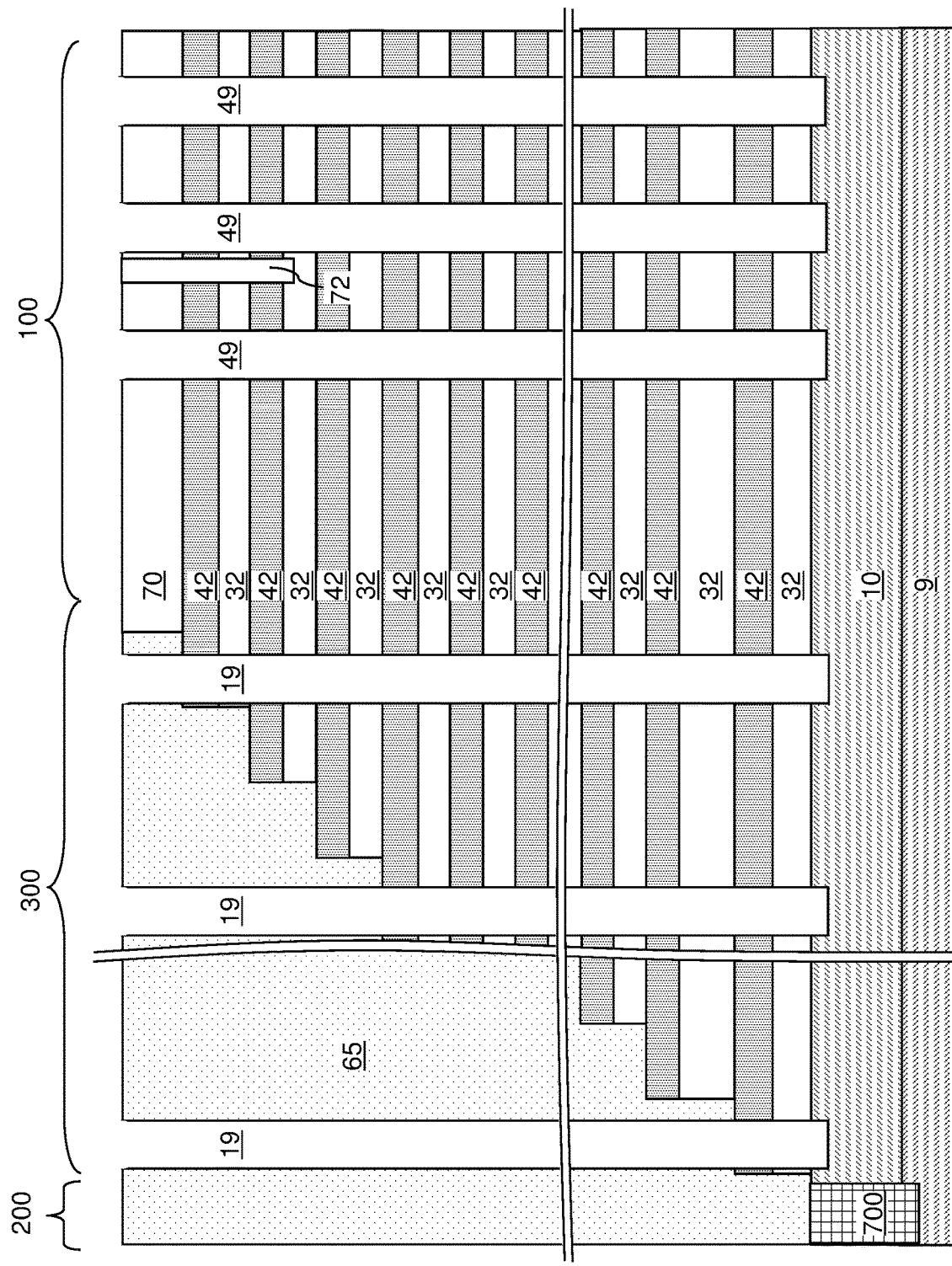
FIG. 4A is a schematic vertical cross-sectional view of the first exemplary structure after formation of memory openings and support openings according to the first embodiment of the present disclosure.
Figure 4B:
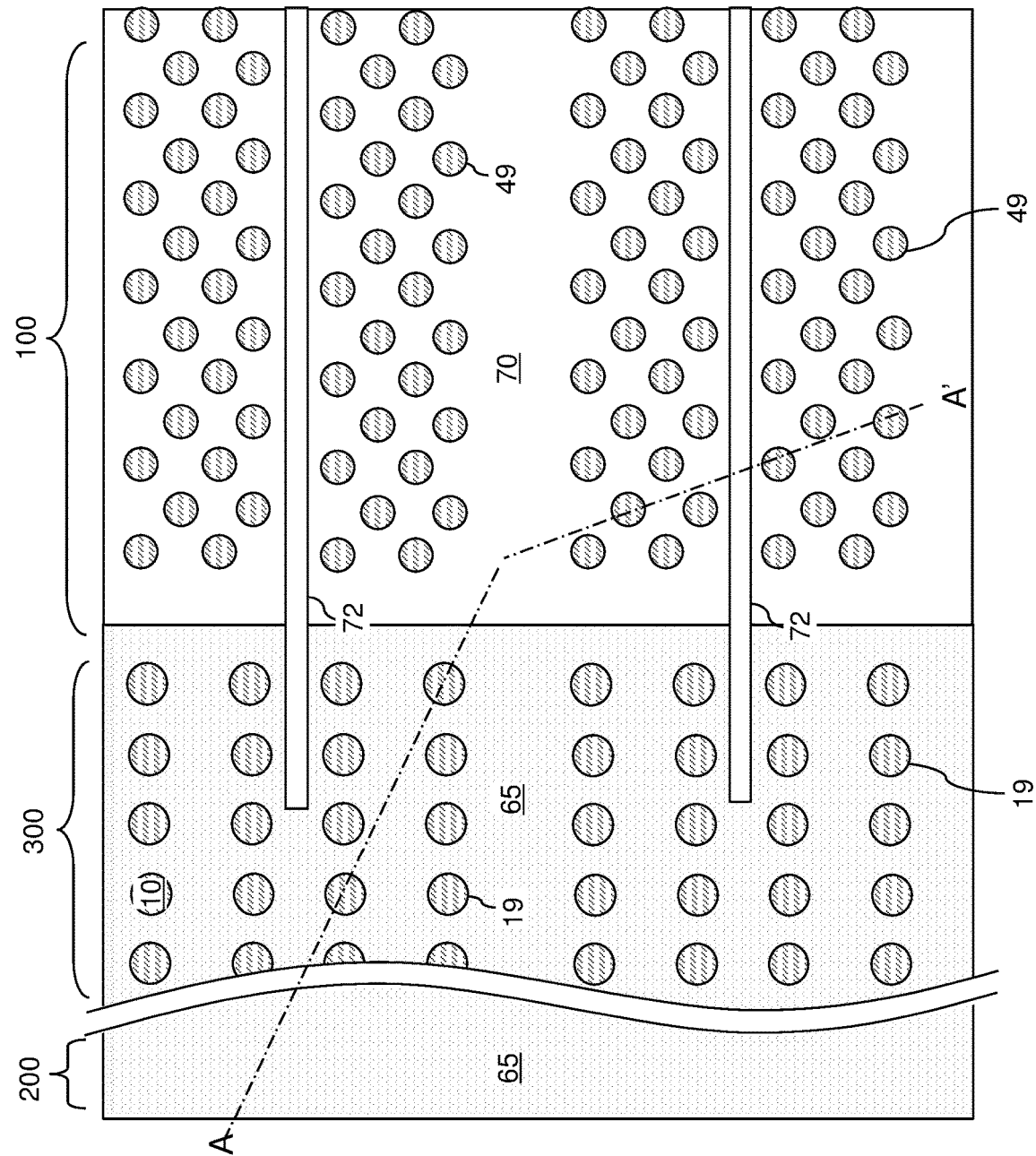
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. The processing step that forms the pedestal channel portion 11 is optional, and may be omitted. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, lateral recesses 49A can be formed at levels of the sacrificial material layers 42 around each of the memory openings 49 and support openings. For example, an isotropic etch process the etches the material of the sacrificial material layers 42 selective to the material of the insulating layers 32 can be performed to laterally recess physically exposed sidewalls of the sacrificial material layers 42 around each memory opening 49 and around each support opening. The etch chemistry and the duration of the isotropic etch process can be controlled such that the lateral recess distance of the sidewalls of the sacrificial material layers 42 is within a controlled limit (such as within 20% and/or within 20%) from a target recess distance. Each memory opening 49 can be laterally expanded at each level of the sacrificial material layers 42 by the lateral recess distance of the isotropic etch process.

In an illustrative example, if the insulating layers 32 include silicon oxide and if the sacrificial material layers 42 include silicon nitride, a wet etch process using hot phosphoric acid to etch silicon nitride selective to silicon oxide.

The lateral recess distance by which sidewalls of the sacrificial material layers 42 are recessed around each memory opening 49 can be in a range from 0.5 nm to 15 nm. In one embodiment, the lateral recess distance may be in a range from 1 nm to 10 nm, and/or in a range from 2 nm to 6 nm, and/or in a range from 2.5 nm to 4 nm.

Referring to FIG. 5D, a first conductive material portion 48 including a first conductive material having a first work function is formed in each lateral recess 49A. The work function of a conductive material refers to the minimum quantity of energy which is required to remove an electron from the conductive material to a distance at infinity. The first conductive material is selected such that a second conductive material having a second work function that is greater than the first work function can be subsequently formed outside the memory openings 49 by replacing the sacrificial material layers 42 with material portions including at least the second conductive material. As such, a pair of conductive materials having different work functions can be employed in embodiments of the present disclosure.

In a first illustrative example, the first conductive material can be n-type doped polysilicon and the second conductive material can be titanium nitride, tungsten nitride, or tantalum nitride. In a second illustrative example, the first conductive material can be n-type doped polysilicon and the second conductive material can be tungsten, which may, or may not be, doped with silicon and/or boron. In a third illustrative example, the first conductive material can be ruthenium, and the second conductive material can be titanium nitride, tungsten nitride, tantalum nitride, or tungsten, which may, or may not be, doped with silicon and/or boron.

In one embodiment, the first conductive material portions 48 can be formed employing a selective growth process that grows the first conductive material from the physically exposed surface of the sacrificial material layers 42 while suppressing growth of the first conductive material from the physically exposed surfaces of the insulating layers 32. For example, if the sacrificial material layers 42 include silicon nitride, ruthenium can be grown from the recessed sidewalls of the sacrificial material layers 42. Atomic layer deposition (ALD) can be performed to grow ruthenium for the first conductive material portions 48. The duration of the deposition process can be controlled such that the lateral thickness of the first conductive material portions 48 is about the same as the lateral recess distance of the lateral recesses 49A.

In another embodiment, the first conductive material portions 48 can be formed by deposition of the first conductive material in the lateral recesses by a conformal or a non-conformal deposition process, and by removing portions of the first conductive material from outside the volumes of the lateral recesses 49A by an anisotropic etch process such as a reactive ion etch process. In an illustrative example, n-type doped amorphous silicon (which can be subsequently converted into n-type doped polysilicon after an anneal process)' or n-type doped polysilicon can be deposited in the lateral recesses 49A. Excess portion of the deposited n-type doped semiconductor material that are located outside the volumes of the lateral recesses 49A can be removed by a reactive ion etch process. Each remaining annular portion of the n-type doped semiconductor material filling a respective lateral recess 49A comprises a first conductive material portion 48.

A vertical stack of first conductive material portions 48 can be formed within each memory opening 49. Each first conductive material portion 48 can have a tubular configuration. Each first conductive material portion 48 can include an inner cylindrical sidewall, an outer cylindrical sidewall, an upper annular surface having an inner periphery that adjoins an upper periphery of the inner cylindrical sidewall and having an outer periphery that adjoins an upper periphery of the outer cylindrical sidewall, and a lower annular surface having an inner periphery that adjoins a lower periphery of the inner cylindrical sidewall and having an outer periphery that adjoins a lower periphery of the outer cylindrical sidewall. The thickness of each first conductive material portion 48 is the spacing between the inner cylindrical sidewall and the outer cylindrical sidewall. The first conductive material portions 48 have a lateral thickness less than 15 nm. In one embodiment, the thickness of each first conductive material portion 48 can be in a range from 1 nm to 15 nm, and/or in a range from 1.5 nm to 10 nm, and/or in a range from 2 nm to 6 nm, and/or in a range from 2.5 nm to 4 nm.

Referring to FIG. 5E, a stack of layers including a blocking dielectric layer 52, a charge storage layer 54, a tunneling dielectric layer 56, and an optional first semiconductor channel layer 601 can be sequentially deposited in the memory openings 49 over each vertical stack of first conductive material portions 48.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-type doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5F, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5G, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5H, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5I, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5J, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
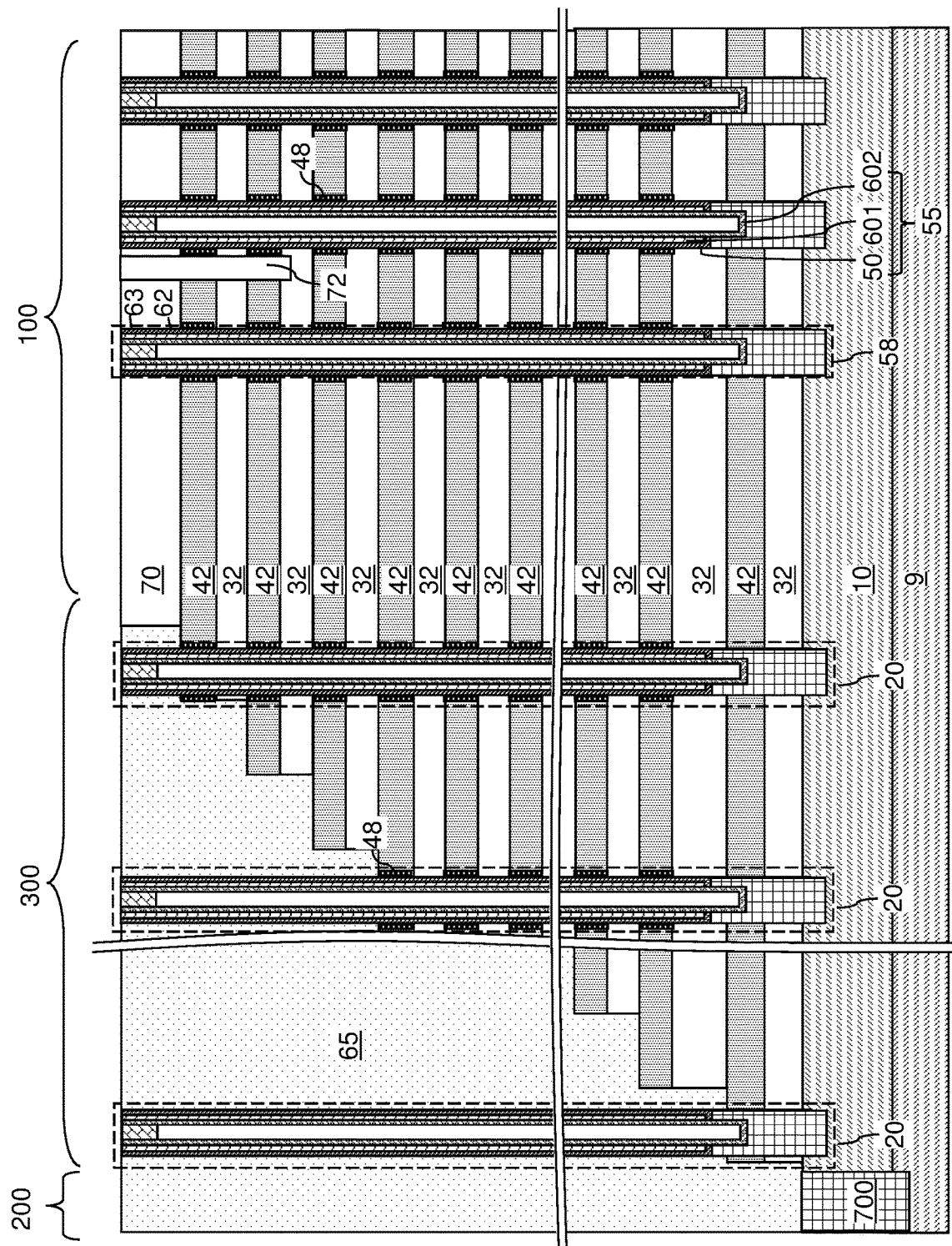
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
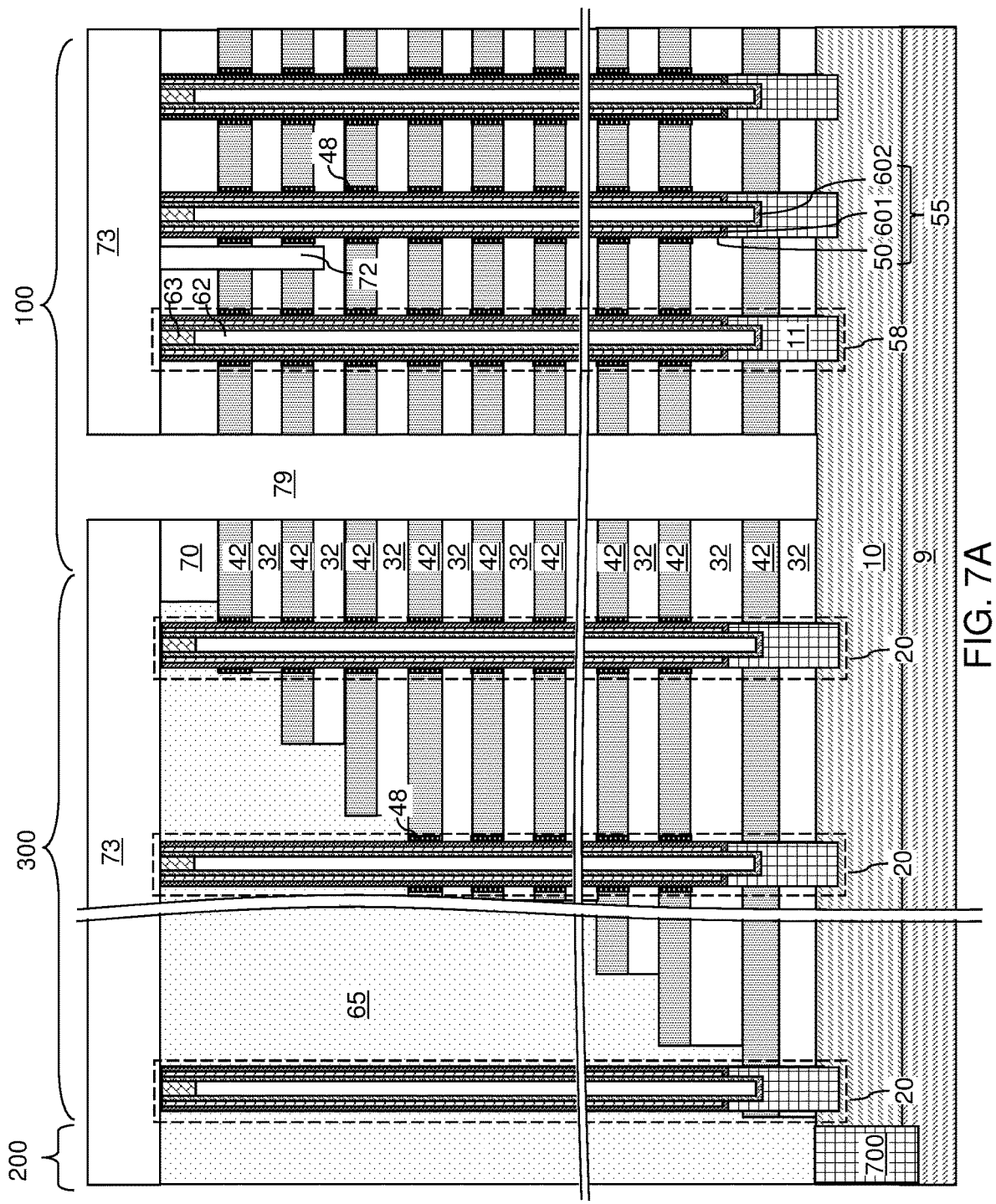
FIG. 7A is a schematic vertical cross-sectional view of the first exemplary structure after formation of backside trenches according to the first embodiment of the present disclosure.
Figure 7B:
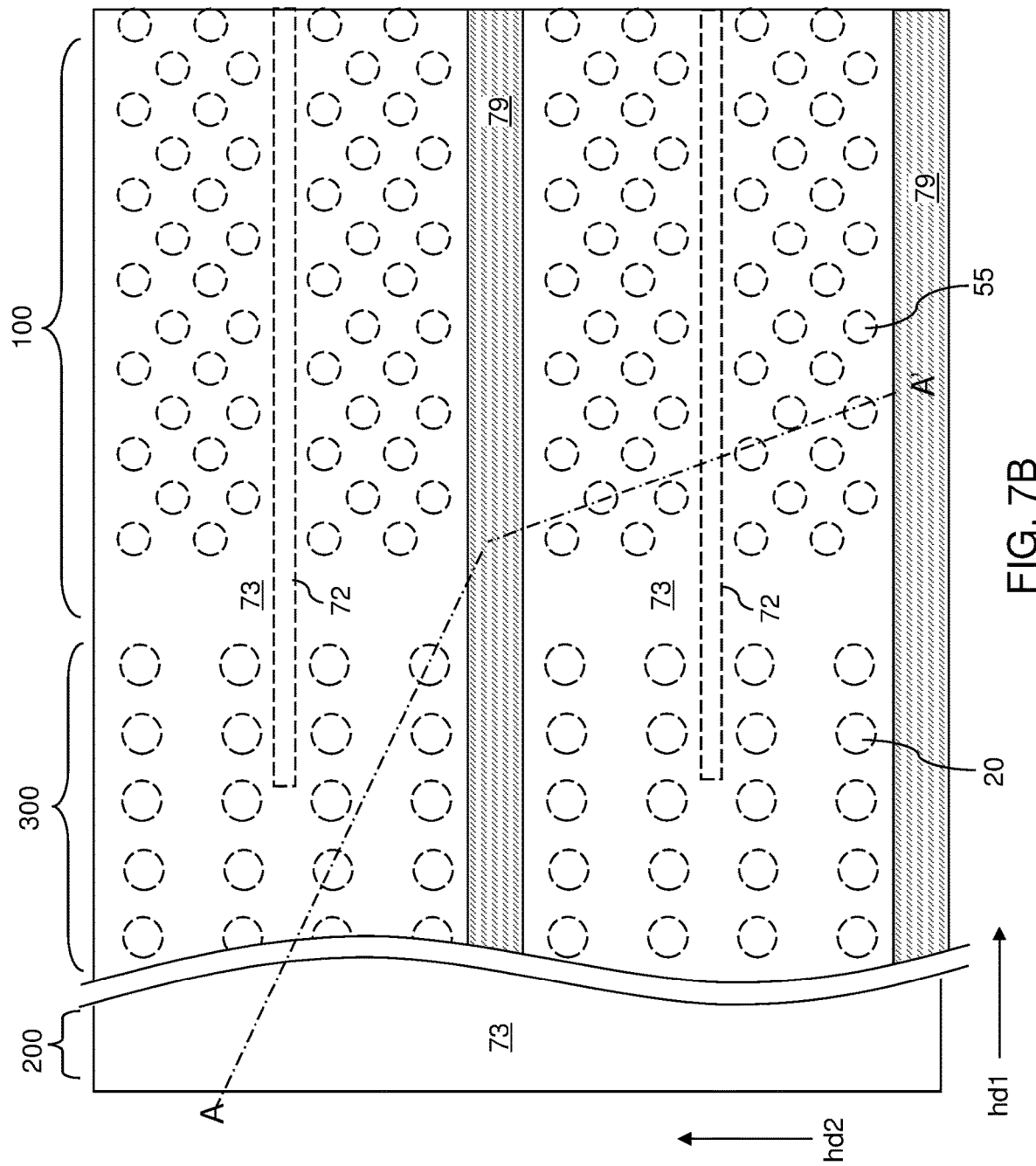
FIG. 7B is a partial see-through top-down view of the first exemplary structure of FIG. 7A. The vertical plane A-A' is the plane of the schematic vertical cross-sectional view of FIG. 7A.
Figure 7C:
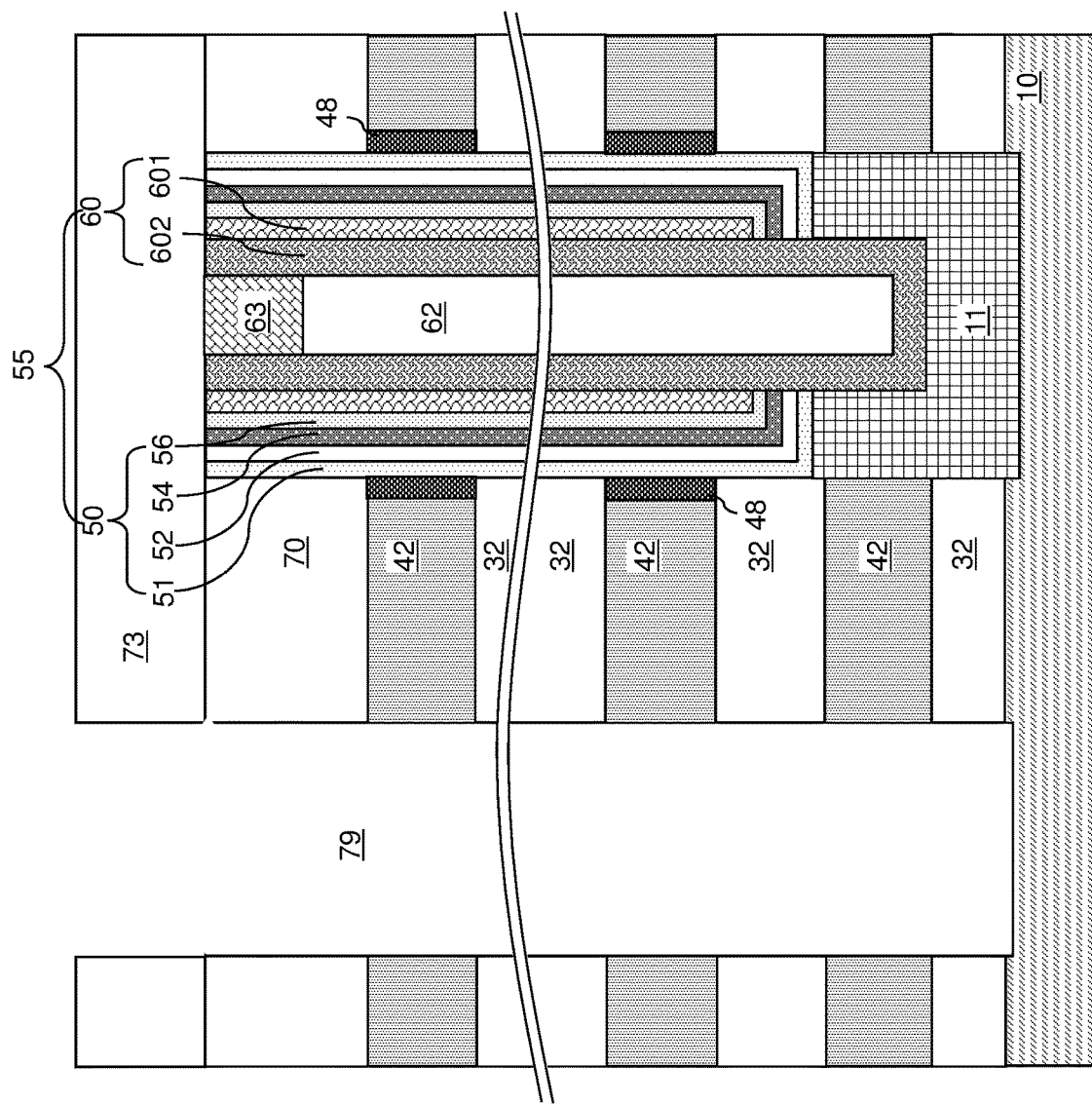
FIG. 7C is a schematic vertical cross-sectional view of a region of the first exemplary structure of FIG. 7A.

Referring to FIGS. 7A-7C, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
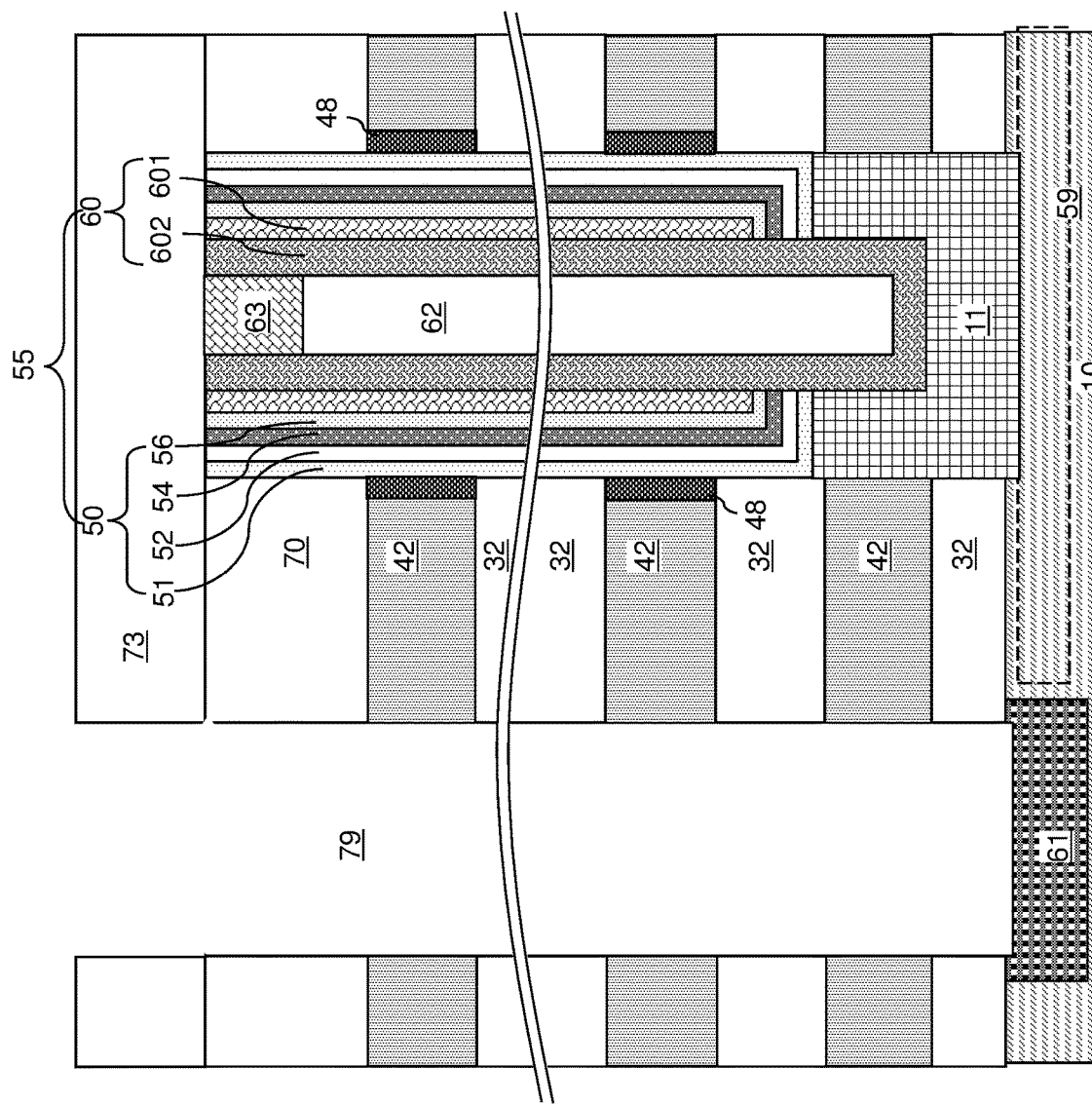
FIG. 8 is a schematic vertical cross-sectional view of a region of the first exemplary structure after formation of a source region according to the first embodiment of the present disclosure.

Referring to FIG. 8, a source region 61 can be formed at a surface portion of the semiconductor material layer 10 under each backside trench 79 by implantation of electrical dopants of the second conductivity type into physically exposed surface portions of the semiconductor material layer 10. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent along the second horizontal direction hd2 that is greater than the lateral extent of an overlying backside trench 79 along the second horizontal direction hd2.

An upper portion of the semiconductor material layer 10 that extends between a source region 61 and adjacent memory opening fill structures 58 constitutes a horizontal semiconductor channel 59 for a plurality of field effect transistors. In case the pedestal channel portions 11 are present, each horizontal semiconductor channel 59 is connected to vertical semiconductor channels 60 through a respective set of pedestal channel portions 11. In case the pedestal channel portions 11 are not present, each horizontal semiconductor channel 59 is connected directly to vertical semiconductor channels 60.

Figure 9A:
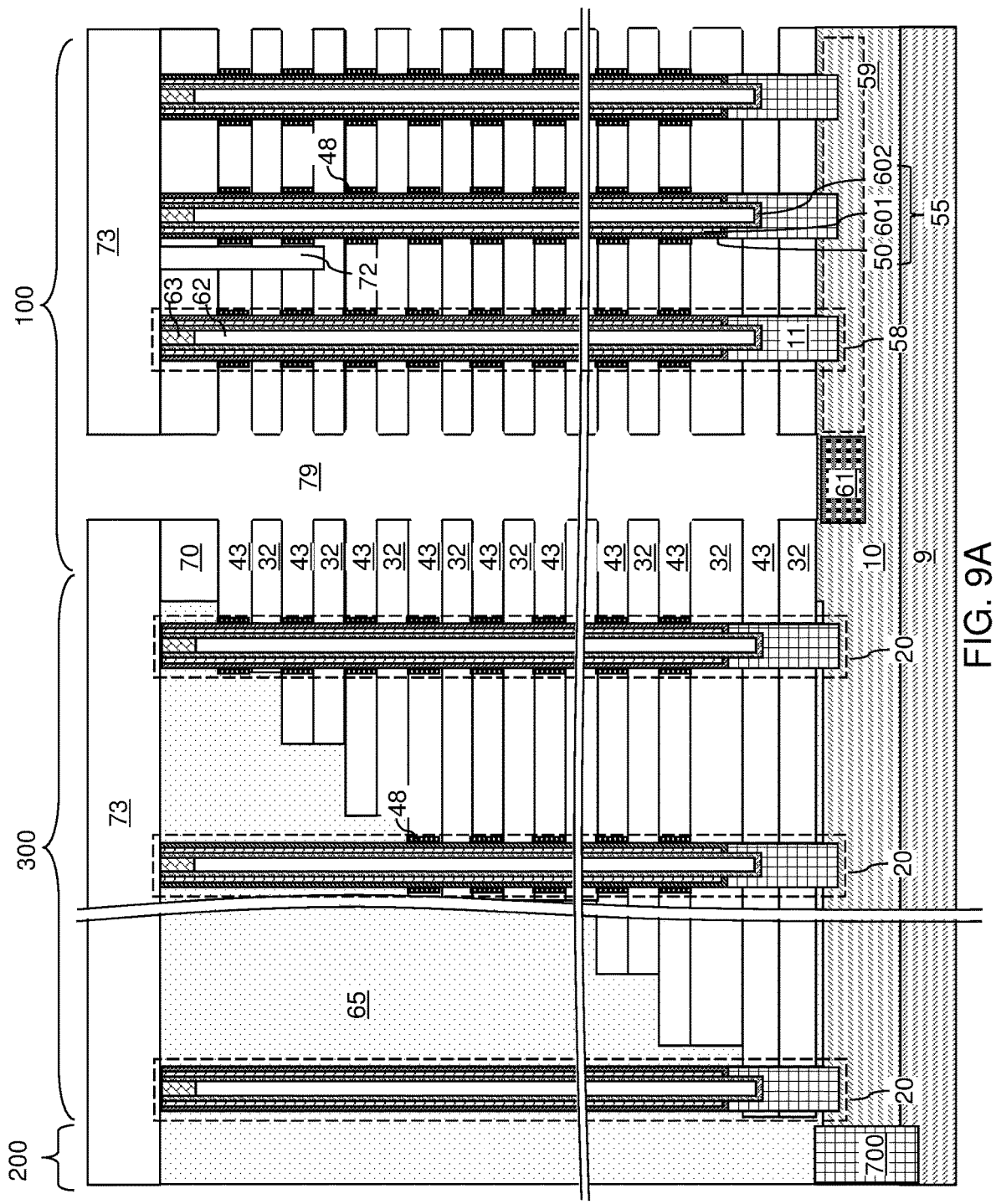
FIG. 9A is a schematic vertical cross-sectional view of the first exemplary structure after formation of backside recesses according to the first embodiment of the present disclosure.
Figure 9B:
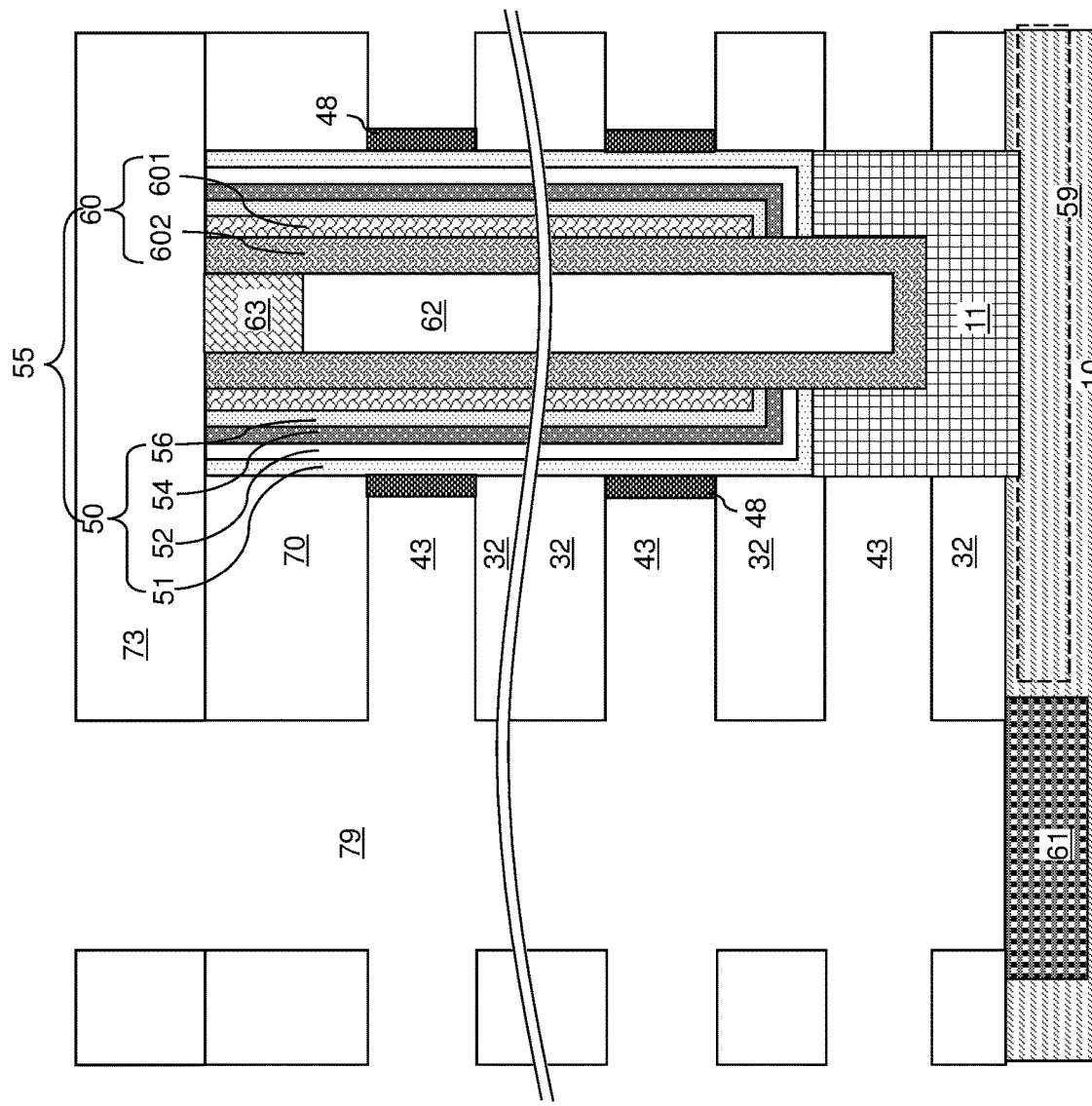
FIG. 9B is a schematic vertical cross-sectional view of a region of the first exemplary structure of FIG. 9A.

Referring to FIGS. 9A and 9B, an etchant that selectively etches the second material of the sacrificial material layers 42 with respect to the first material of the insulating layers 32, the first conductive material of the first conductive material portions 48, the material of the retro-stepped dielectric material portion 65, and the doped semiconductor material of the source regions 61 can be introduced into the backside trenches 79, for example, employing an isotropic etch process. Backside recesses 43 are formed in volumes from which the sacrificial material layers 42 are removed. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Outer sidewalls of the first conductive material portions 48 and outer sidewalls of the pedestal channel portions 11 can be physically exposed to the backside recesses 43.

Figure 10A:
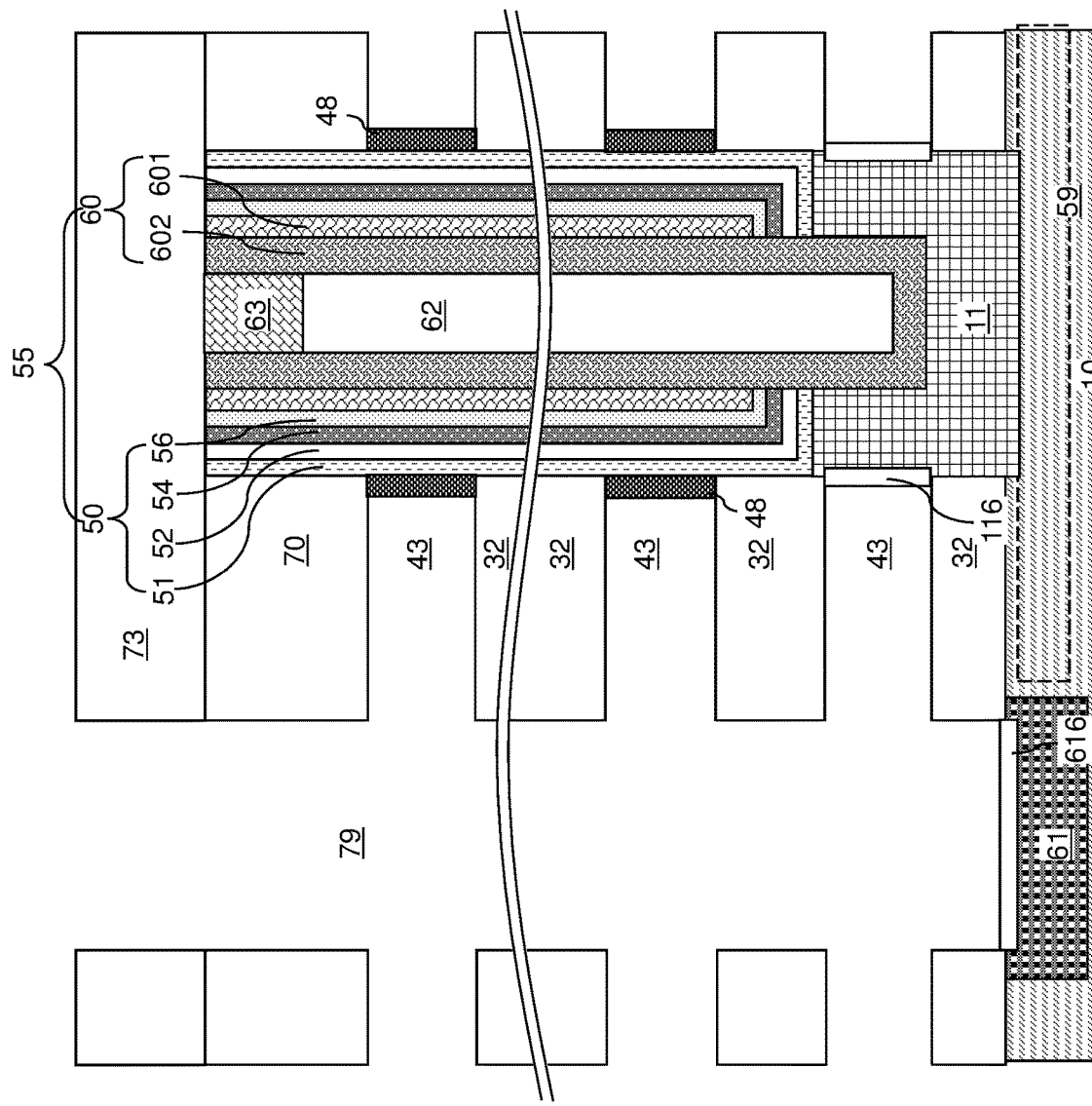
FIGS. 10A-10C are sequential vertical cross-sectional views of a region of the first exemplary structure during formation of electrically conductive layers according to the first embodiment of the present disclosure.

Referring to FIG. 10A, in embodiments in which the pedestal channel portions 11 are present in the memory opening fill structures 58 and the first conductive material of the first conductive material portions 48 do not form a dielectric oxide at a process condition that forms a thin oxide from surface portions of the pedestal channel portions 11, an oxidation process can be performed. In embodiments in which the pedestal channel portions 11 are not present in the memory opening fill structures 58, the oxidation process, i.e., the processing steps of FIG. 10A, can be omitted.

For example, the first conductive material portions 48 can include, and/or can consist essentially of, ruthenium and the pedestal channel portions 11 are present in the first exemplary structure, an oxidation process can be performed to convert the physically exposed surface portions of the pedestal channel portions 11 into dielectric oxide portions. Physically exposed surface portions of the source regions 61 can be collaterally converted into additional dielectric oxide portions. For example, thermal conversion and/or plasma conversion can be employed to convert a surface portion of each pedestal channel portion 11 into a tubular dielectric spacer 116, and to convert each physically exposed surface portion of the source regions 61 into a planar dielectric portion 616. Surface portions of the first conductive material portions 48 may not be oxidized, or may be oxidized into a conductive oxide material (such as ruthenium oxide which has electrical resistivity of about $3.6 \times 10^{-5}$ Ω-cm, or electrical conductivity of about $2.8 \times 10^6$ S/m).

Figure 10B:
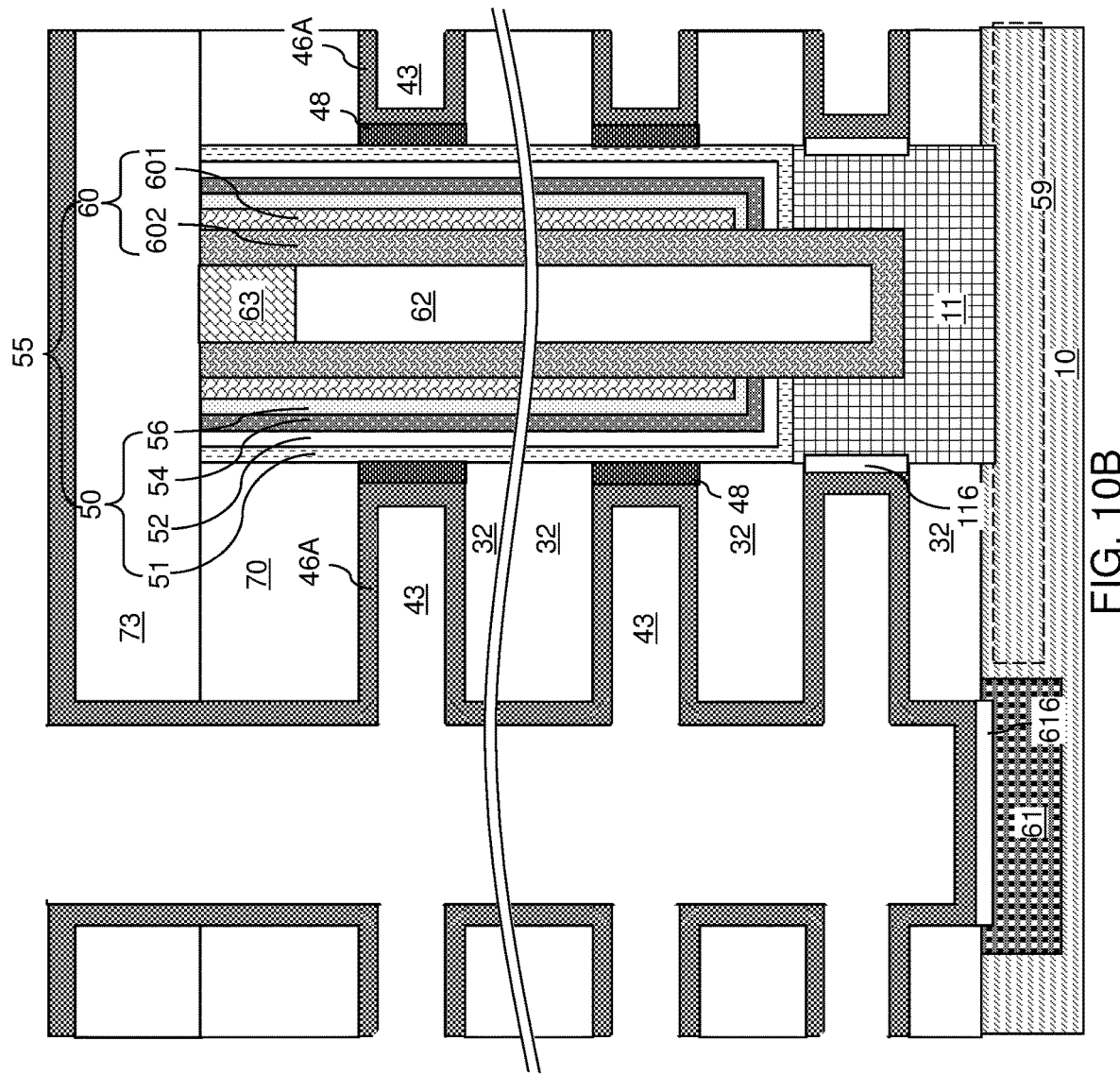

Referring to FIG. 10B, a conductive material liner 46A including a second conductive material can be deposited in the backside recesses 43, on the sidewalls of the at least one the backside trench 79, and over the top surface of the contact-level dielectric layer 73. The second conductive material has a second work function that is greater than the first work function. The first work function is the work function of the first conductive material in the first conductive material portions 48, and may be greater than 4.5 eV, such as 4.6 eV to 4.9 eV. The second work function may be less than 4.5 eV and may be 4.1 eV to 4.45 eV. In one embodiment, the conductive material liner 46A can include a conductive metallic nitride material such as TiN, TaN, WN, or a stack thereof. Alternatively, the conductive material liner 46A can be formed by deposition of a silicon nucleation layer or a boron nucleation layer on the physically exposed surfaces of each backside recess 43, and by depositing tungsten employing the silicon atoms or boron atoms as nucleation catalysts. In one embodiment, the conductive material liner 46A can be deposited by a conformal deposition process such as chemical vapor deposition (CVD) or atomic layer deposition (ALD). The thickness of the conductive material liner 46A can be in a range from 2 nm to 15 nm, such as from 3 nm to 6 nm, although lesser and greater thicknesses can also be employed.

Figure 10C:
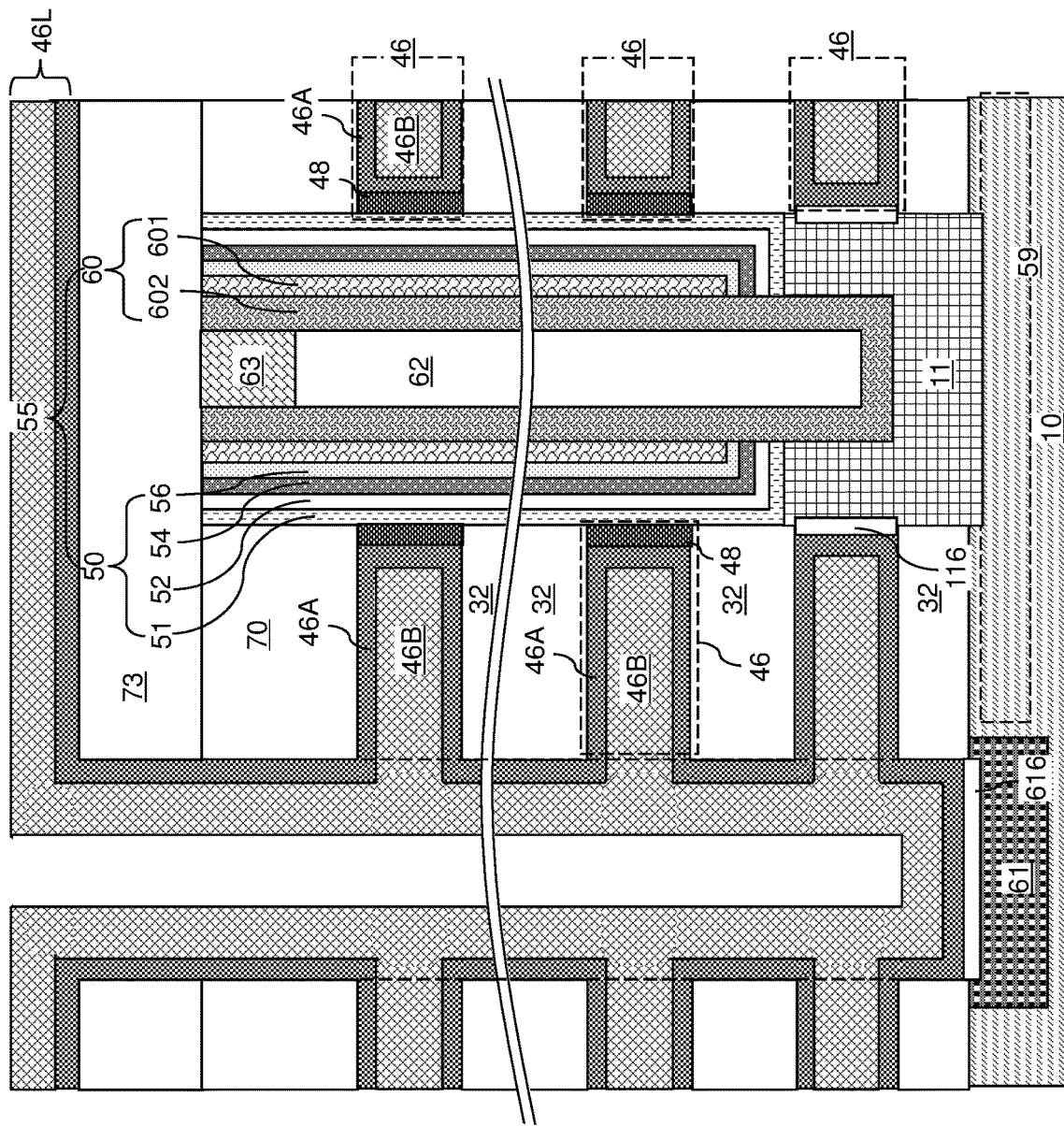

Referring to FIG. 10C, a third conductive material is deposited over the conductive material liner 46A to form a conductive fill material layer 46B. The third conductive material can be deposited by a conformal deposition method, which can be, for example, chemical vapor deposition (CVD) or atomic layer deposition (ALD). In one embodiment, the conductive fill material layer 46B can consist essentially of tungsten. In one embodiment, the conductive fill material layer 46B can be deposited employing a fluorine-containing precursor gas such as $WF_6$. In one embodiment, the conductive fill material layer 46B can be a tungsten layer including a residual level of fluorine atoms as impurities. The conductive fill material layer 46B is spaced from the memory stack structures 55 by a combination of a first conductive material portion 48 having the first work function and a vertically-extending portion of the conductive material liner 46A having the second work function.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a plurality of first conductive material portions 48 that laterally surround a respective vertical semiconductor channel 60, a portion of the conductive material liner 46A, and a portion of the conductive fill material layer 46B that are located between a vertically neighboring pair of dielectric material layers such as a pair of insulating layers 32. The continuous electrically conductive material layer 46L includes a continuous portion of the conductive material liner 46A and a continuous portion of the conductive fill material layer 46B that are located in the backside trenches 79 or above the contact-level dielectric layer 73. Each sacrificial material layer 42 can be replaced with an electrically conductive layer 46. A backside cavity 79' is present in the portion of each backside trench 79 that is not filled with the continuous electrically conductive material layer 46L.

Generally, at least a second conductive material portion including the second conductive material having the second work function can be formed within each of the backside recesses 43. The second conductive material portion can comprise a portion of the conductive material liner 46A. Each of the second conductive material portions can be formed on an outer sidewall of a respective one of the first conductive material portions 48.

In one embodiment, each of the second conductive material portions (which may comprise portions of the conductive material liner 46A) can have a uniform thickness that is less than one half of a height of the backside recesses 43. Third conductive material portions (which may comprise portions of the conductive fill material layer 46B) can be formed on a respective one of the second conductive material portions. Each of the electrically conductive layers 46 can comprise a respective one of the third conductive material portions (comprising a portion of the conductive fill material layer 46B).

Figure 11A:
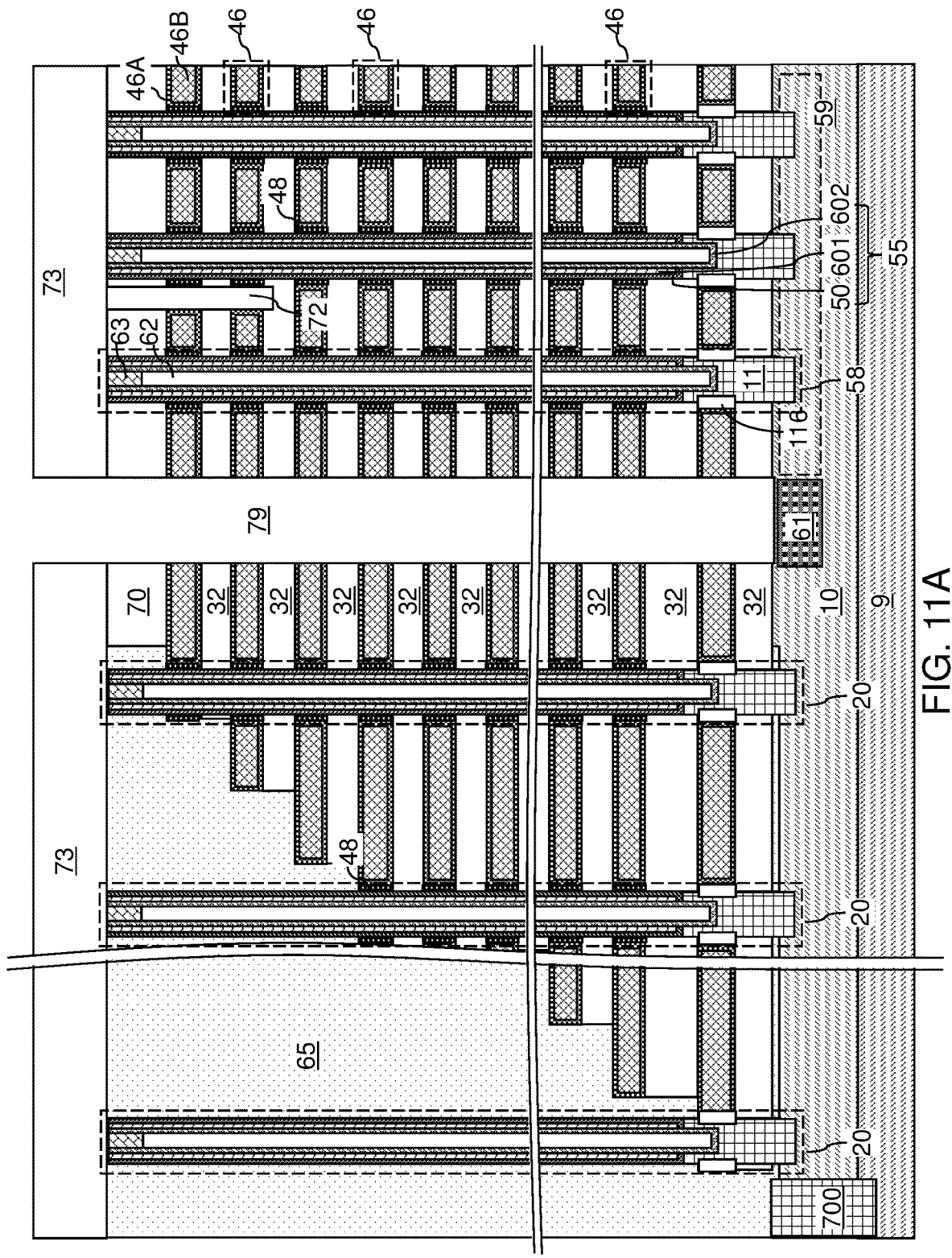
FIG. 11A is a schematic vertical cross-sectional view of the first exemplary structure after removal of a deposited conductive material from within the backside trench according to the first embodiment of the present disclosure.
Figure 11B:
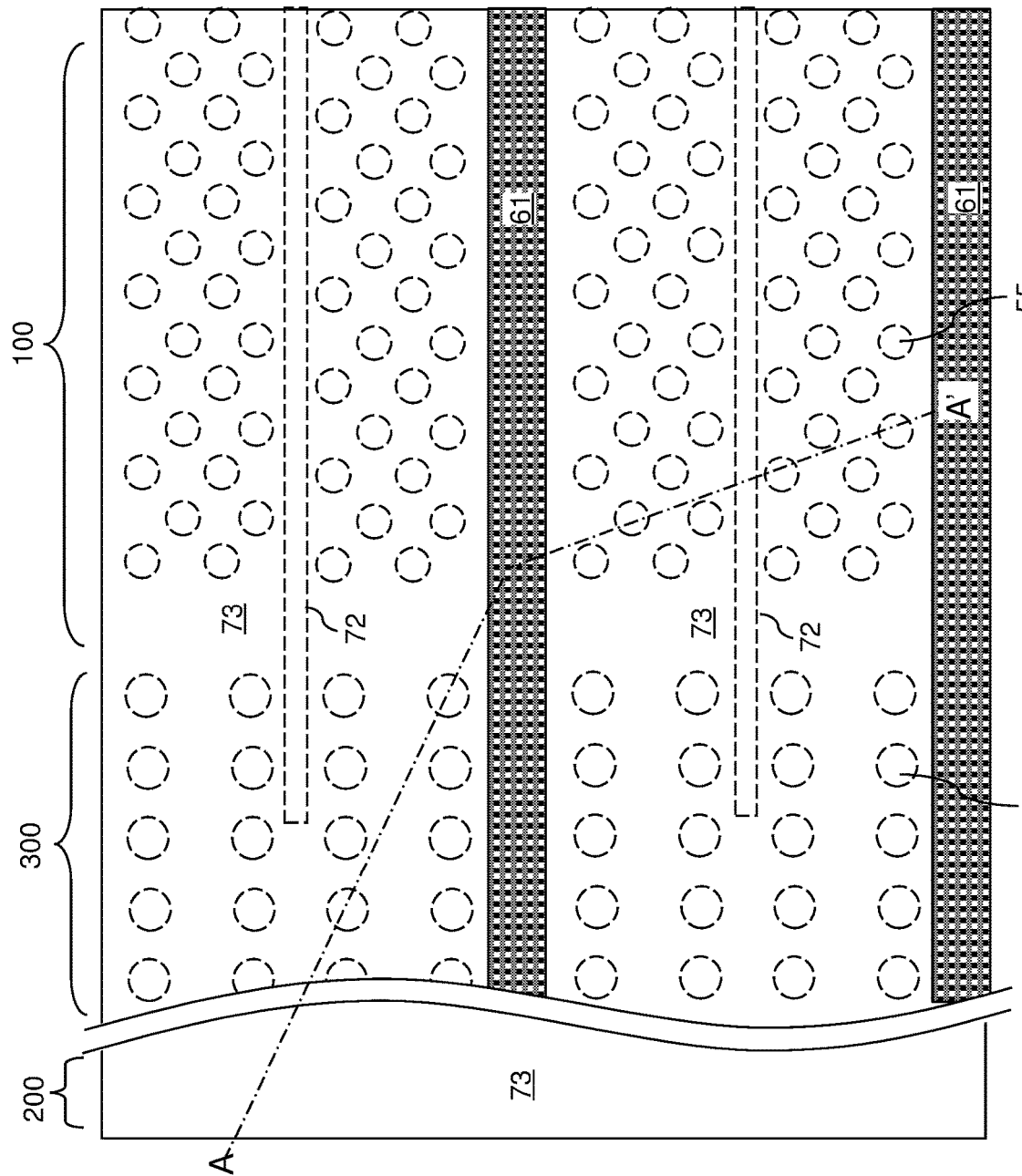
FIG. 11B is a partial see-through top-down view of the first exemplary structure of FIG. 11A. The vertical plane A-A' is the plane of the schematic vertical cross-sectional view of FIG. 11A.
Figure 11C:
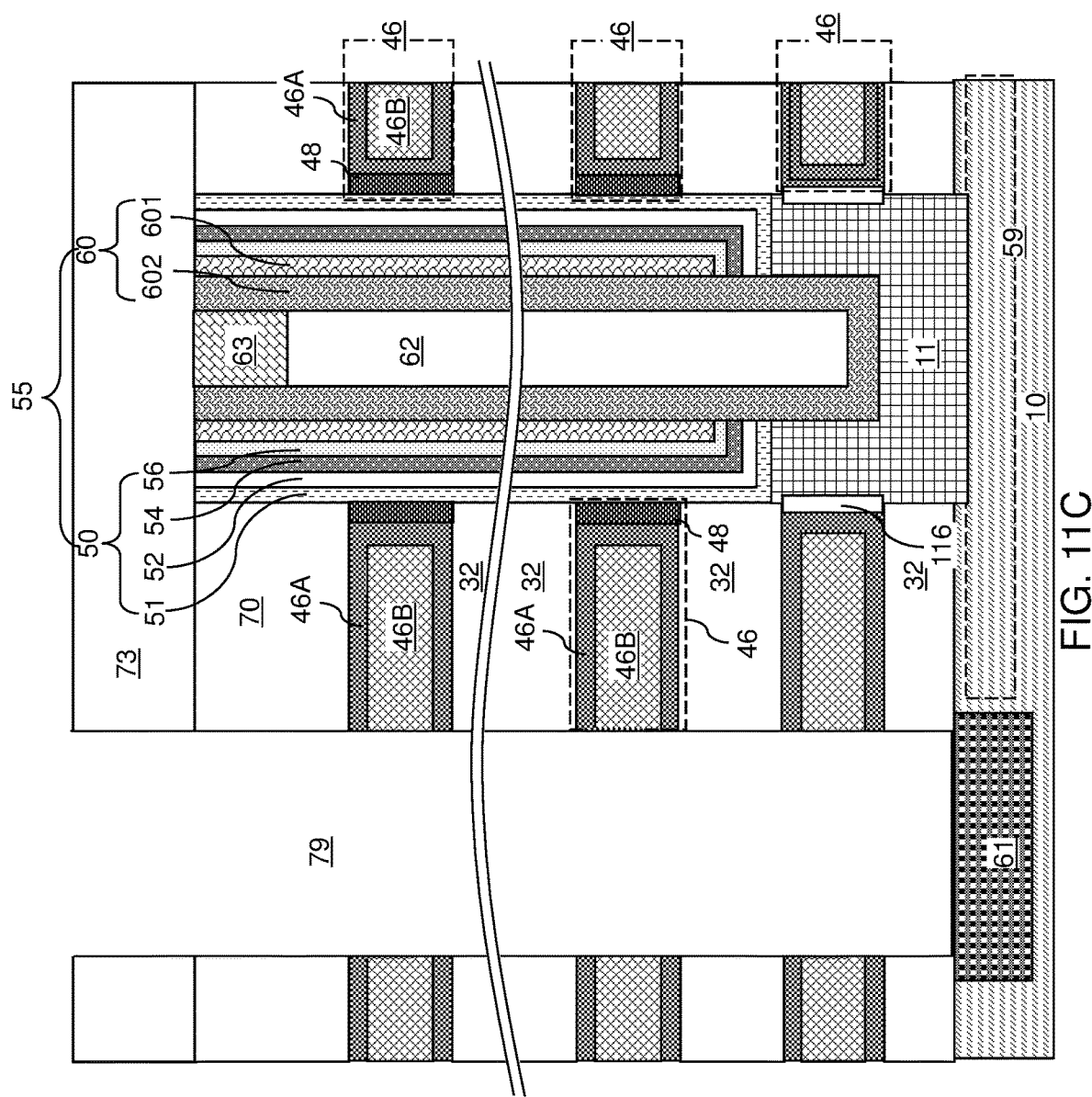
FIG. 11C is a schematic vertical cross-sectional view of a region of the first exemplary structure of FIG. 11A.

Referring to FIGS. 11A-11C, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Any planar dielectric portion 616 can be collaterally removed during the etch process. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. The planar dielectric portions 616 can be removed during removal of the continuous electrically conductive material layer 46L.

The electrically conductive layers 46 are formed between vertically neighboring pairs of the insulating layers 32. Each of the electrically conductive layers 46 comprise a respective one of the first conductive material portions 48 and a respective one of the second conductive material portions (comprising a conductive material liner 46A), and may comprise a respective one of the third conductive material portion (comprising a conductive fill material layer 46B).

Figure 12:
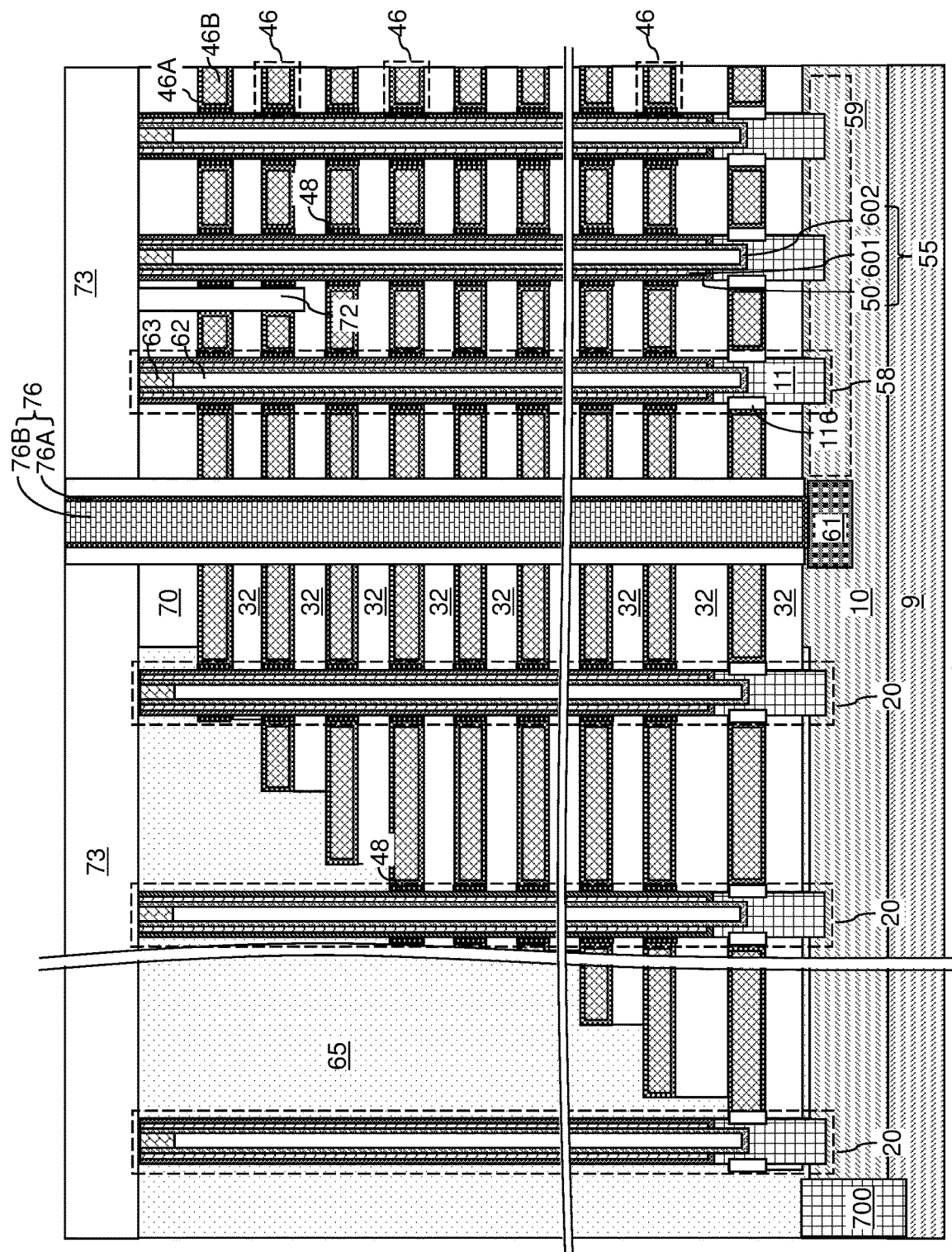
FIG. 12 is a schematic vertical cross-sectional view of the first exemplary structure after formation of backside trench fill structures according to the first embodiment of the present disclosure.

Referring to FIG. 12, an insulating material layer is deposited into the backside trenches 79 and an anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of a source region 61 can be physically exposed at the bottom of each backside trench 79.

A backside contact via structure 76 can be formed within each backside cavity. Each contact via structure 76 can fill a respective backside cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

Figure 13A:
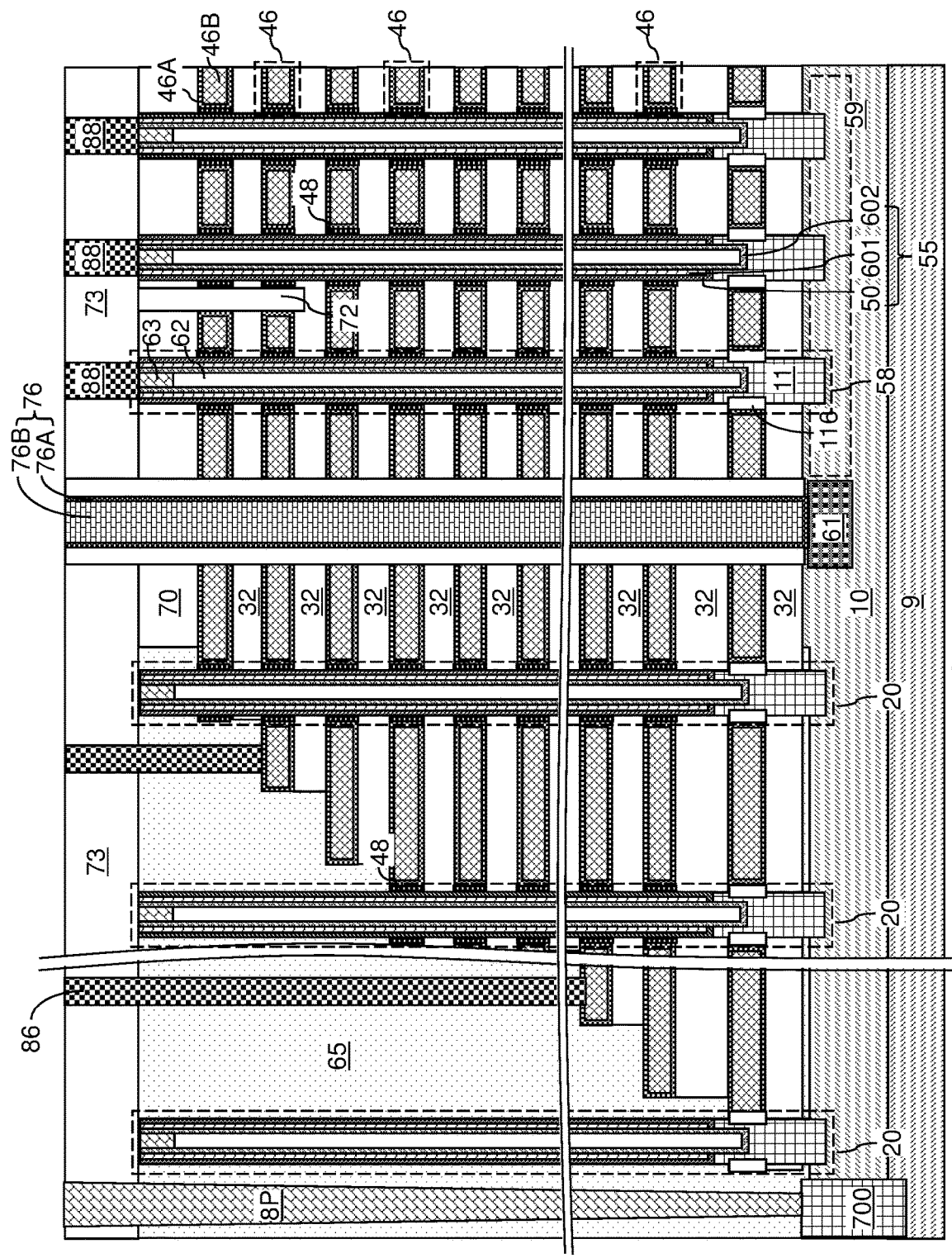
FIG. 13A is a schematic vertical cross-sectional view of the first exemplary structure after formation of additional contact via structures according to the first embodiment of the present disclosure.
Figure 13B:
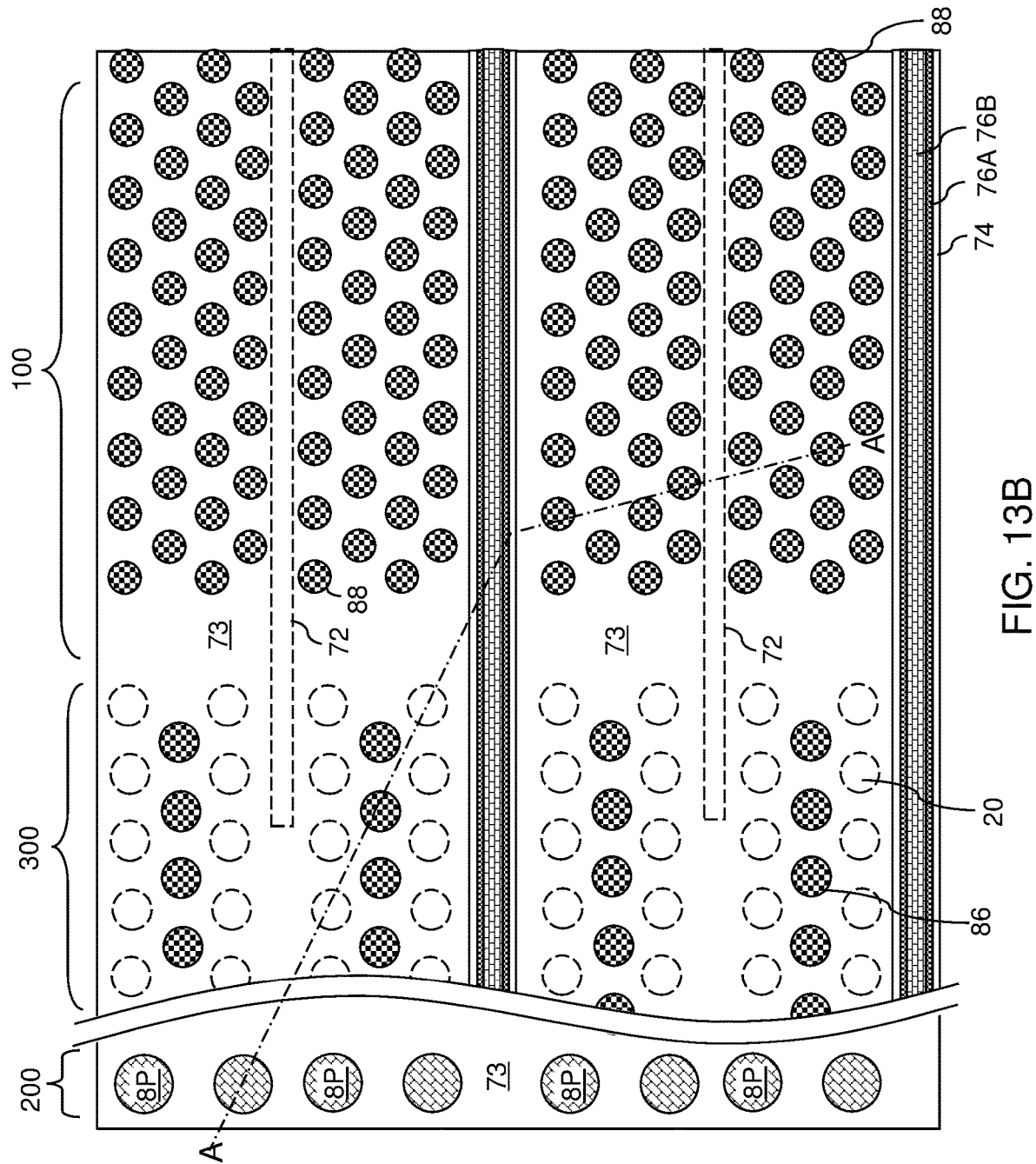
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Figure 14A:
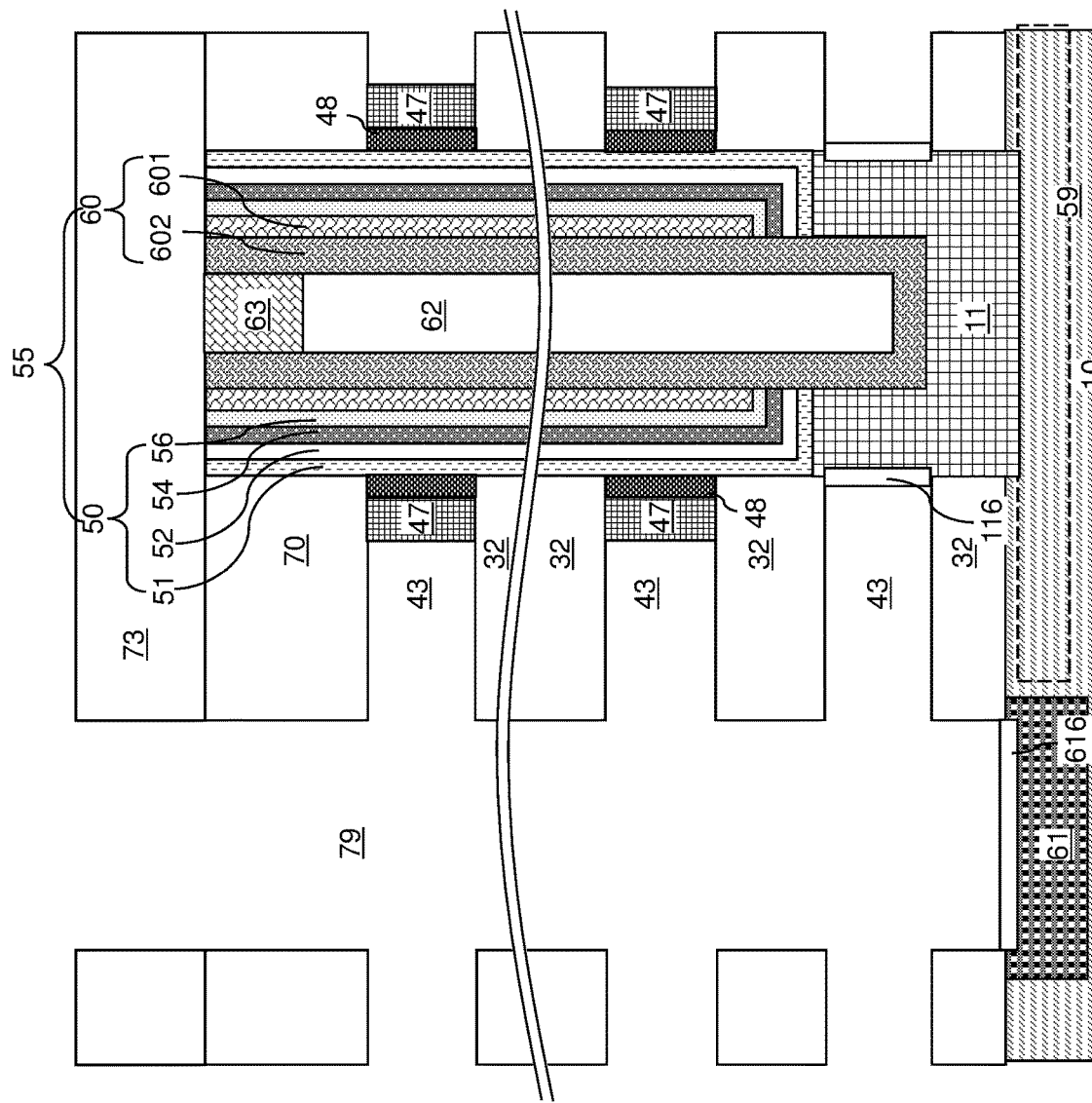
FIGS. 14A-14D are sequential vertical cross-sectional views of a region of a second exemplary structure during formation of second conductive material portions, third conductive material portions, fourth conductive material portions, backside trench fill structures, and contact via structures according to a second embodiment of the present disclosure.

Referring to FIG. 14A, a second exemplary structure according to a second embodiment of the present disclosure can be derived from the first exemplary structure illustrated in FIG. 10A by selectively growing a second conductive material portion 47 from physically exposed surfaces of the first conductive material portions 48. The second conductive material portions 47 include a second conductive material having a second work function that is greater than the first work function, which is the work function of the first conductive material of the first conductive material portions 48. Further, the second conductive material includes a material that can be grown from surfaces of the first conductive material in a selective growth process that does not induce growth of the second conductive material from surfaces of the insulating layers 32. Thus, the second conductive material portions 47 can be formed by a selective conductive material deposition that grows the second conductive material from physically exposed surfaces of the first conductive material portions 48 while suppressing growth of the second conductive material from surfaces of the insulating layers 32.

In an illustrative example, the first conductive material of the first conductive material portions 48 can comprise, and/or can consist essentially of, n-type doped polysilicon or ruthenium, and the second conductive material of the second conductive material portions 47 can include, and/or can consist essentially of, cobalt. In this case, a selective cobalt deposition process may be used to deposit cobalt. The lateral thickness of each second conductive material portion 47, as defined as the lateral distance between an outer sidewall of the second conductive material portion 47 and an inner sidewall of the second conductive material portion 47, can be in a range from 5 nm to 60 nm, such as from 10 nm to 30 nm, although lesser and greater thicknesses can also be employed. In one embodiment, the second conductive material portions 47 can be formed as discrete tubular portions that laterally surround a respective one of the memory opening fill structures 58.

Figure 14B:
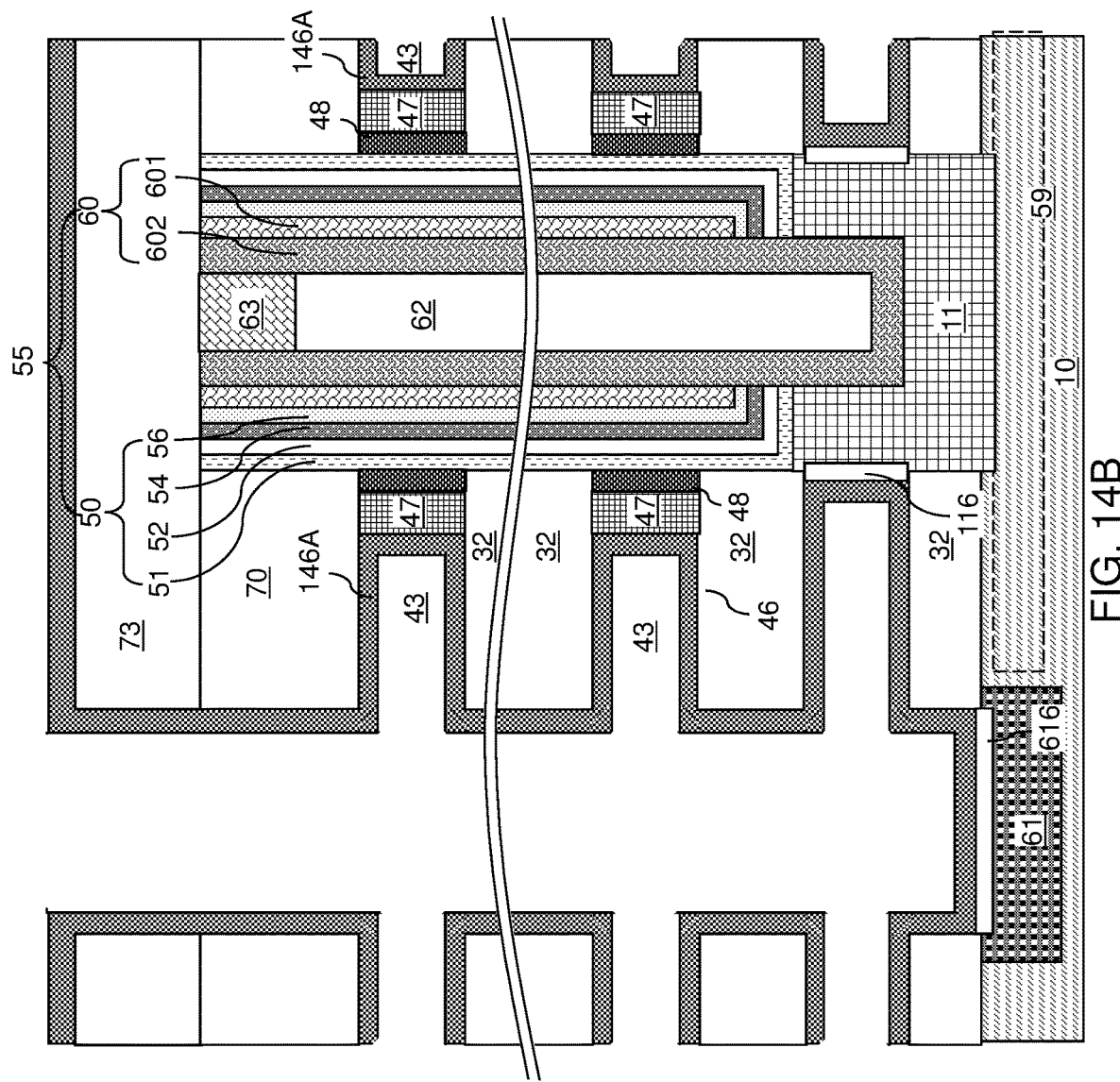

Referring to FIG. 14B, a conductive material liner 146A including a third conductive material can be deposited on the sidewalls of the second conductive material portions 47, on the horizontal surfaces of the insulating layers 32, on the sidewalls of the at least one the backside trench 79, and over the top surface of the contact-level dielectric layer 73. The third conductive material can include conductive metallic nitride material such as TiN, TaN, WN, or a stack thereof and/or a conductive metallic carbide material such as TiC, TaC, WC, or a stack thereof. For example, the third conductive material can include TiN. In one embodiment, the conductive material liner 146A can be deposited by a conformal deposition process such as chemical vapor deposition (CVD) or atomic layer deposition (ALD). The thickness of the conductive material liner 146A can be in a range from 2 nm to 15 nm, such as from 3 nm to 6 nm, although lesser and greater thicknesses can also be employed.

Figure 14C:
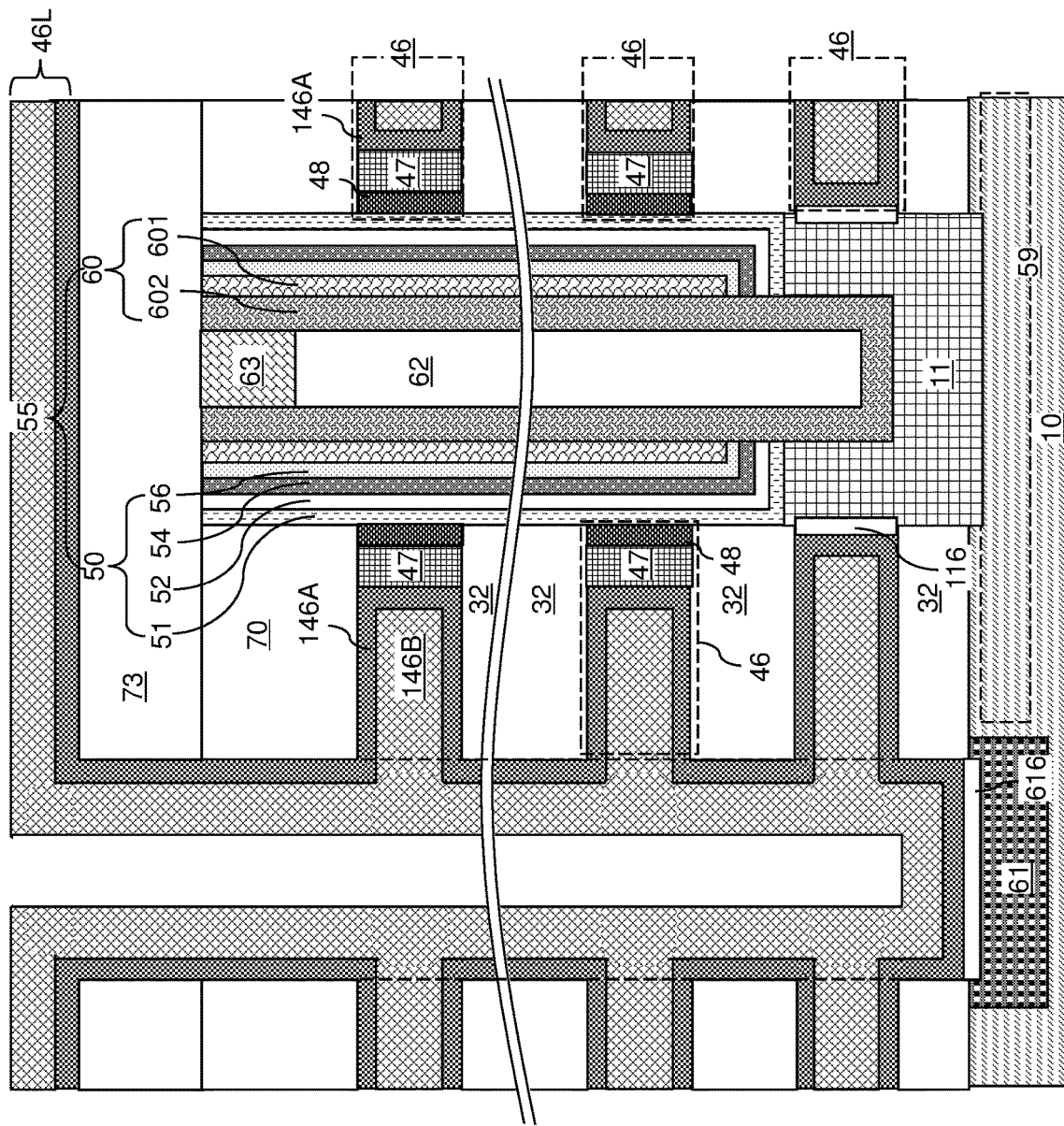

Referring to FIG. 14C, a fourth conductive material is deposited over the conductive material liner 146A to form a conductive fill material layer 146B. The fourth conductive material can be deposited by a conformal deposition method, which can be, for example, chemical vapor deposition (CVD), atomic layer deposition (ALD), electroless plating, electroplating, or a combination thereof. In one embodiment, the conductive fill material layer 146B can consist essentially of at least one elemental metal. The at least one elemental metal of the conductive fill material layer 146B can be selected, for example, from tungsten, cobalt, ruthenium, titanium, or tantalum. In one embodiment, the conductive fill material layer 146B can consist essentially of a single elemental metal. In one embodiment, the conductive fill material layer 146B can be deposited employing a fluorine-containing precursor gas such as $WF_6$. In one embodiment, the conductive fill material layer 146B can be a tungsten layer including a residual level of fluorine atoms as impurities. The conductive fill material layer 146B is spaced from the memory stack structures 55 by a combination of a first conductive material portion 48 having the first work function, a second conductive material portion 47, and a vertically-extending portion of the conductive material liner 146A.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a plurality of first conductive material portions 48 that laterally surround a respective one of the memory opening fill structures 58, a plurality of second conductive material portions 47 laterally surrounding a respective one of the first conductive material portions 48, a portion of the conductive material liner 146A, and a portion of the conductive fill material layer 146B that are located between a vertically neighboring pair of dielectric material layers such as a pair of insulating layers 32. The continuous electrically conductive material layer 46L includes a continuous portion of the conductive material liner 146A and a continuous portion of the conductive fill material layer 146B that are located in the backside trenches 79 or above the contact-level dielectric layer 73. Each sacrificial material layer 42 can be replaced with an electrically conductive layer 46. A backside cavity 79' is present in the portion of each backside trench 79 that is not filled with the continuous electrically conductive material layer 46L.

Generally, at least a second conductive material portion 47 including the second conductive material having the second work function can be formed within each of the backside recesses 43. The second conductive material portion 47 can have a tubular shape and laterally surround a memory opening fill structure 58. Each of the second conductive material portions 47 can be formed on an outer sidewall of a respective one of the first conductive material portions 48.

In one embodiment, the conductive material liner 146A can have a uniform thickness that is less than one half of a height of the backside recesses 43. Fourth conductive material portions (which may comprise portions of the conductive fill material layer 146B) can be formed on the conductive material liner 146A. Each of the electrically conductive layers 46 can comprise a respective one of the fourth conductive material portions (comprising a portion of the conductive fill material layer 146B).

Figure 14D:
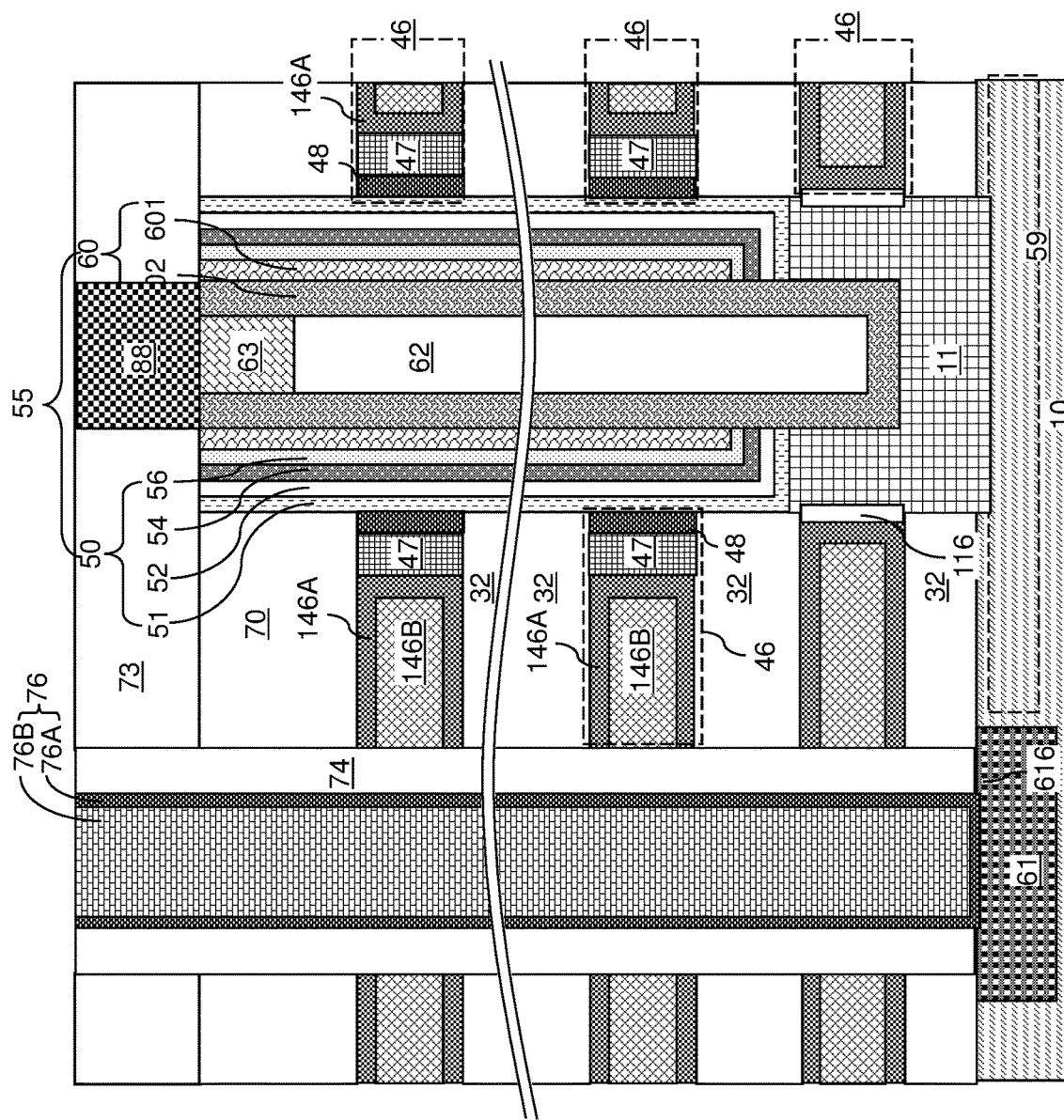

Referring to FIG. 14D, the processing steps of FIGS. 11A-11C, 12, and 13A and 13B can be performed to form an insulating spacer 74 and a backside contact via structure 76 within each backside trench 79, and to form additional contact via structures (88, 86).

Figure 15A:
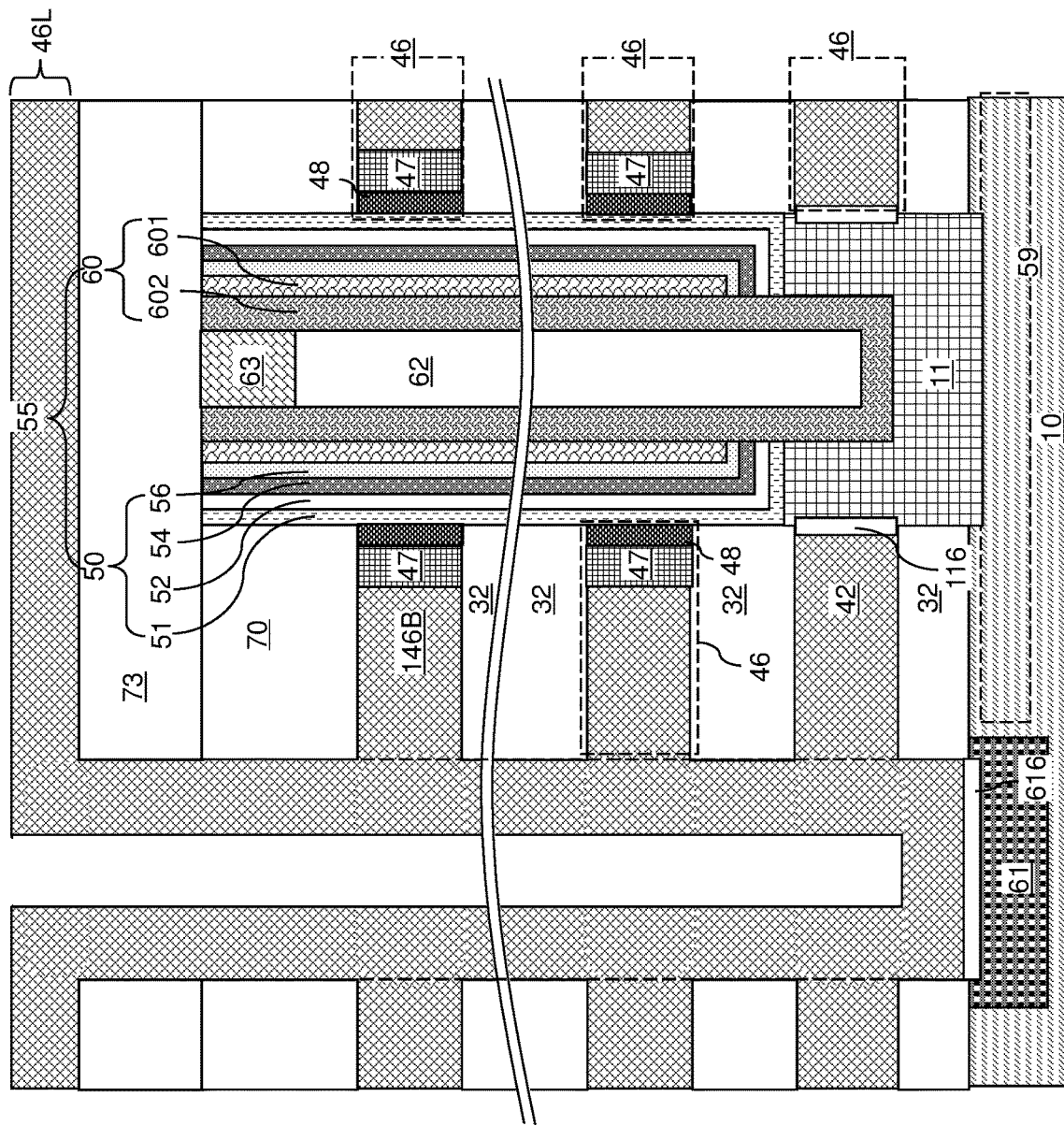
FIGS. 15A and 15B are sequential vertical cross-sectional views of a region of an alternative embodiment of the second exemplary structure during formation of second conductive material portions, third conductive material portions, backside trench fill structures, and contact via structures according to the second embodiment of the present disclosure.

Referring to FIG. 15A, a second alternative embodiment of the second exemplary structure is illustrated. The second alternative embodiment of the second exemplary structure can be derived from the second exemplary structure illustrated in FIG. 14A by performing the processing steps of FIG. 14C without forming the conductive material liner 146A shown in FIG. 14B. In this case, the conductive material of the conductive fill material layer 146B is herein referred to as an additional conductive material or as a third conductive material. The conductive fill material layer 146B can fill the entire volume of each backside recess 43. The conductive material liner 146A is omitted in this alternative embodiment.

Figure 15B:
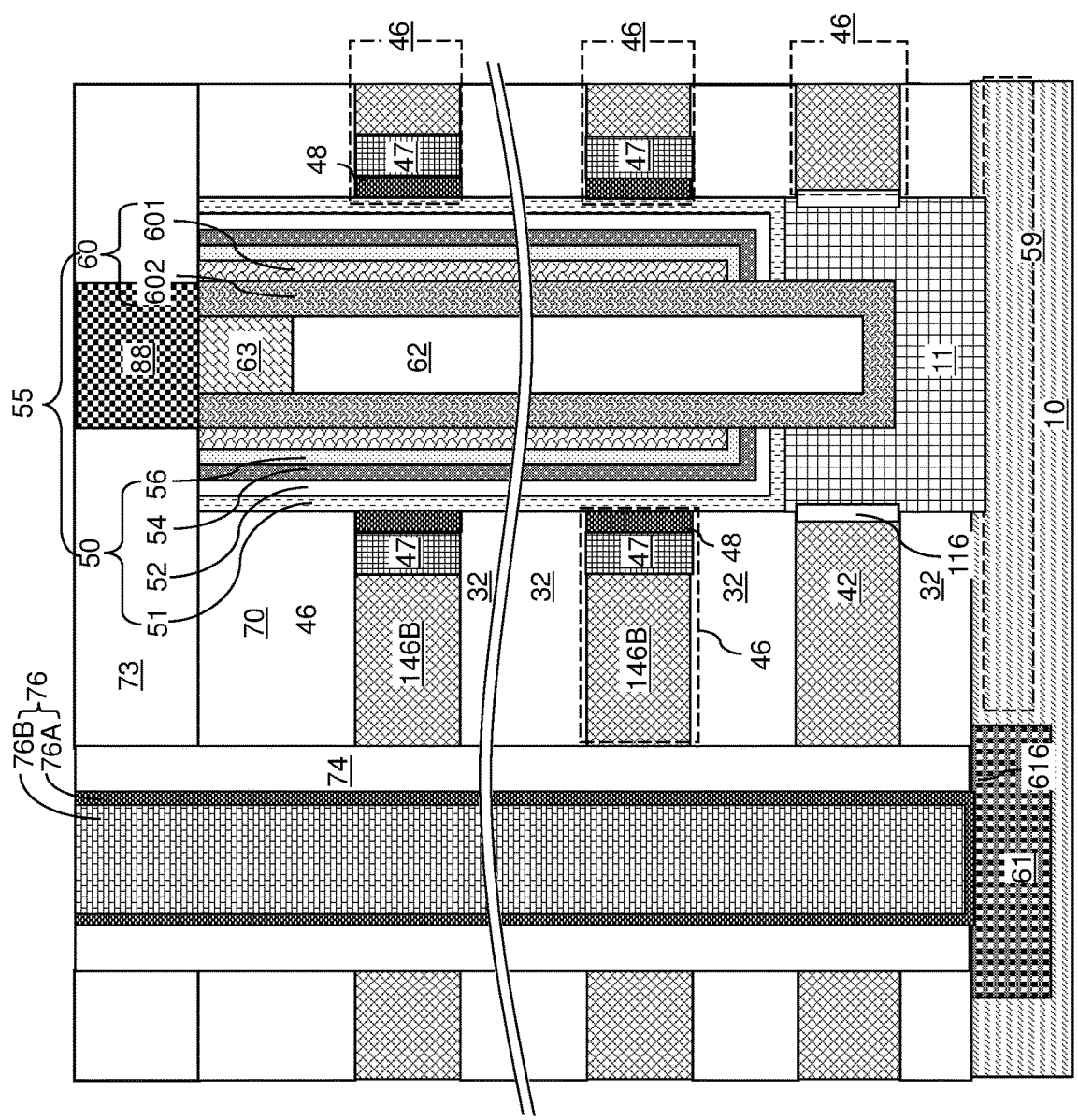

Referring to FIG. 15B, the processing steps of FIGS. 11A-11C, 12, and 13A and 13B can be performed to form an insulating spacer 74 and a backside contact via structure 76 within each backside trench 79, and to form additional contact via structures (88, 86).

The first and second exemplary structures include a three-dimensional memory device which includes an alternating stack of insulating layers 32 and electrically conductive layers 46 located over a substrate (9, 10), memory openings 49 vertically extending through the alternating stack (32, 46), and memory stack structures 55 extending through the alternating stack. Each of the memory stack structures 55 contains a memory film 50 and a vertical semiconductor channel 60. At least one of the electrically conductive layers 46 contains a first conductive material portion 48 having a respective inner sidewall that contacts a respective one of the memory films 50 at a vertical interface, and a second conductive material portion (46A or 47) that has a different composition from the first conductive material portion, and contacting the first electrically conductive material portion 48, a bottom surface of a first one of the insulating layers 32 and a top surface of a second one of the insulating layers 32. The first conductive material portion 48 has a lower work function than the second conductive material portion (46A, 47).

In one embodiment, the second conductive material portion (46A, 47) laterally surrounds the first conductive material portion 48. In one embodiment, the first conductive material portion 48 has a respective upper annular surface that contacts the bottom surface of the first one of the insulating layers 32, and a respective lower annular surface that contacts the top surface of the second one of the insulating layers 32.

In one embodiment, wherein the inner sidewall of the first conductive material portion 48 is vertically coincident with interface between the memory film 50 and the insulating layers 32. In one embodiment, the first conductive material portion 48 has a respective outer cylindrical sidewall that is laterally offset from the respective inner sidewall by a thickness of the first conductive material portion 48. The thickness of the first conductive material portion 48 may be in a range from 0.5 nm to 15 nm.

In one embodiment, the first conductive material portion 48 comprises ruthenium, and the second conductive material portion (46A, 47) comprises a metallic nitride, tungsten, or cobalt, such as titanium nitride. In another embodiment, the first conductive material portion 48 comprises n-type polysilicon, and the second conductive material portion (46A, 47) comprises a metallic nitride, tungsten, or cobalt, such as titanium nitride.

In the first embodiment, the first conductive material portion 48 has a tubular configuration, an entirety of an outer cylindrical sidewall of the first conductive material portion 48 is in contact with an inner sidewall of the second conductive material portion 46A, and the second conductive material portion 46A comprises a tubular portion that laterally surrounds the first conductive material portion, an upper horizontally extending portion adjoined to an upper end of the tubular portion, and a lower horizontally extending portion adjoined to a lower end the tubular portion. Each of the tubular portion, the upper horizontally extending portion, and the lower horizontally extending portion contacts a tungsten portion 46B.

In the second embodiment, the second conductive material portion 47 comprises cobalt. A backside trench fill structure (74, 76) contacts sidewalls of the alternating stack, wherein the second conductive material portion 47 does not contact the backside trench fill structure, and is laterally spaced from the backside trench fill structure by a third conductive material portion (146A and/or 146B) having a composition that is different from the second conductive material portion. The third conductive material portion may comprise at least one of tungsten 146B and/or conductive metallic nitride 146A.

Figure 16:
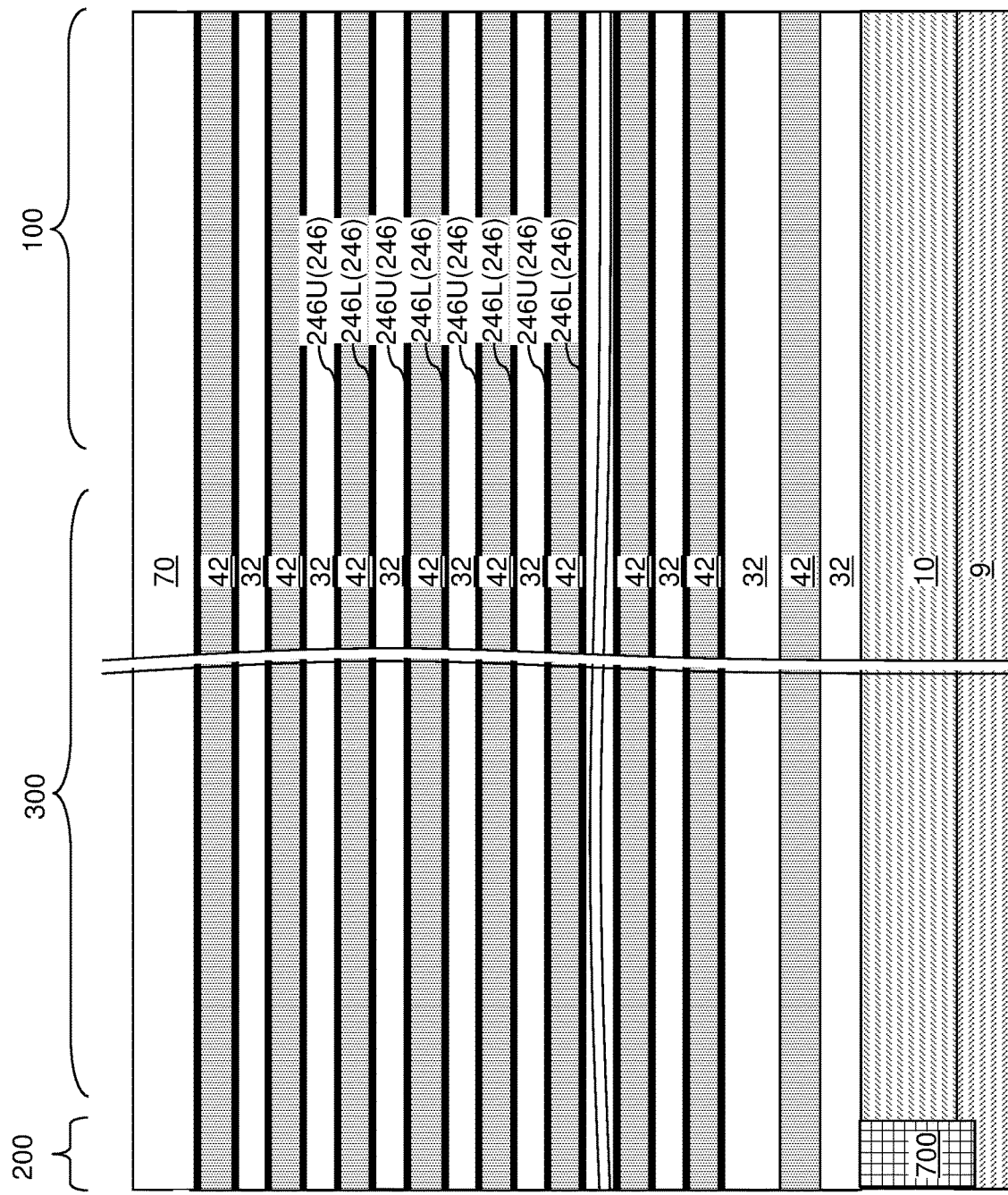
FIG. 16 is a vertical cross-sectional view of a third exemplary structure after formation of a vertical repetition of a unit layer stack including an insulating layer, a lower conductive liner, a sacrificial material layer, and an upper conductive liner over a substrate according to a third embodiment of the present disclosure.

Referring to FIG. 16, a third exemplary structure according to a third embodiment of the present disclosure can be derived from the first exemplary structure of FIG. 1 by forming an insulating layer 32 and a sacrificial material layer 42 over the top surface of the substrate (9, 10), and by forming a vertical repetition of a unit layer stack (32, 246L, 42, 246U) including an insulating layer 32, a lower conductive liner 246L, a sacrificial material layer 42, and an upper conductive liner 246U. The lower conductive liners 246L and the upper conductive liners 246U are collectively referred to as conductive material layers 246. Subsequently, an insulating cap layer 70 can be formed over the vertical repetition of the unit layer stack.

The insulating layers 32 can include the same material and can have the same thickness as in the first embodiment. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32 can include silicon oxide. The thickness of each insulating layer 32 can be in a range from 20 nm to 50 nm, although lesser and greater thicknesses can be employed for each insulating layer 32 and for each sacrificial material layer 42. In one embodiment, each insulating layer 32 can have the same thickness.

The lower conductive liners 246L and the upper conductive liners 246U can include a same conductive material. According to an aspect of an embodiment of the present disclosure, at least two conductive materials having different work functions are employed for electrically conductive layers to be subsequently formed. The two conductive materials include a first conductive material having a first work function and a second conductive material having a second work function that is higher than the first work function. The conductive material employed for the lower conductive liners 246L and the upper conductive liners 246U include the second conductive material having the second work function, i.e., the higher work function of the two work functions of the first conductive material and the second conductive material.

The lower conductive liners 246L and the upper conductive liners 246U can include a metallic material or a heavily doped semiconductor material. In a first illustrative example, the lower conductive liners 246L and the upper conductive liners 246U can include a p-type doped semiconductor material such as p-type doped amorphous silicon (that can be subsequently annealed into p-type doped polysilicon), or p-type doped polysilicon. The thickness of each of the lower conductive liners 246L and the upper conductive liners 246U can be in a range from 0.5 nm to 15 nm, such as from 1 nm to 10 nm and/or 2 nm to 5 nm.

The sacrificial material layers 42 include a material that can be removed selective to the insulating layers 32, the lower conductive liners 246L, and the upper conductive liners 246U. A non-limiting example of the sacrificial material that can be employed for the sacrificial material layers 42 includes silicon nitride. The thickness of each sacrificial material layer 42 can be in a range from 10 nm to 50 nm, such as from 15 nm to 40 nm, although lesser and greater thicknesses can also be employed.

In one embodiment, the insulating layers 32 can include silicon oxide, and sacrificial material layers can include silicon nitride. The insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The sacrificial material layers 42 can be formed, for example, CVD or atomic layer deposition (ALD). The lower conductive liners 246L and the upper conductive liners 246U can be formed by CVD or ALD.

The number of repetitions of the unit layer stack (32, 246L, 42, 246U) can be in a range from 2 to 1,024, and typically from 8 to 256, although a greater number of repetitions can also be employed. In one embodiment, each layer within the unit layer stack (32, 246L, 42, 246U) can have a uniform thickness throughout.

Figure 17:
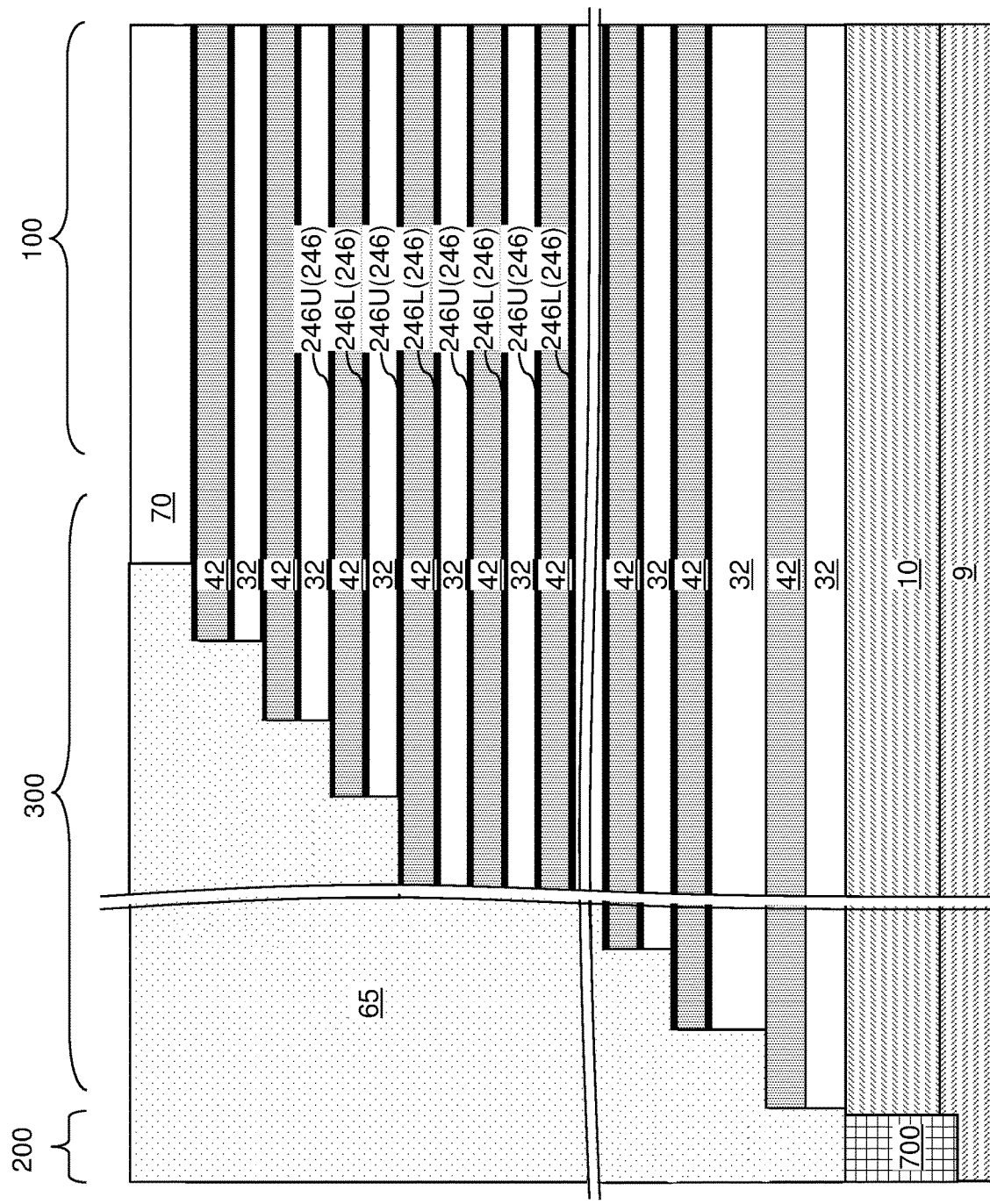
FIG. 17 is a vertical cross-sectional view of the third exemplary structure after formation of stepped surfaces and a retro-stepped dielectric material portion according to the third embodiment of the present disclosure.

Referring to FIG. 17, the vertical repetition of the unit layer stack (32, 246L, 42, 246U) can be patterned in the staircase region 300 to form stepped surfaces. For example, the processing steps of FIG. 3 can be performed with modifications to the etch chemistry to form a stepped cavity. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. The stepped surfaces thereby formed can include, for example, physically exposed portions of top surfaces of the upper conductive liners 246U and sidewalls of the insulating layers 32, the lower conductive liners 246L, and the sacrificial material layers 42. A retro-stepped dielectric material portion 65 can be formed over the stepped surfaces of the vertical repetition of the unit layer stack (32, 246L, 42, 246L).

Figure 18A:
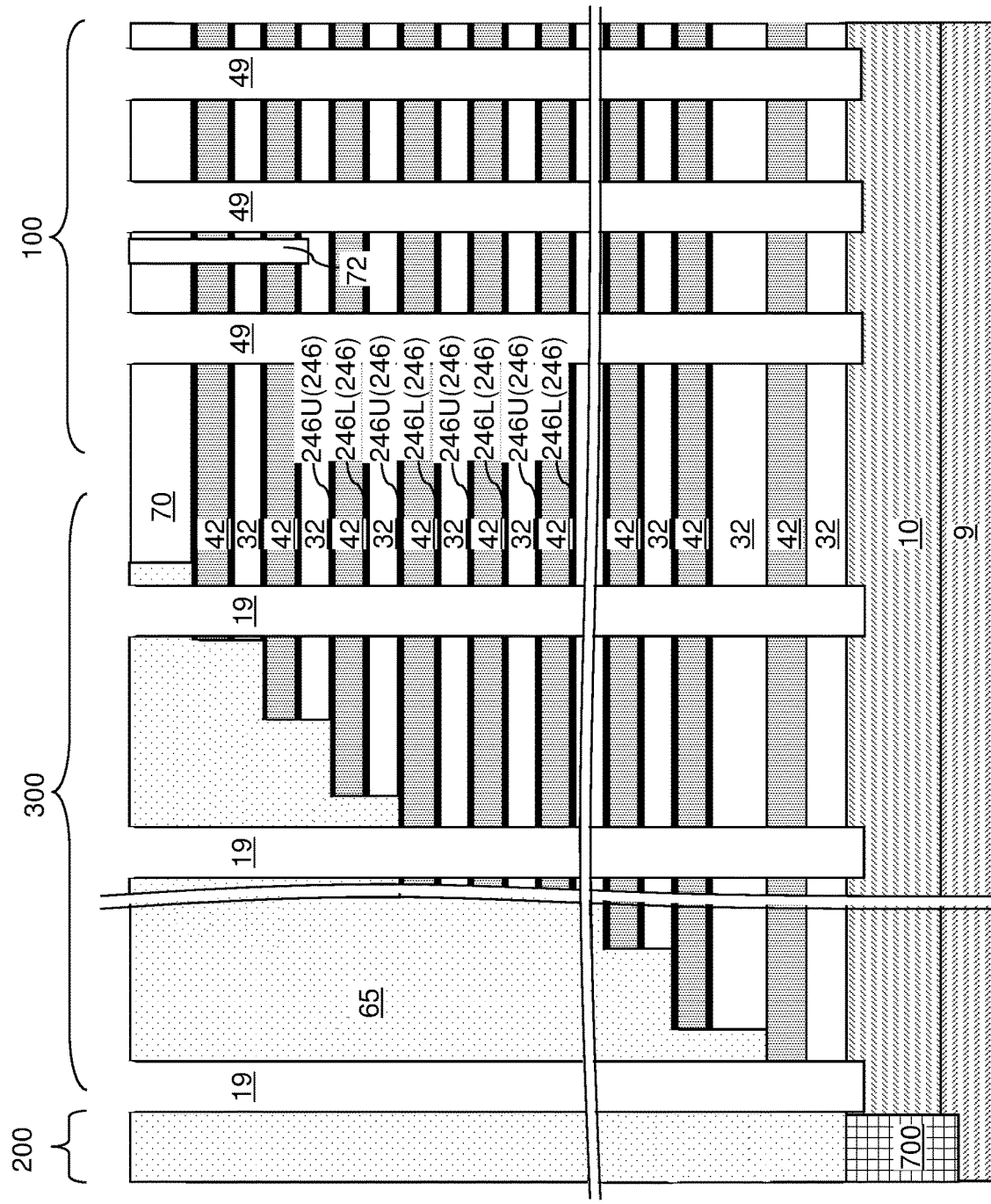
FIG. 18A is a vertical cross-sectional view of the third exemplary structure after formation of memory openings and support openings according to the third embodiment of the present disclosure.
Figure 18B:
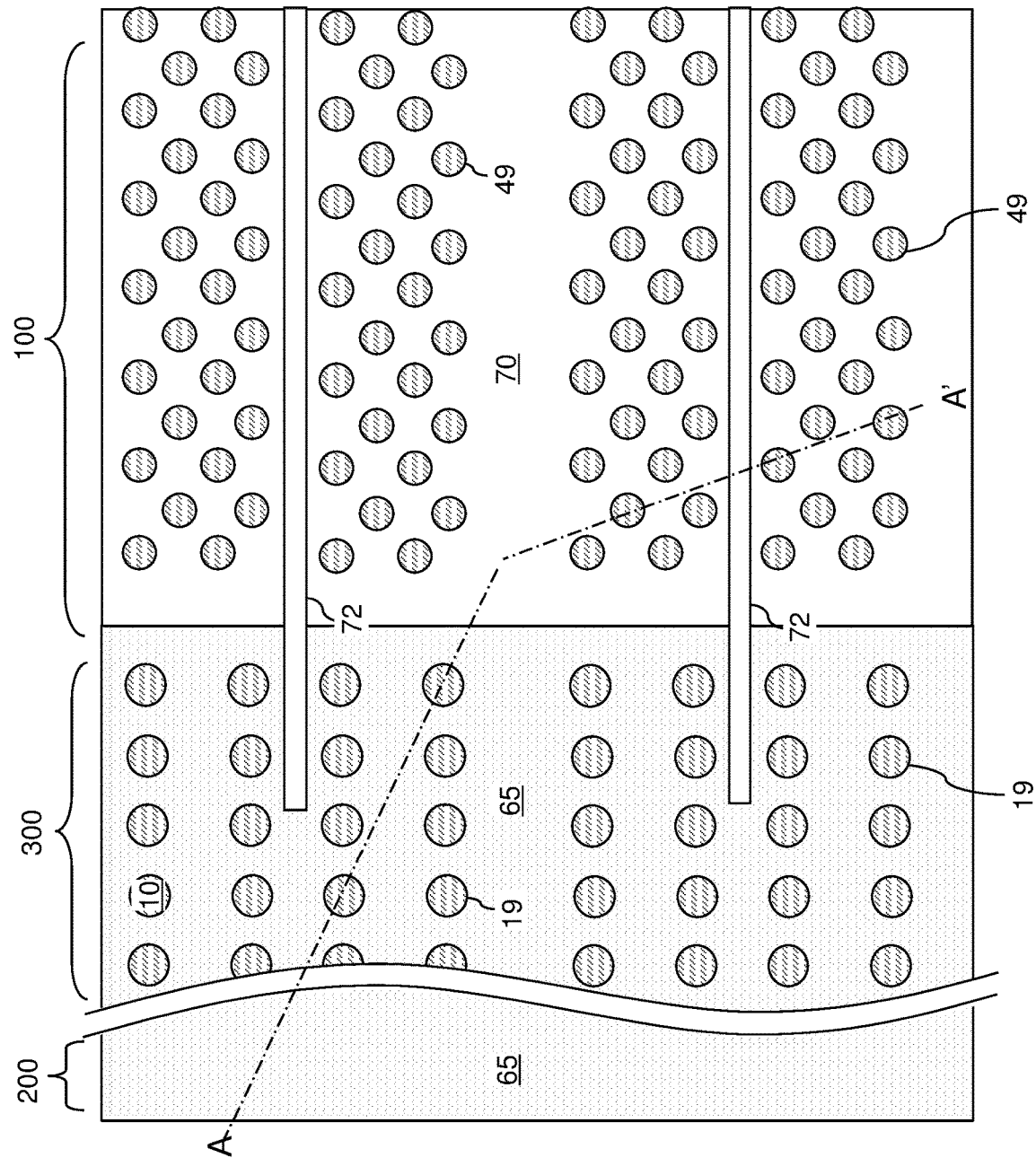
FIG. 18B is a top-down view of the third exemplary structure of FIG. 18A.

Referring to FIGS. 18A and 18B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the vertical repetition of the unit layer stack (32, 246L, 42, 246U) by at least one anisotropic etch that employs the patterned lithographic material stack as an etch mask. Portions of the vertical repetition of the unit layer stack (32, 246L, 42, 246U) underlying the openings in the patterned lithographic material stack are etched to form memory openings 49 and support openings 19. The memory openings 49 are formed through the insulating cap layer 70 and the entirety of the vertical repetition of the unit layer stack (32, 246L, 42, 246U) in the memory array region 100. The support openings 19 are formed through the retro-stepped dielectric material portion 65 and the portion of the vertical repetition of the unit layer stack (32, 246L, 42, 246U) that underlie the stepped surfaces in the staircase region 300.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The pattern of the memory openings 49 and the pattern of the support openings 19 may be the same as in the first exemplary structure.

FIGS. 19A-19H illustrate structural changes in a memory opening 49, which is one of the memory openings 49 in the third exemplary structure of FIGS. 18A and 18B. The same structural change occurs simultaneously in each of the other memory openings 49 and in each of the support openings 19.

Referring to FIG. 19A, a memory opening 49 in the third exemplary device structure of FIGS. 18A and 18B is illustrated. The memory opening 49 extends through the insulating cap layer 70, the vertical repetition of the unit layer stack (32, 246L, 42, 246U), and optionally into an upper portion of the semiconductor material layer 10. At this processing step, each support opening 19 can extend through the retro-stepped dielectric material portion 65, a subset of layers in the vertical repetition of the unit layer stack (32, 246L, 42, 246U), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 19B, an optional pedestal channel portion 11 (e.g., an epitaxial pedestal) 11 can be formed at the bottom portion of each memory opening 49 and each support openings 19, for example, by selective epitaxy. The processing steps of FIG. 5B may be employed to form the pedestal channel portions 11. In some embodiments, the pedestal channel portions 11 may be omitted.

Referring to FIG. 19C, a stack of layers including a blocking dielectric layer 52, a charge storage layer 54, a tunneling dielectric layer 56, and an optional first semiconductor channel layer 601 can be sequentially deposited in the memory openings 49 over each vertical stack of first conductive material portions 48. The processing steps of FIG. 5E may be employed to form the stack of layers.

Referring to FIG. 19D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls. Generally, each of the memory films 50 can be formed by sequentially depositing a blocking dielectric layer 52, a charge storage layer 54, and a tunneling dielectric layer 56, and by removing portions of the blocking dielectric layer 52, the charge storage layer 54, and the tunneling dielectric layer 56 from outside the memory openings 49.

Referring to FIG. 19E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 19F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 19G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 19H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 20:
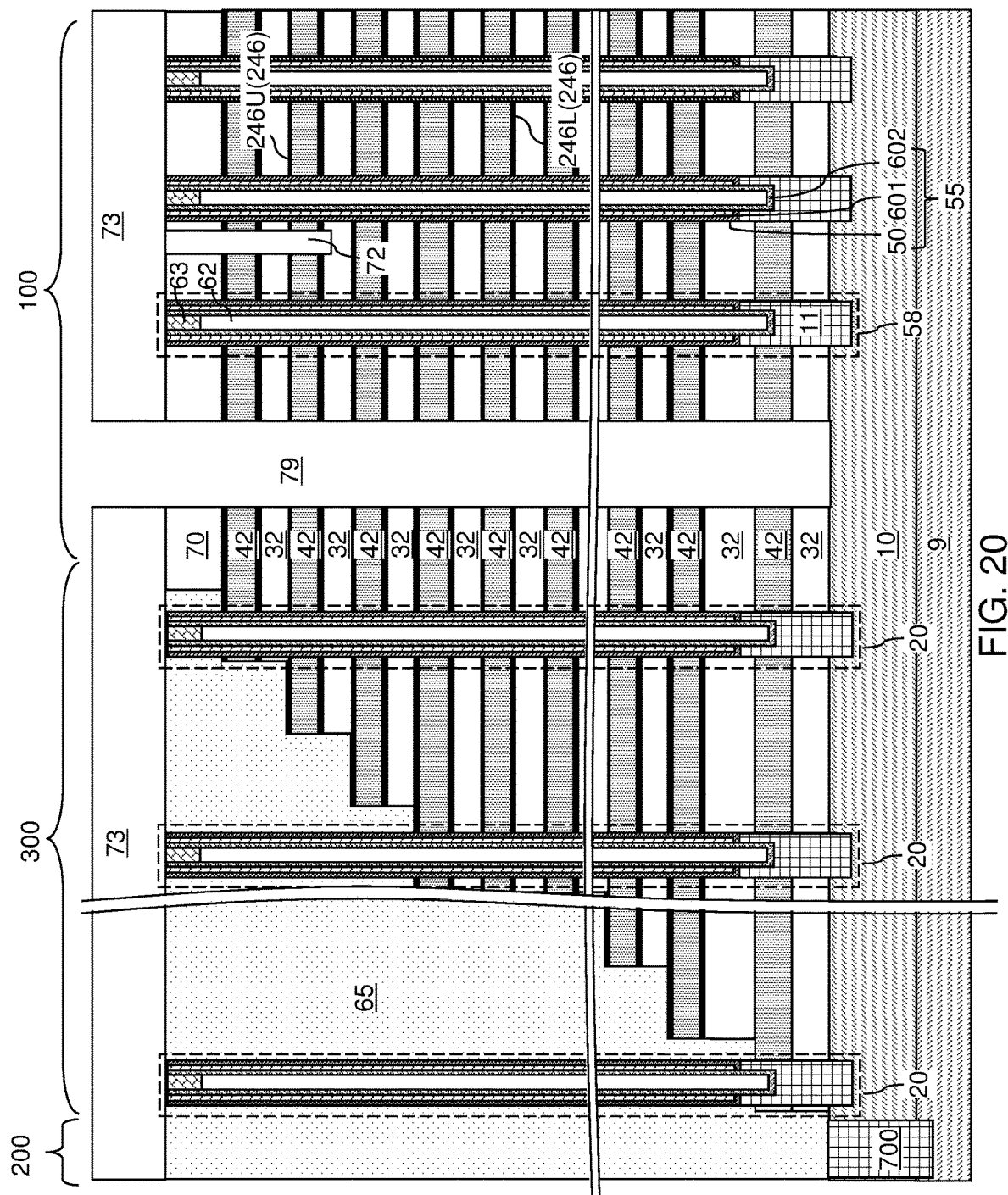
FIG. 20 is a vertical cross-sectional view of a third exemplary structure after formation of a contact-level dielectric layer and backside trenches according to the third embodiment of the present disclosure.

Referring to FIG. 20, the processing steps of FIGS. 7A-7C can be performed with a suitable modification to the chemistry of the anisotropic etch process to form a contact-level dielectric layer 73 and backside trenches 79. The backside trenches 79 are formed through the vertical repetition of the unit layer stack (32, 246L, 42, 246U).

Figure 21A:
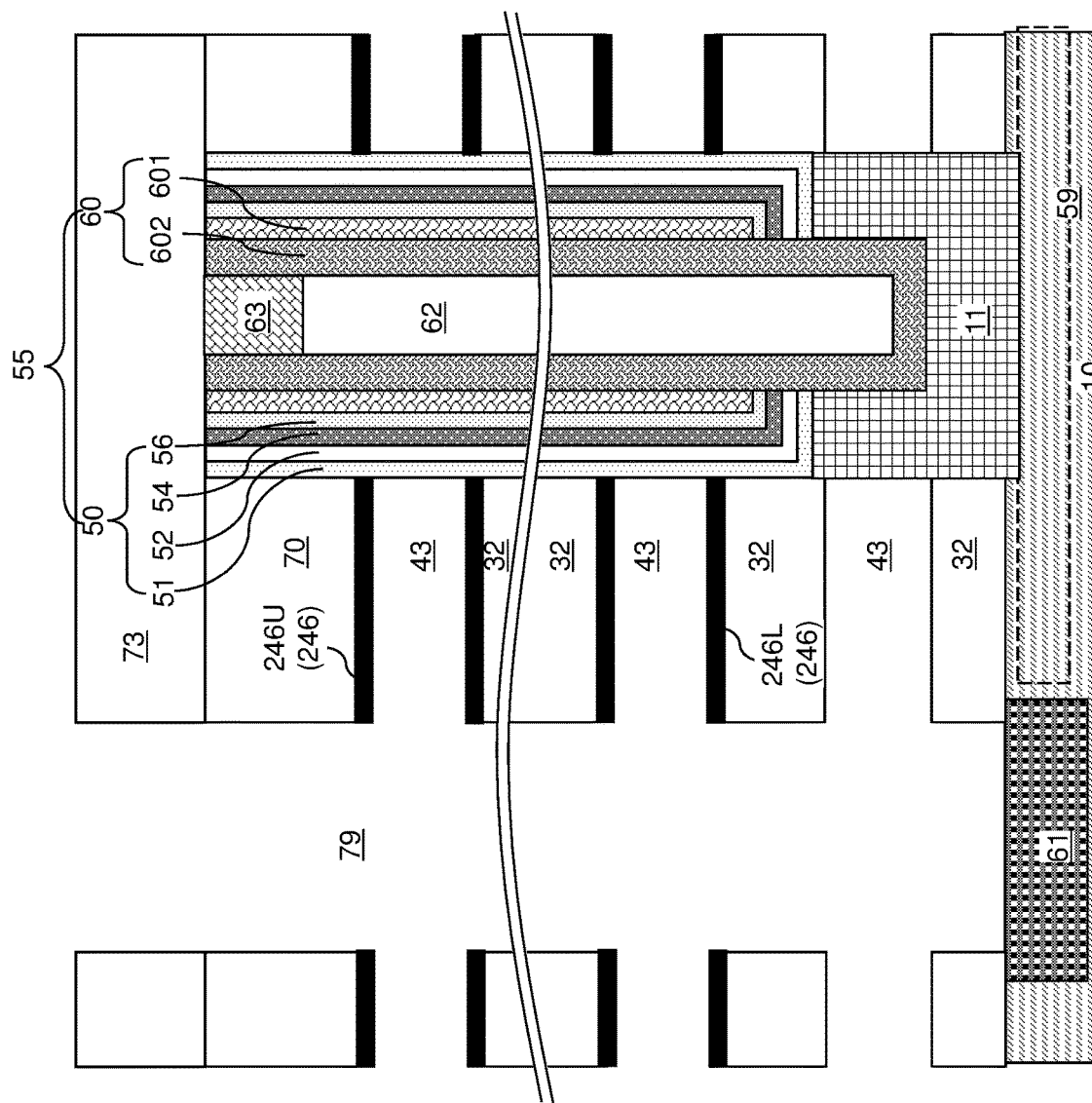
FIGS. 21A-21E are sequential vertical cross-sectional views of a region of the third exemplary structure during formation of first conductive material portions, and third conductive material portions according to the third embodiment of the present disclosure.

Referring to FIG. 21A, the processing steps of FIG. 8 can be performed to form source regions 61. An isotropic etch process can be performed to remove the sacrificial material layers 42 selective to the insulating layers 32, the lower conductive liners 246L, and the upper conductive liners 246U. For example, an isotropic etchant that etches the sacrificial material layers 42 selective to the insulating layers 32, the lower conductive liners 246L, and the upper conductive liners 246U can be introduced into the backside trenches to isotropically etch the sacrificial material layers 42. The isotropic etch process can be selective to the material of the outermost layer of the memory opening fill structures 58 such as the blocking dielectric layers 52. In an illustrative example, if the insulating layers 32 include silicon oxide and if the sacrificial material layers 42 include silicon nitride, a wet etch process employing hot phosphoric acid can be performed to remove the sacrificial material layers 42.

Figure 21B:
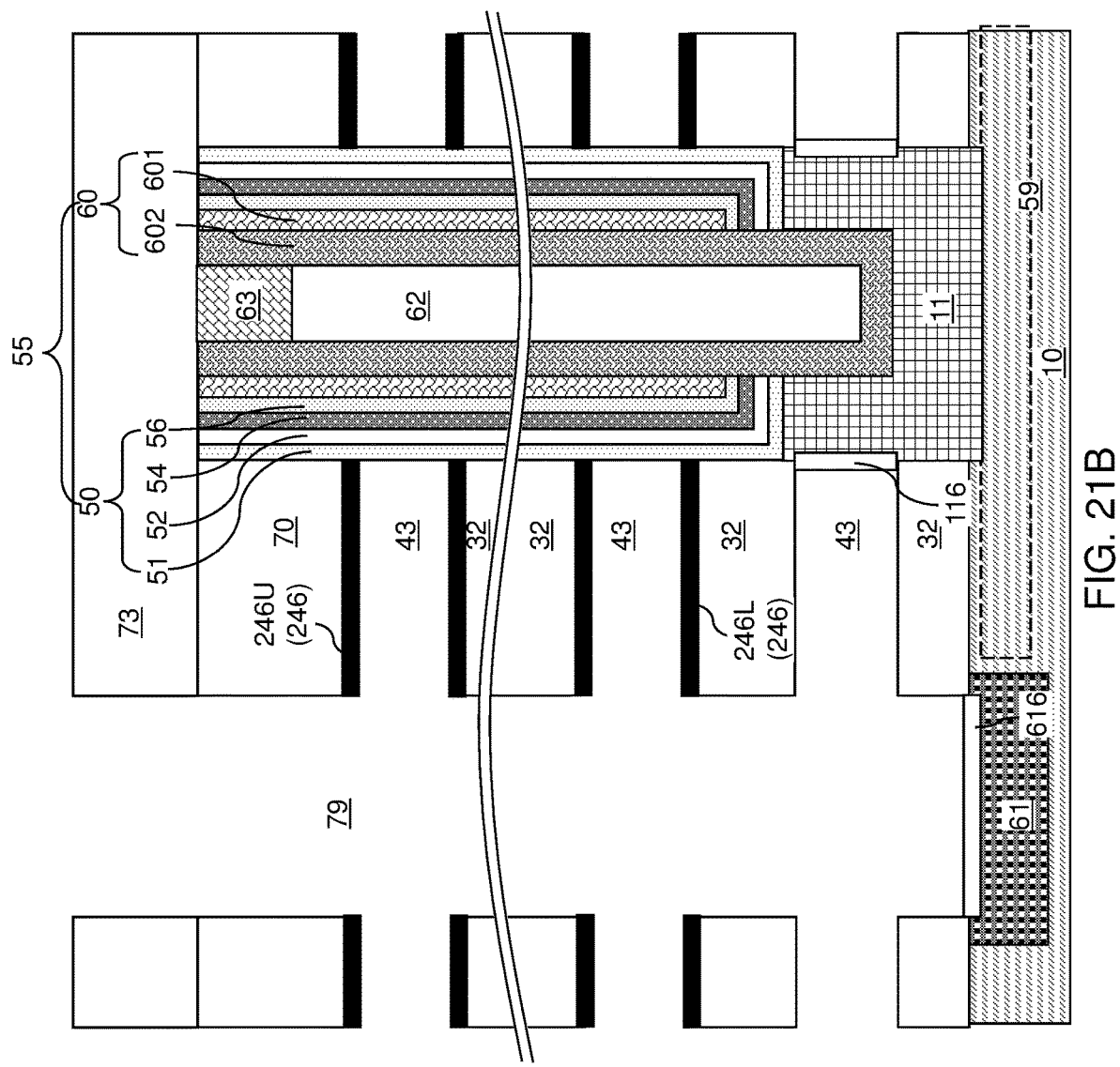

Referring to FIG. 21B, the processing steps of FIG. 10A can be optionally performed to optionally form tubular dielectric spacers 116 and planar dielectric portions 616.

Figure 21C:
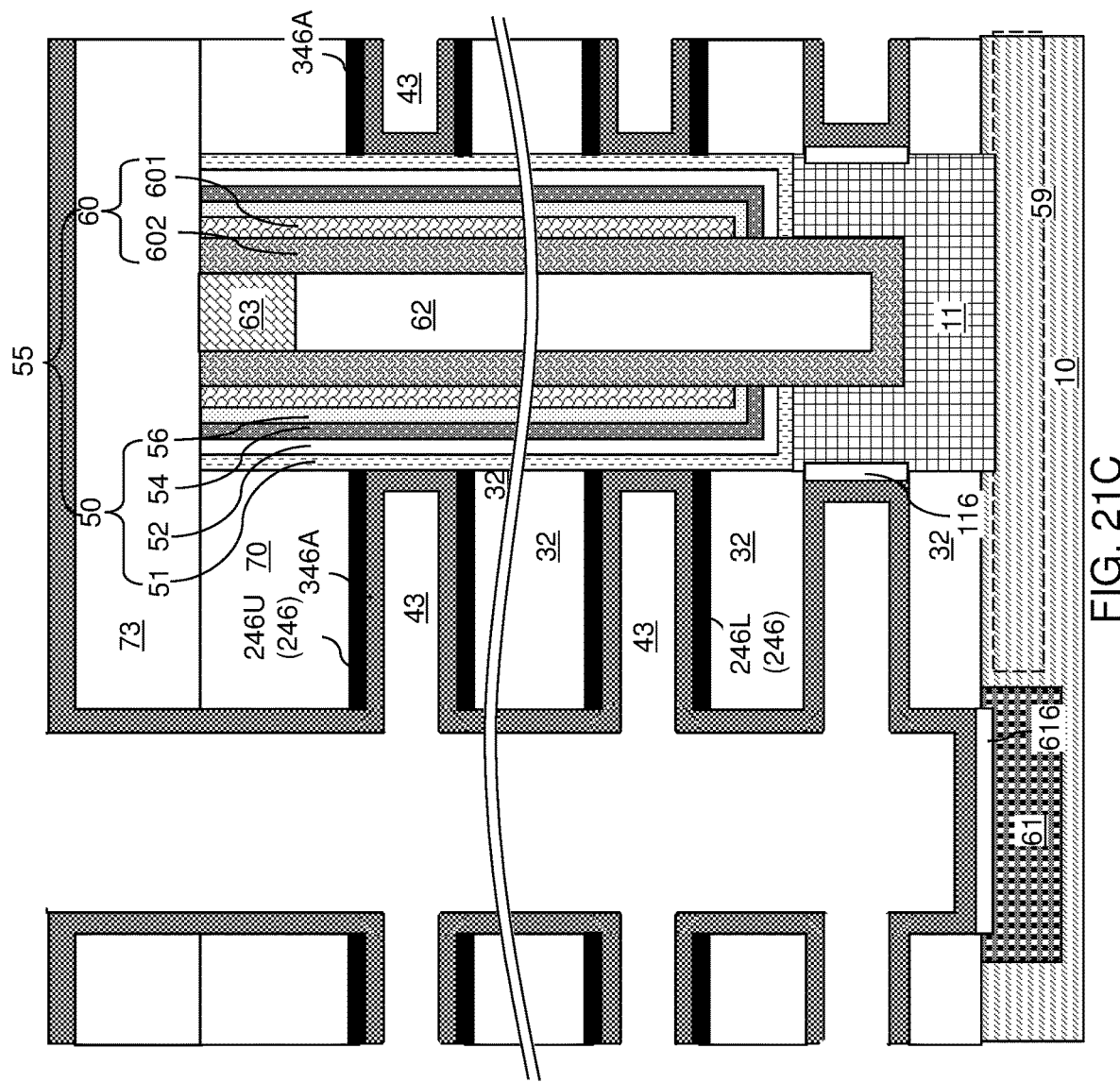

Referring to FIG. 21C, at least a conductive material layer 346A can be deposited within each of the backside recesses 43. According to an aspect of an embodiment of the present disclosure, the conductive material layer 346A includes a conductive material having a work function that is lower than the work function of the lower conductive liners 246L and the upper conductive liners 246U. The conductive material of the conductive material layer 346A is hereafter referred to as a first conductive material having a first conductive material composition, and the conductive material of the lower conductive liners 246L and the upper conductive liners 246U is herein referred to as a second conductive material having a second conductive material composition. In one embodiment, the first conductive material of the conductive material layer 346A can comprise, and/or can consist essentially of, TiN, TaN, or WN. In one embodiment, the first conductive material of the conductive material layer 346A can comprise, and/or can consist essentially of, TiN.

Thus, the conductive material layers 346A have a first conductive material composition, and the lower conductive liners 246L and the upper conductive liners 246U have a second conductive material composition that is different from the first conductive material composition. According to an aspect of an embodiment of the present disclosure, the first conductive material composition has a lower work function than the second conductive material composition. In one embodiment, the first conductive material composition comprises TiN, TaN, or WN, and the second conductive material composition comprises a p-type doped semiconductor material. The conductive material layer 346A comprises first conductive material portions that are formed within a respective one of the backside recesses 43.

Figure 21D:
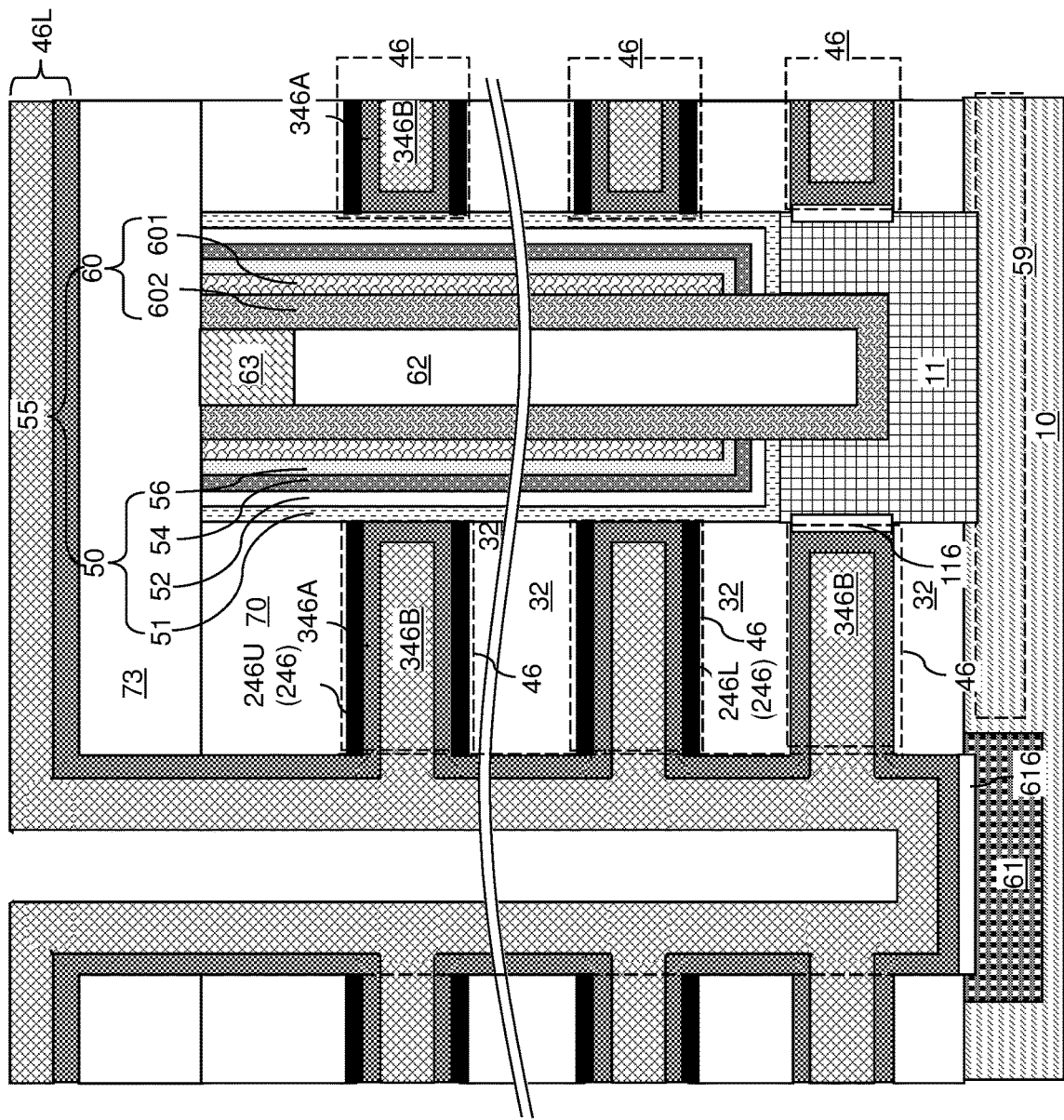

Referring to FIG. 21D, a third conductive material is deposited over the conductive material layer 346A to form a conductive fill material layer 346B. The third conductive material can be deposited by a conformal deposition method, which can be, for example, chemical vapor deposition (CVD), atomic layer deposition (ALD), electroless plating, electroplating, or a combination thereof. In one embodiment, the conductive fill material layer 346B can consist essentially of at least one elemental metal. The at least one elemental metal of the conductive fill material layer 346B can be selected, for example, from tungsten, cobalt, titanium, or tantalum. In one embodiment, the conductive fill material layer 346B can consist essentially of a single elemental metal. In one embodiment, the conductive fill material layer 346B can be deposited employing a fluorine-containing precursor gas such as $WF_6$. In one embodiment, the conductive fill material layer 346B can be a tungsten layer including a residual level of fluorine atoms as impurities. The conductive fill material layer 346B is spaced from the memory stack structures 55 by the first conductive material portion comprising a tubular portion of the conductive material layer 346A. As discussed above, the first conductive material has the first work function that is lower than the second work function of the second conductive material of the lower conductive liners 246L and the upper conductive liners 246U.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a continuous first conductive material portion (comprising a conductive material layer 346A) including tubular portions that laterally surround a respective vertical semiconductor channel 60, second conductive material portions (comprising a lower conductive liner 246L and an upper conductive liner 246U) laterally surrounding each of the memory opening fill structures 58, and a conductive fill material layer 346B that is embedded in the first conductive material portion (comprising the conductive material layer 346A). The continuous electrically conductive material layer 46L includes a continuous portion of the conductive material layer 346A and a continuous portion of the conductive fill material layer 346B that are located in the backside trenches 79 or above the contact-level dielectric layer 73. Each sacrificial material layer 42 can be replaced with an electrically conductive layer 46. A backside cavity 79' is present in the portion of each backside trench 79 that is not filled with the continuous electrically conductive material layer 46L.

Figure 21E:
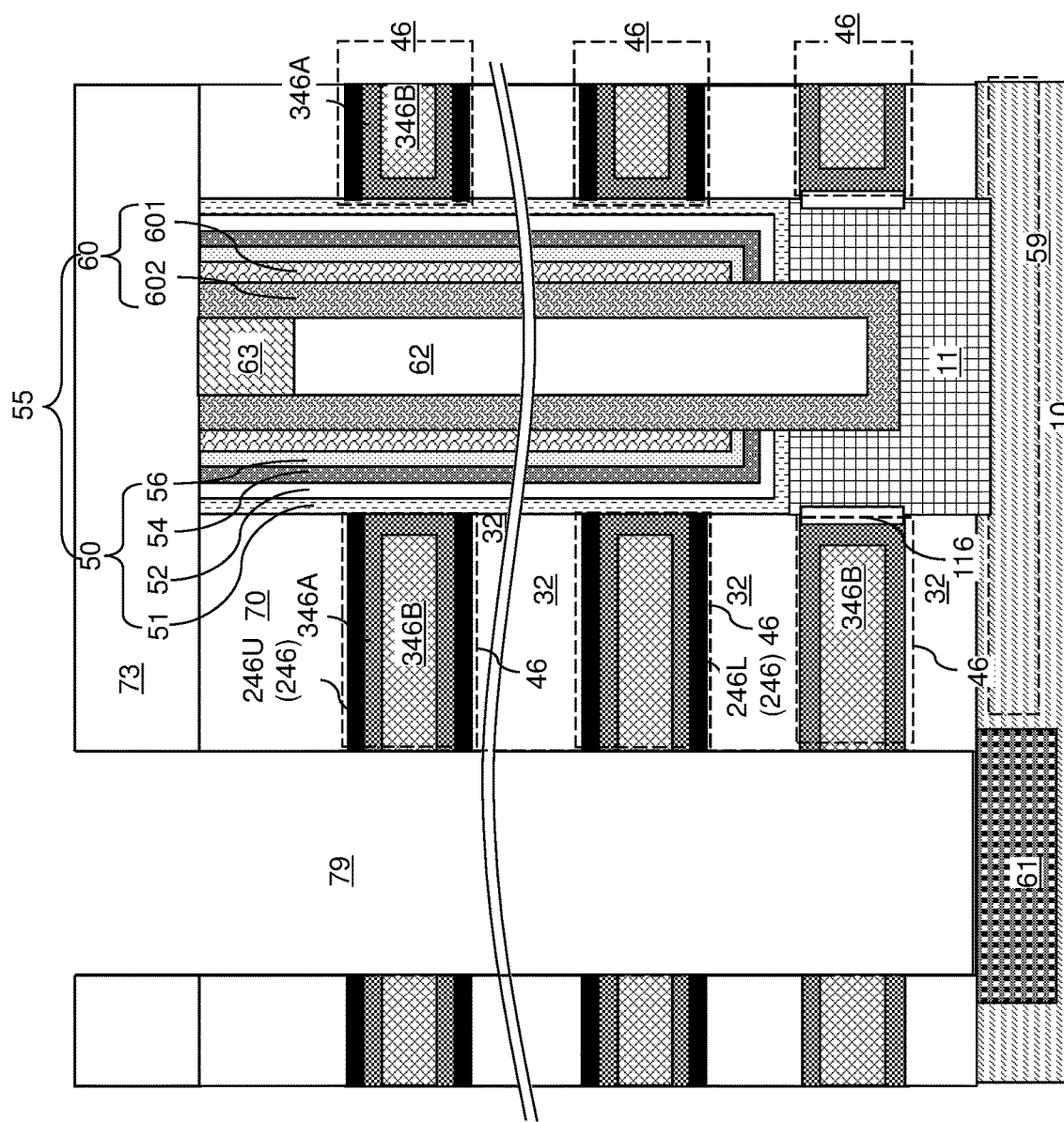

Referring to FIG. 21E, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Any planar dielectric portion 616 can be collaterally removed during the etch process. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. The electrically conductive layers 46 are formed between vertically neighboring pairs of the insulating layers 32. Each of the electrically conductive layers 46 comprise a respective one of the lower conductive liners 246L, a respective one of the conductive material layers 346A, a respective one of the upper conductive liners 246U, and a respective one of the conductive fill material layers 346B.

Figure 22A:
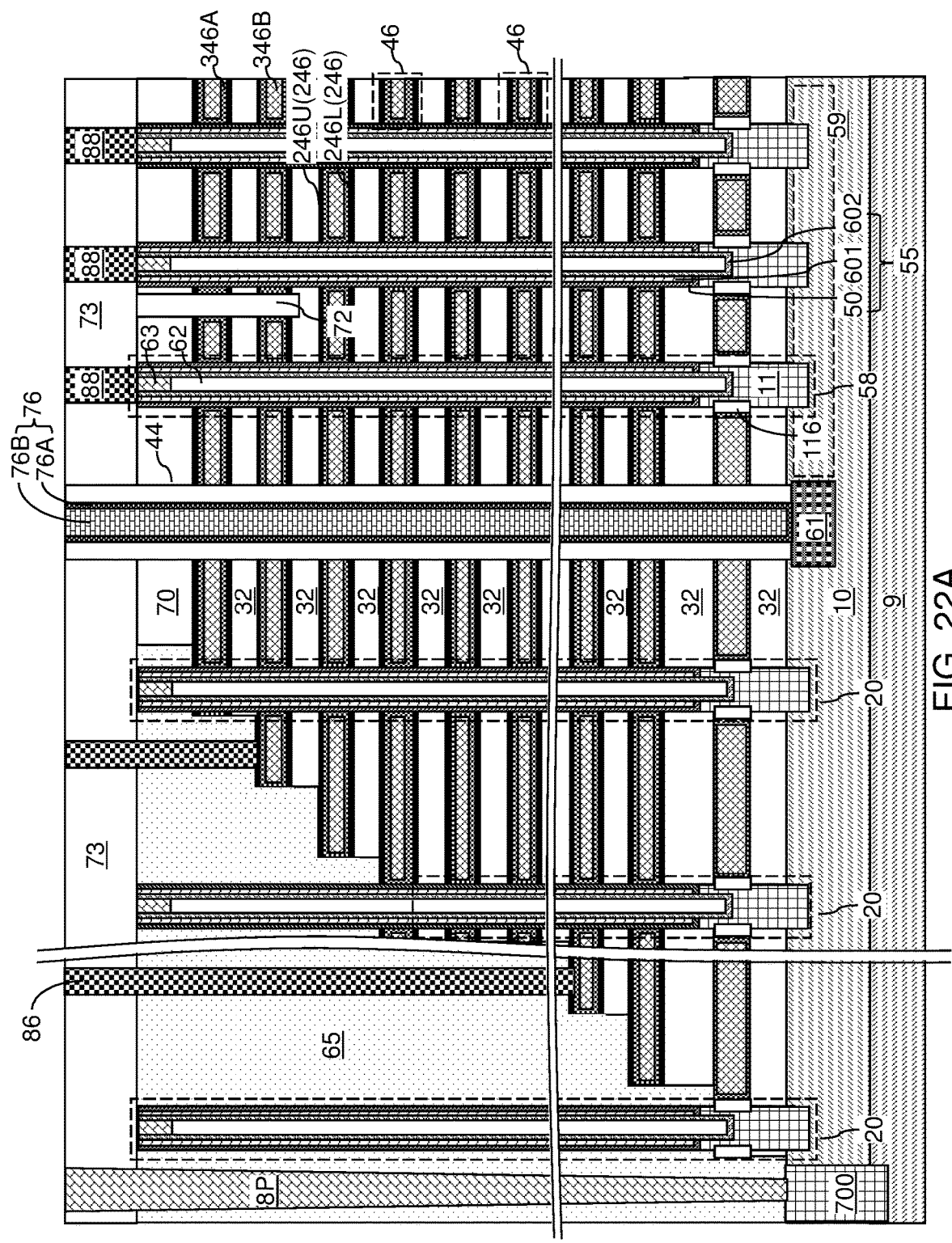
FIG. 22A is a vertical cross-sectional view of the third exemplary structure during formation of backside trench fill structures and contact via structures according to the third embodiment of the present disclosure.
Figure 22B:
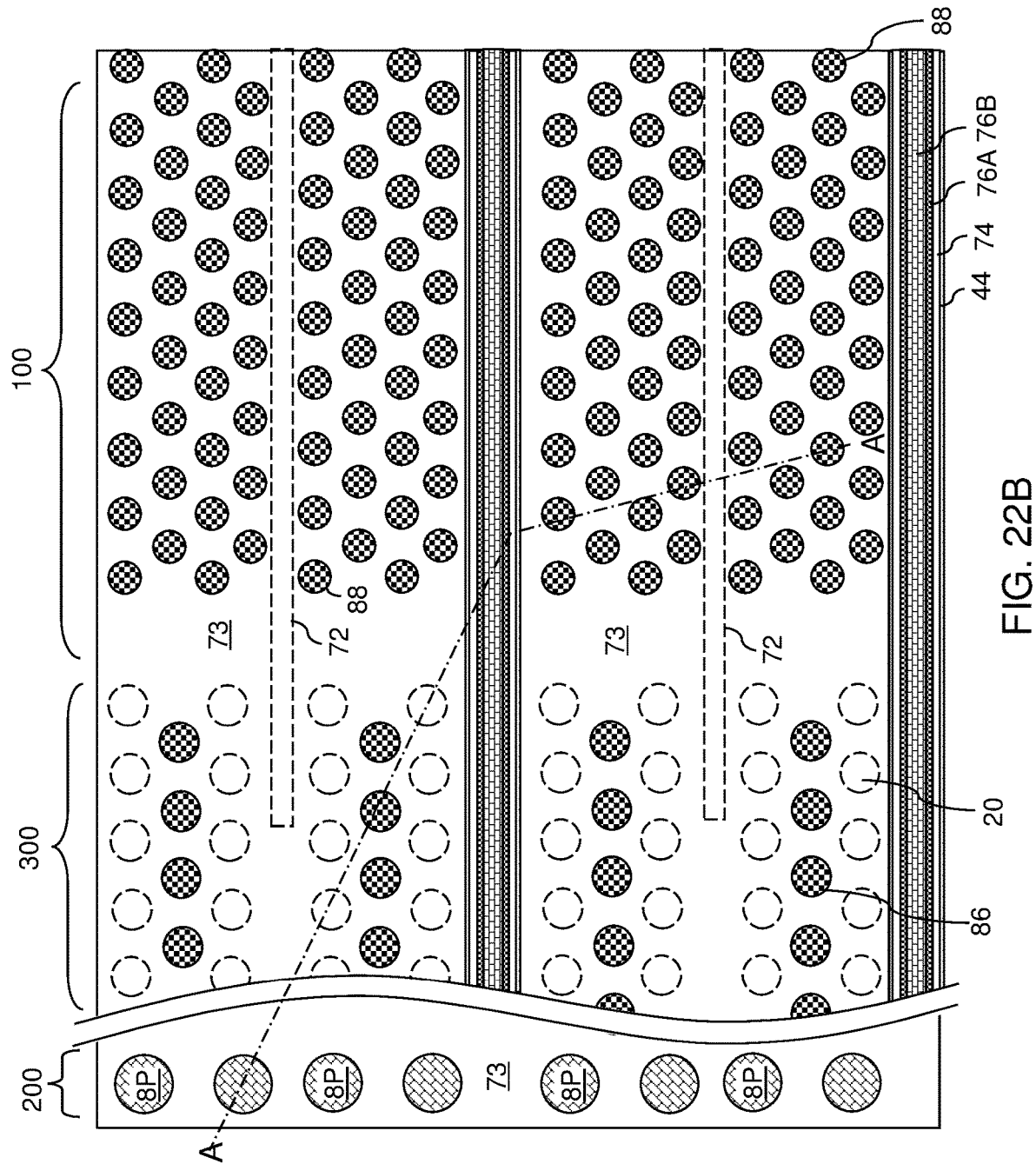
FIG. 22B is a top-down view of the third exemplary structure of FIG. 22A.
Figure 22C:
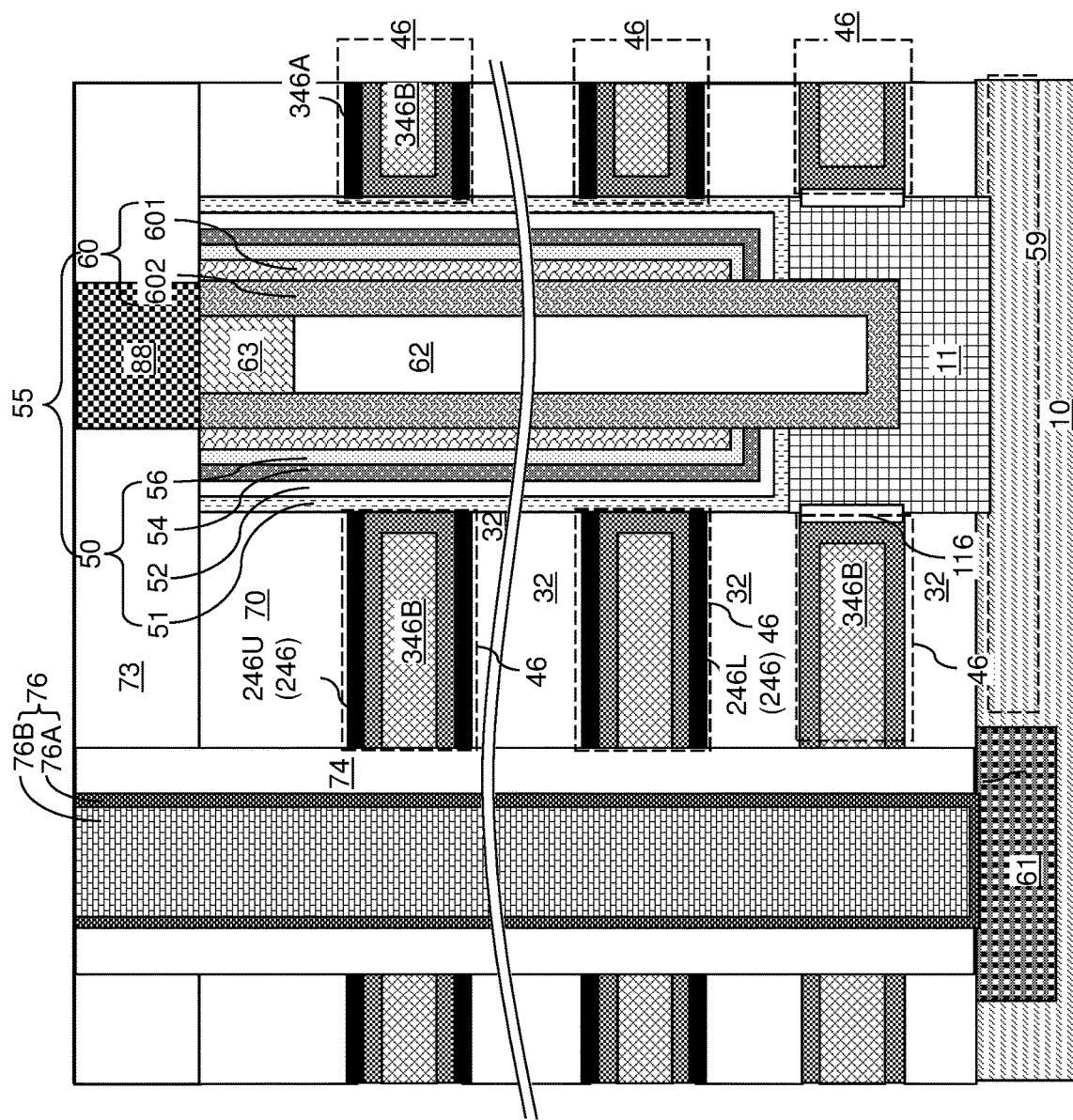
FIG. 22C is a vertical cross-sectional view of a region of the third exemplary structure of FIGS. 22A and 22B.

Referring to FIGS. 22A-22C, the processing steps of FIGS. 12 and 13A and 13B can be performed to form backside trench fill structures (74, 76) and various contact via structures (86, 88).

Figure 23:
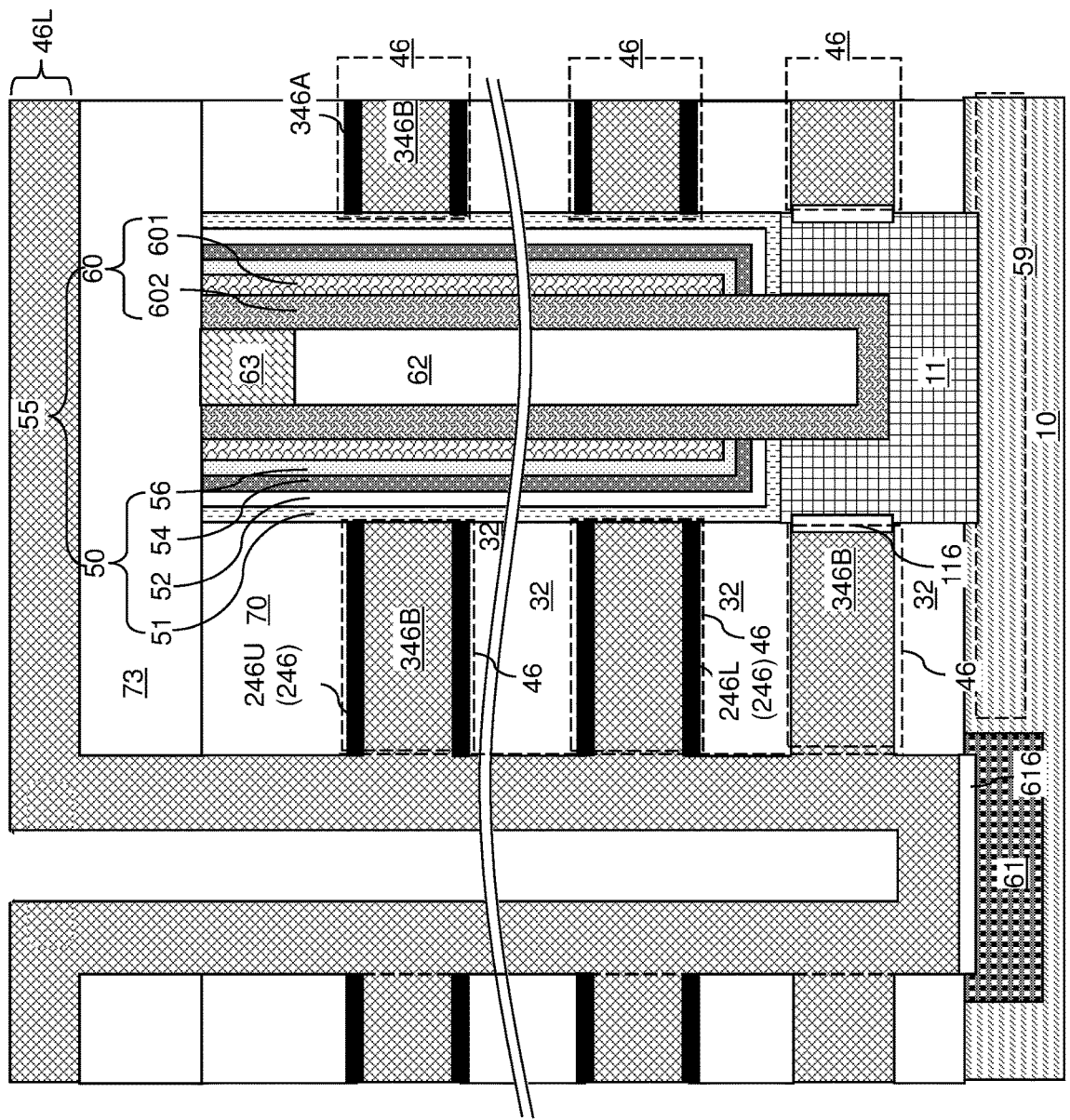
FIG. 23 is a vertical cross-sectional views of a region of an alternative embodiment of the third exemplary structure during formation of first conductive material portions according to the third embodiment of the present disclosure.

Referring to FIG. 23, an alternative embodiment of the third exemplary structure can be derived from the third exemplary structure of FIG. 21D by omitting formation of the conductive material layers 346 shown in FIG. 21C, and by employing a first conductive material having a first work function as the conductive fill material layer 346B, which is a conductive material layer. The conductive fill material layer 346B has a first conductive material composition, which has a lower work function than the second conductive material composition of the lower conductive liners 246L and the upper conductive liners 246U. In one embodiment, the first conductive material composition comprises TiN, TaN, or WN, and the second conductive material composition comprises a p-type doped semiconductor material. In other words, the p-type doped semiconductor material can be employed for the lower conductive liners 246L and the upper conductive liners 246U, and TiN, TaN, or WN can be employed for the conductive fill material layer 346B. The continuous electrically conductive material layer 46L can consist of portions of the conductive fill material layer 346B.

Figure 24:
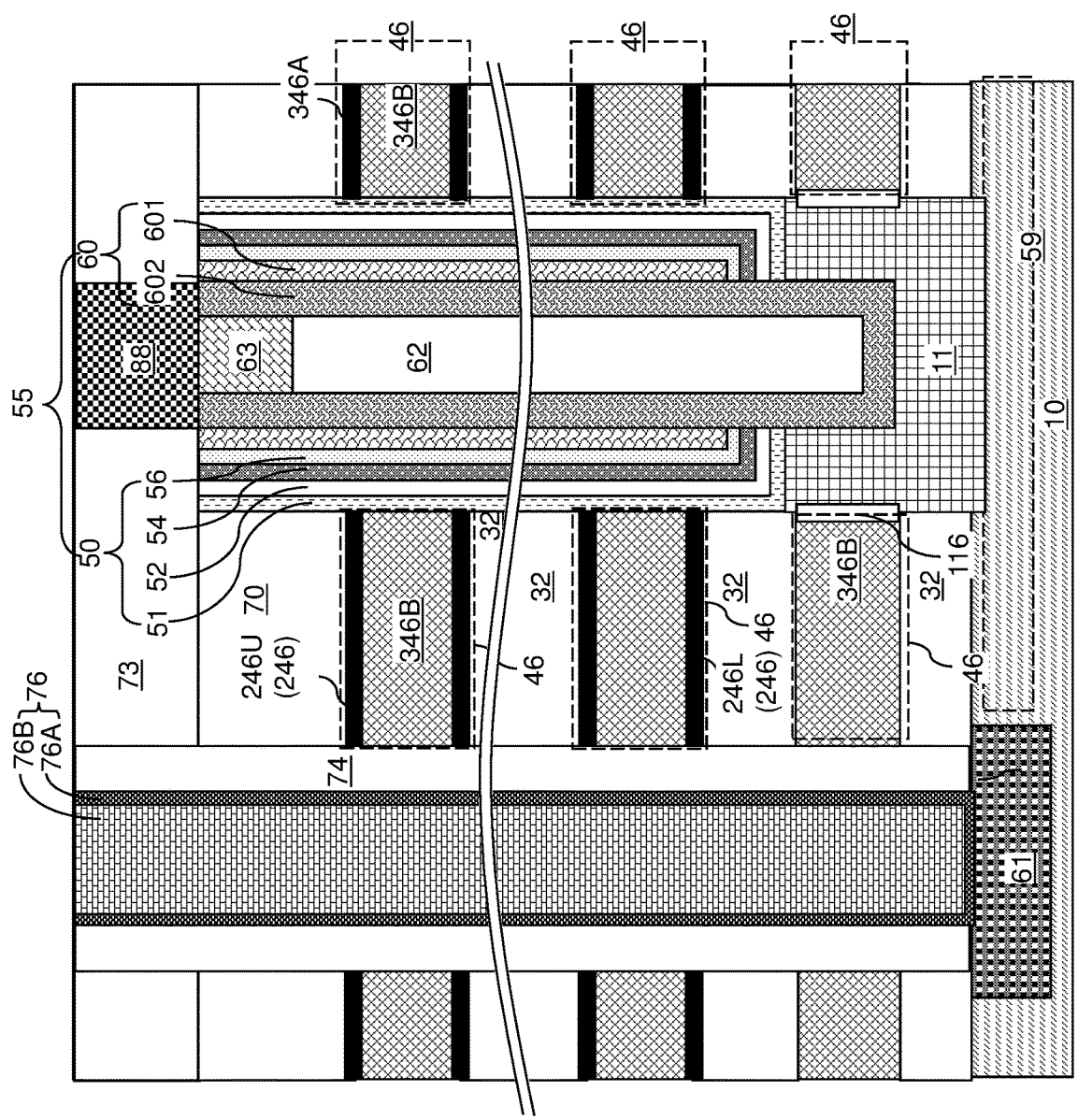
FIG. 24 is a vertical cross-sectional views of a region of the alternative embodiment of the third exemplary structure after formation of backside trench fill structures and contact via structures according to the third embodiment of the present disclosure.

Referring to FIG. 24, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Thus, the sacrificial material layers 42 are replaced with the electrically conductive layers 46. The electrically conductive layers 46 are formed between vertically neighboring pairs of the insulating layers 32. Each of the electrically conductive layers 46 can comprise, and/or can consist of, a respective one of the lower conductive liners 246L, a respective one of the upper conductive liners 246U, and a respective one of the conductive fill material layers 346B.

The third exemplary structure includes a three-dimensional memory device, which can comprise an alternating stack of insulating layers 32 and electrically conductive layers 46 located over a substrate (9, 10), memory openings 49 vertically extending through the alternating stack (32, 46), and memory stack structures 55 extending through the alternating stack (32, 46). Each of the memory stack structures 55 comprises a memory film 50 and a vertical semiconductor channel 60. At least one of the electrically conductive layers 46, comprises a layer stack including, from bottom to top, a lower conductive liner 246L, a conductive material layer (346A or 346B), and an upper conductive liner 246U. Each of the lower conductive liner 246L, the conductive material layer (346A or 346B), and the upper conductive liner 246U contacts the memory films 50. The conductive material layer has a lower work function than the lower and upper conductive liners.

In one embodiment, the conductive material layer (346A or 346B) has a first conductive material composition, and the lower conductive liner 246L and the upper conductive liner 246U have a second conductive material composition that is different from the first conductive material composition. In one embodiment, the first conductive material composition comprises TiN, TaN, or WN (e.g., TiN), and the second conductive material composition comprises a p-type doped semiconductor material (e.g. p-type doped polysilicon).

In one embodiment, wherein an additional blocking dielectric is not located in the backside recesses 43 between the insulating layers 32 and the electrically conductive layers 46.

In one embodiment, interfaces between the conductive material layer (346A or 346B) and the memory films 50 are vertically coincident with interfaces between the memory films 50 and the insulating layers 32. In one embodiment, the lower conductive liner 246L and the upper conductive liner 246U have a respective thickness that is in a range from 2% to 20% of a thickness of the conductive material layer (346A or 346B). In one embodiment, the lower conductive liner 246L has a thickness in a range from 0.5 nm to 5 nm, the conductive material layer (346A or 346B) has a thickness in a range from 15 nm to 40 nm, and the upper conductive liner 246U has a thickness in a range from 0.5 nm to 5 nm.

In one embodiment, the conductive material layer 346A comprises tubular portions that laterally surround a respective one of the memory films 50, an upper horizontally extending portion adjoined to an upper end of each of the tubular portions, and a lower horizontally extending portion adjoined to a lower end of each of the tubular portions. In one embodiment, the layer stack further comprises a conductive fill material layer 346B embedded in the conductive material layer 346A and laterally spaced from the memory films 50 by the tubular portion of the conductive material layer 346A.

In one embodiment, each of the memory films 50 comprises a stack including, from outside to inside, a blocking dielectric layer 52, a charge storage layer 54, and a tunneling dielectric layer 56 that contacts a respective one of the vertical semiconductor channels 60. In one embodiment, the charge storage layer 54 continuously extends vertically through multiple electrically conductive layers 46 within the alternating stack (32, 46).

In one embodiment, a backside trench fill structure (74, 76) contacts sidewalls of the alternating stack (32, 46). Each of the lower conductive liners 246L, the conductive material layers (346A or 346B), and the upper conductive liners 246U of the electrically conductive layers 46 contacts the backside trench fill structure (74, 76).

In one embodiment, the three-dimensional memory device comprises a staircase region 300 in which the electrically conductive layers 46 in the alternating stack (32, 46) have stepped surfaces. Word line contact via structures 86 can contact a respective one of the electrically conductive layers 46.

The difference in work function between the first conductive material portions (48, 346A, or 346B) and the second conductive material portions (46A, 47, 246L, 246U) provides modulation of work function around the edges of the electrically conductive layers 46 that laterally surround memory films 50 that include a respective charge storage layer 54. The center portion of each electrically conductive layer 46 that contacts a memory film 50 has a first work function, and the edge portions and sidewalls of each electrically conductive layer 46 have a second work function that is greater than the first work function. This reduces the undesirable neighboring word line interference effect and tunneling of electrical charges (such as electrons) into portions of the charge storage layers 54 located at levels of the insulating layers 32 (i.e., between the vertically separated memory cells). Thus, the charge carriers are more concentrated in the memory cells instead of between the memory cells, thus improving the programming characteristics of the memory cells.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   memory openings vertically extending through the alternating stack; and
   memory stack structures extending through the alternating stack,
   wherein:
   each of the memory stack structures comprises a memory film and a vertical semiconductor channel; and
   at least one of the electrically conductive layers comprises a layer stack including, from bottom to top, a lower conductive liner, a conductive material layer, and an upper conductive liner, wherein each of the lower conductive liner, the conductive material layer, and the upper conductive liner contacts the memory films, wherein the conductive material layer has a lower work function than the lower and upper conductive liners;
   wherein:
   the conductive material layer has a first conductive material composition, and the lower conductive liner and the upper conductive liner have a second conductive material composition that is different from the first conductive material composition;
   the first conductive material composition comprises TiN, TaN, or WN; and
   the second conductive material composition comprises a p-type doped semiconductor material.

2. The three-dimensional memory device of claim 1, wherein a blocking dielectric is not located between the insulating layers and the electrically conductive layers.

3. The three-dimensional memory device of claim 1, wherein the first conductive material composition comprises the TiN.

4. The three-dimensional memory device of claim 1, wherein interfaces between the conductive material layer and the memory films are vertically coincident with interfaces between the memory films and the insulating layers.

5. The three-dimensional memory device of claim 1, wherein:
   the lower conductive liner and the upper conductive liner have a respective thickness that is in a range from 2% to 20% of a thickness of the conductive material layer;
   the lower conductive liner has a thickness in a range from 0.5 nm to 5 nm;
   the conductive material layer has a thickness in a range from 15 nm to 40 nm; and
   the upper conductive liner has a thickness in a range from 0.5 nm to 5 nm.

6. The three-dimensional memory device of claim 1, wherein the conductive material layer comprises:
   tubular portions that laterally surround a respective one of the memory films;
   an upper horizontally extending portion adjoined to an upper end of each of the tubular portions; and
   a lower horizontally extending portion adjoined to a lower end of each of the tubular portions.

7. The three-dimensional memory device of claim 6, wherein the layer stack further comprises a conductive fill material layer embedded in the conductive material layer and laterally spaced from the memory films by the tubular portion of the conductive material layer.

8. The three-dimensional memory device of claim 1, wherein each of the memory films comprises a stack including, from outside to inside, a blocking dielectric layer, a charge storage layer, and a tunneling dielectric layer that contacts a respective one of the vertical semiconductor channels.

9. The three-dimensional memory device of claim 8, wherein the charge storage layer continuously extends vertically through multiple electrically conductive layers within the alternating stack.

10. The three-dimensional memory device of claim 1, further comprising a backside trench fill structure contacting sidewalls of the alternating stack, wherein each of the lower conductive liners, the conductive material layers, and the upper conductive liners of the electrically conductive layers contacts the backside trench fill structure.

11. The three-dimensional memory device of claim 1, further comprising:
   a staircase region in which the electrically conductive layers in the alternating stack have stepped surfaces; and
   word line contact via structures that contact a respective one of the electrically conductive layers.

12. A method of forming a three-dimensional memory device, comprising:
   forming a vertical repetition of a unit layer stack including an insulating layer, a lower conductive liner, a sacrificial material layer, and an upper conductive liner over a substrate;

forming memory openings through the vertical repetition;

forming memory opening fill structures in the memory openings, wherein each of the memory opening fill structures comprises a memory film and a vertical semiconductor channel;

forming backside recesses by removing the sacrificial material layers selective to the insulating layers, the lower conductive liners, and the upper conductive liners; and forming electrically conductive layers within the backside recesses, wherein each of the electrically conductive layers comprises a respective one of the lower conductive liners, a respective one of the upper conductive liners, and a respective conductive material layer located between the respective one of the lower conductive liners and the respective one of the upper conductive liners, wherein the conductive material layer has a lower work function than the lower and upper conductive liners.

13. The method of claim 12, wherein the conductive material layers have a first conductive material composition, and the lower conductive liners and the upper conductive liners have a second conductive material composition that is different from the first conductive material composition.

14. The method of claim 13, wherein a blocking dielectric is not located in the backside recesses.

15. The method of claim 13, wherein:
the first conductive material composition comprises TiN, TaN, or WN; and
the second conductive material composition comprises a p-type doped polysilicon.

16. The method of claim 12, wherein each of the memory films is formed by sequentially depositing a blocking dielectric layer, a charge storage layer, and a tunneling dielectric layer, and by removing portions of the blocking dielectric layer, the charge storage layer, and the tunneling dielectric layer from outside the memory openings.

17. The method of claim 12, further comprising forming a backside trench through the vertical repetition of the unit layer stack, wherein the backside recesses are formed by introducing an isotropic etchant that etches the sacrificial material layers selective to the insulating layers, the lower conductive liners, and the upper conductive liners into the backside trench.

18. The method of claim 12, further comprising:
forming stepped surfaces by patterning the vertical repetition of the unit layer stack in a staircase region; and
forming contact via structures on a respective one of the electrically conductive layers in the staircase region.

19. A three-dimensional memory device comprising:
an alternating stack of insulating layers and electrically conductive layers located over a substrate;
memory openings vertically extending through the alternating stack; and
memory stack structures extending through the alternating stack,
wherein:
each of the memory stack structures comprises a memory film and a vertical semiconductor channel; and
at least one of the electrically conductive layers comprises a layer stack including, from bottom to top, a lower conductive liner, a conductive material layer, and an upper conductive liner, wherein each of the lower conductive liner, the conductive material layer, and the upper conductive liner contacts the memory films, wherein the conductive material layer has a lower work function than the lower and upper conductive liners;
wherein:
the lower conductive liner and the upper conductive liner have a respective thickness that is in a range from 2% to 20% of a thickness of the conductive material layer;
the lower conductive liner has a thickness in a range from 0.5 nm to 5 nm;
the conductive material layer has a thickness in a range from 15 nm to 40 nm;
the upper conductive liner has a thickness in a range from 0.5 nm to 5 nm;
the conductive material layer comprises:
tubular portions that laterally surround a respective one of the memory films;
an upper horizontally extending portion adjoined to an upper end of each of the tubular portions; and
a lower horizontally extending portion adjoined to a lower end of each of the tubular portions; and
the layer stack further comprises a conductive fill material layer embedded in the conductive material layer and laterally spaced from the memory films by the tubular portion of the conductive material layer.

\* \* \* \* \*